United States Patent [19]

Smayling et al.

[11] Patent Number: 5,275,961
[45] Date of Patent: Jan. 4, 1994

[54] METHOD OF FORMING INSULATED GATE FIELD-EFFECT TRANSISTORS

[75] Inventors: Michael C. Smayling, Missouri City; Jack Reynolds, Dallas, both of Tex.

[73] Assignee: Texas Instruments Incorporated, Dallas, Tex.

[21] Appl. No.: 915,036

[22] Filed: Jul. 16, 1992

Related U.S. Application Data

[63] Continuation of Ser. No. 618,351, Nov. 23, 1990, abandoned.

[51] Int. Cl.⁵ ............................................. H01L 21/00
[52] U.S. Cl. ........................................ 437/41; 437/44; 437/45; 437/46; 437/52; 148/DIG. 82
[58] Field of Search .................... 437/41, 43, 44, 45, 437/46, 913, 52, 56, 57; 148/DIG.

[56] References Cited

U.S. PATENT DOCUMENTS

| | | | |
|---|---|---|---|
| 4,232,327 | 11/1980 | Hsu | 437/21 |
| 4,280,854 | 7/1981 | Shibata et al. | 437/46 |
| 4,306,915 | 12/1981 | Shiba | 437/43 |
| 4,333,224 | 6/1982 | Buchanan | 437/46 |
| 4,569,117 | 2/1986 | Baglee et al. | 29/571 |
| 4,663,827 | 5/1987 | Nakahara | 437/41 |
| 4,669,177 | 6/1987 | D'Arrigo et al. | 29/571 |
| 4,695,979 | 9/1987 | Tuvell et al. | 365/185 |
| 4,715,014 | 12/1987 | Tuvell et al. | 365/185 |
| 4,718,041 | 1/1988 | Baglee et al. | 365/185 |
| 4,736,342 | 5/1988 | Imondi et al. | 365/185 |
| 4,742,492 | 5/1988 | Smayling et al. | 365/218 |
| 4,745,079 | 5/1988 | Pfiester | 437/46 |
| 4,797,372 | 1/1989 | Verret et al. | 437/34 |
| 4,804,637 | 2/1989 | Smayling et al. | 437/52 |
| 4,912,676 | 3/1990 | Pattersen | 365/185 |
| 4,953,802 | 6/1990 | Noguchi et al. | 357/54 |
| 4,990,982 | 2/1991 | Omoto et al. | 357/23.8 |

FOREIGN PATENT DOCUMENTS

| | | |
|---|---|---|
| 1186072 | 2/1983 | Canada . |
| 0069429 | 12/1983 | European Pat. Off. . |
| 0111347 | 6/1984 | European Pat. Off. . |
| 60-247973 | 12/1985 | Japan . |
| 01-053574 | 3/1989 | Japan . |
| 2-102578 | 7/1990 | Japan . |

OTHER PUBLICATIONS

Dumitru Cioaca et al., "A Million-Cycle CMOS 256K EEPROM", IEEE, 1987, pp. 684-691.

K. Y. Chang et al, "An Advanced High Voltage CMOS Process for Custom Logic Circuits with Embedded EEPROM", IEEE, 1988 Custom Integrated Circuits Conference, 25.5.1-25.5.5.

Primary Examiner—Brian E. Hearn
Assistant Examiner—Tuan Nguyen
Attorney, Agent, or Firm—Theodore D. Lindgren; Leo N. Heiting; Richard L. Donaldson

[57] ABSTRACT

An insulated-gate field-effect transistor (426, 452) has reduced gate oxide stress. According to one embodiment, the control gate (458) has a doped region (460) adjacent the source end of the transistor (452), and an undoped dielectric portion (462) adjacent the gate end. According to another embodiment, the drain end of the conductive gate (434) is disposed on top of a thick insulator region (432) that also acts to mitigate the high electric fields present when the transistor is subjected to a high voltage transient.

2 Claims, 46 Drawing Sheets

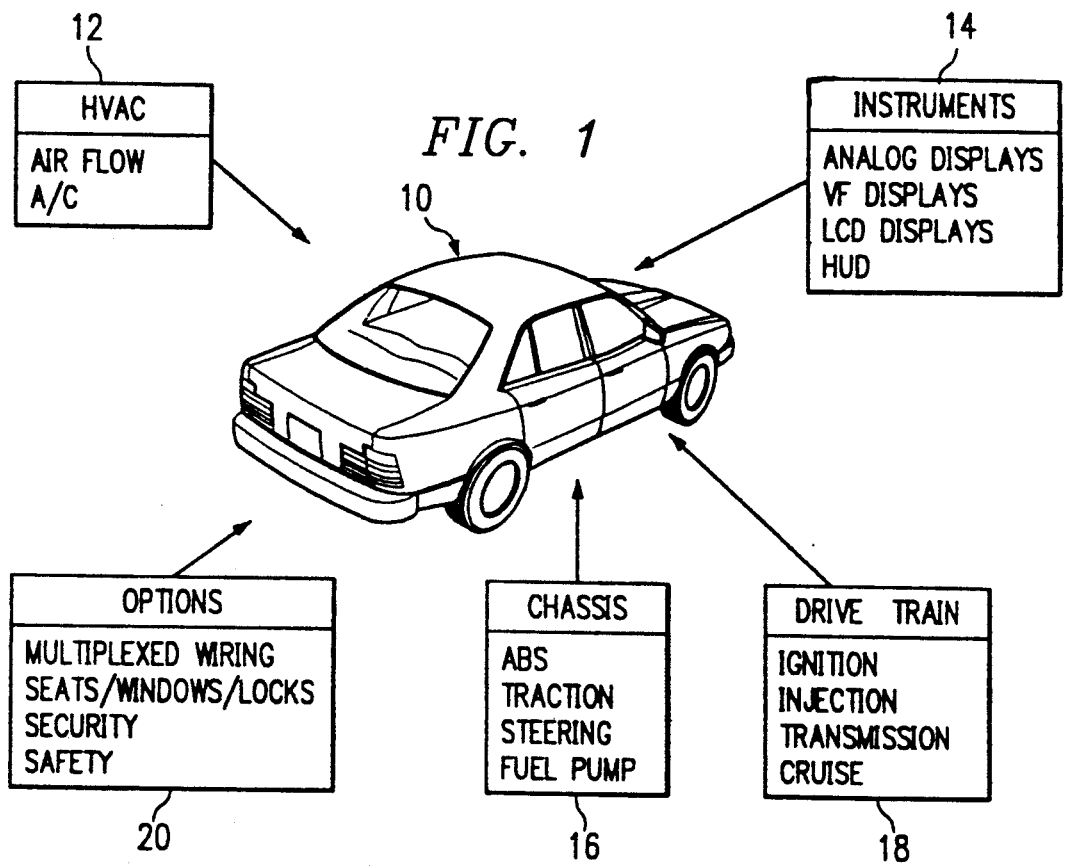
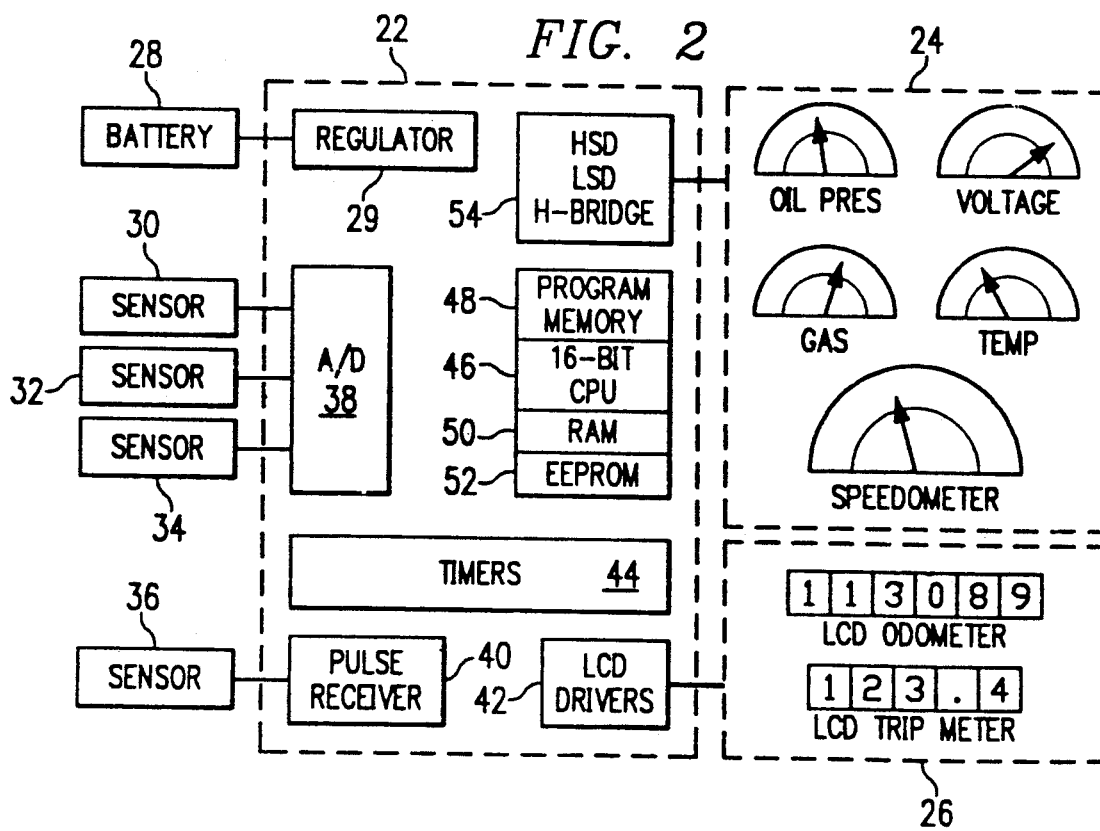

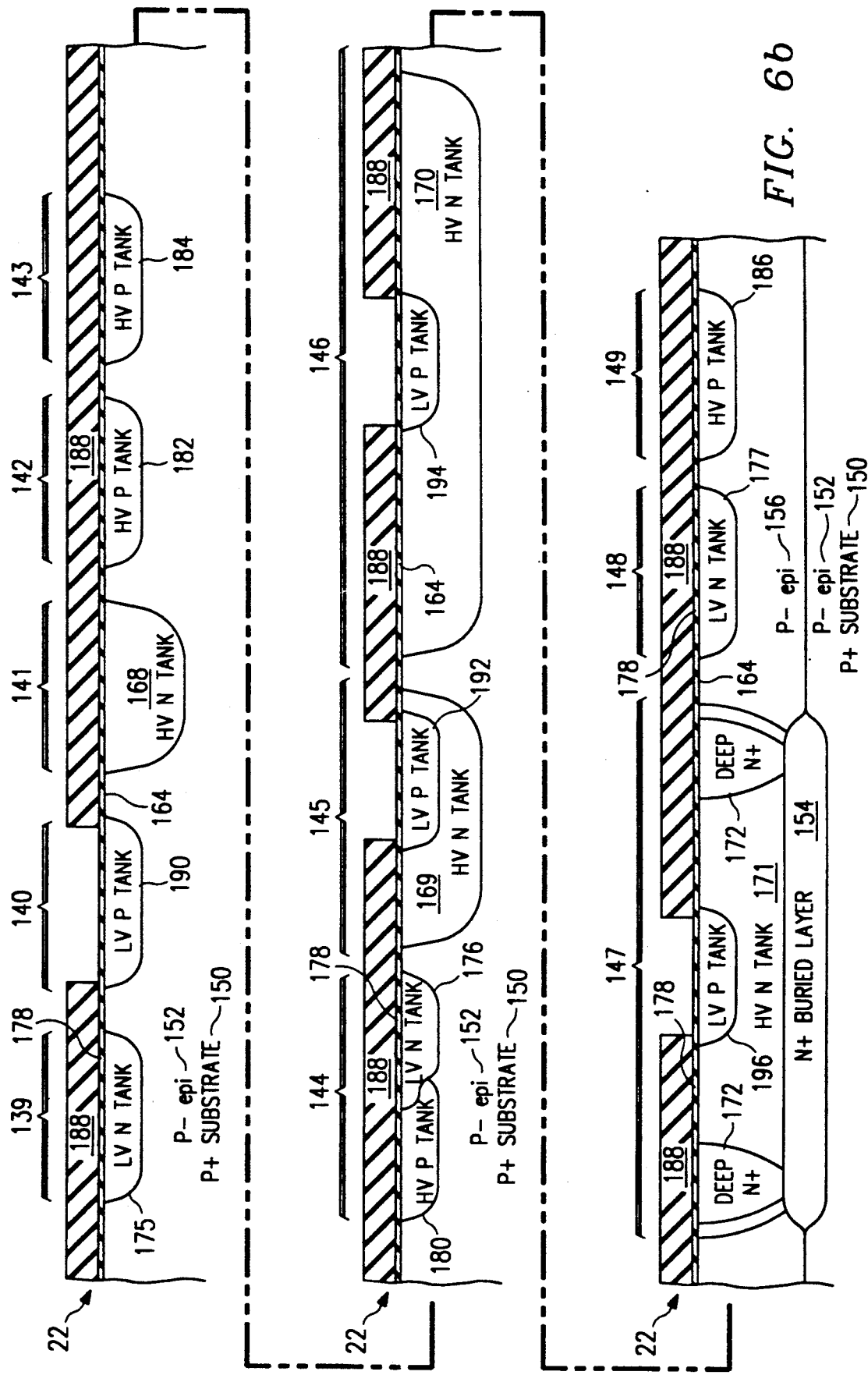

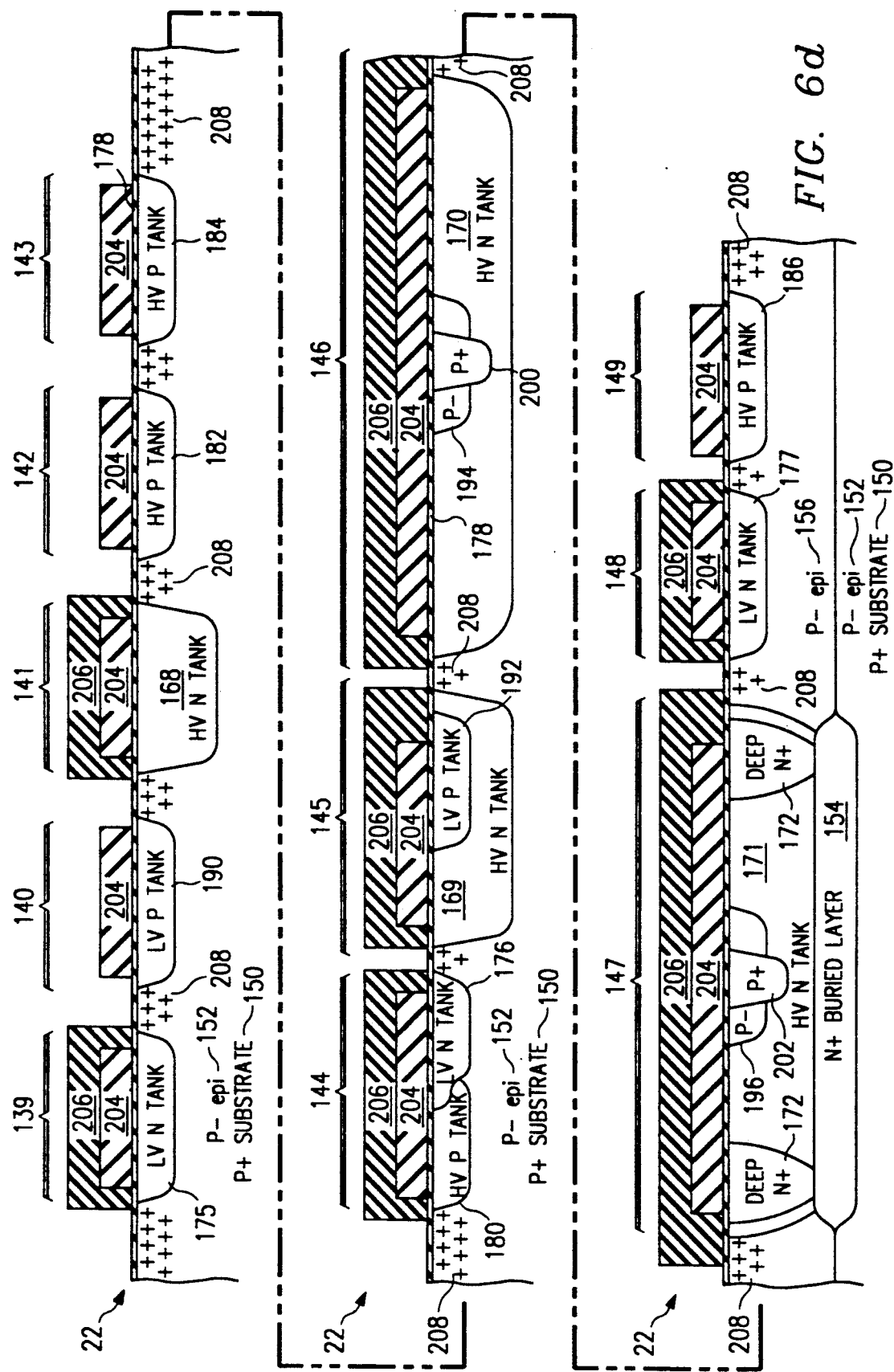

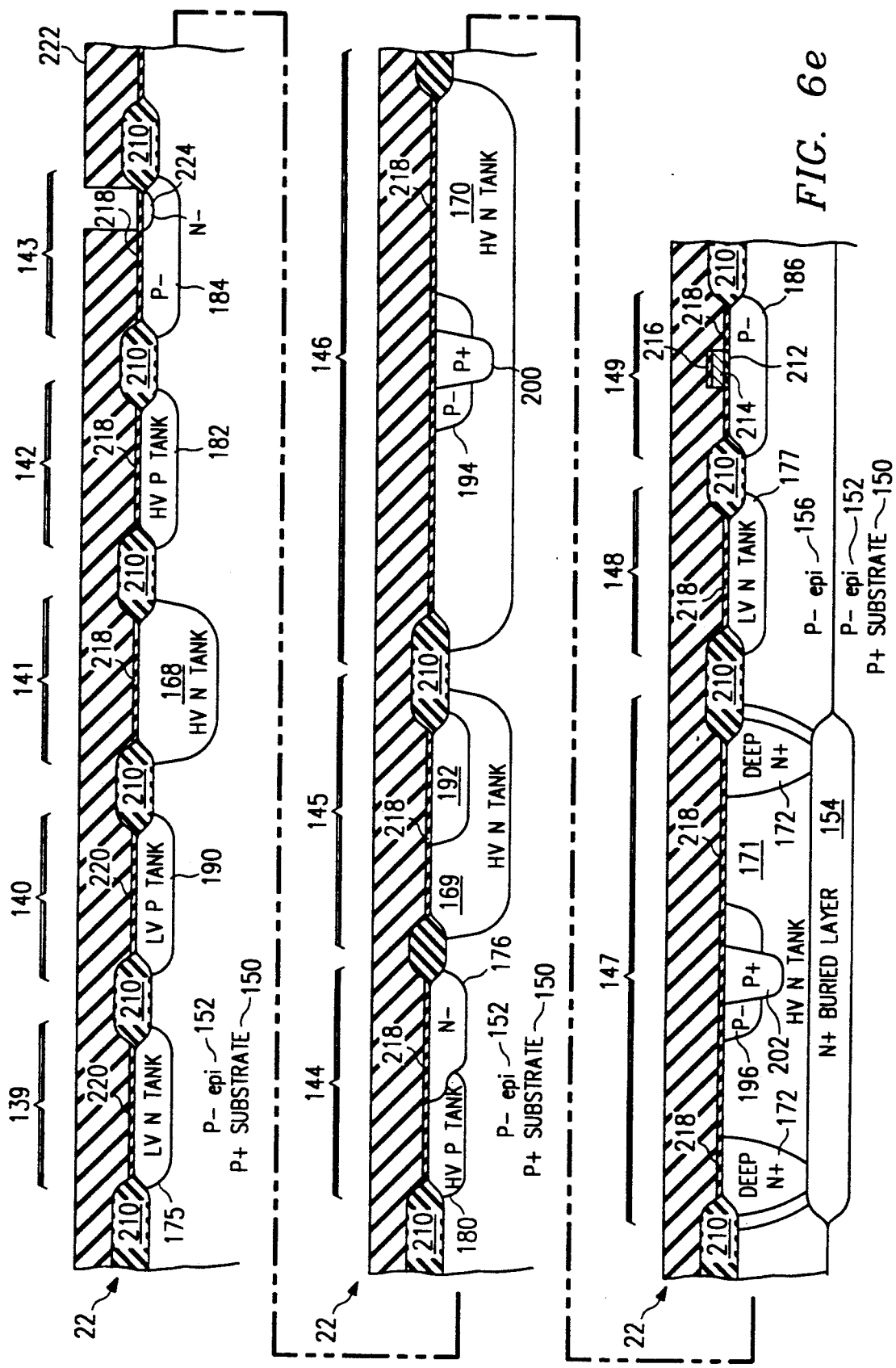

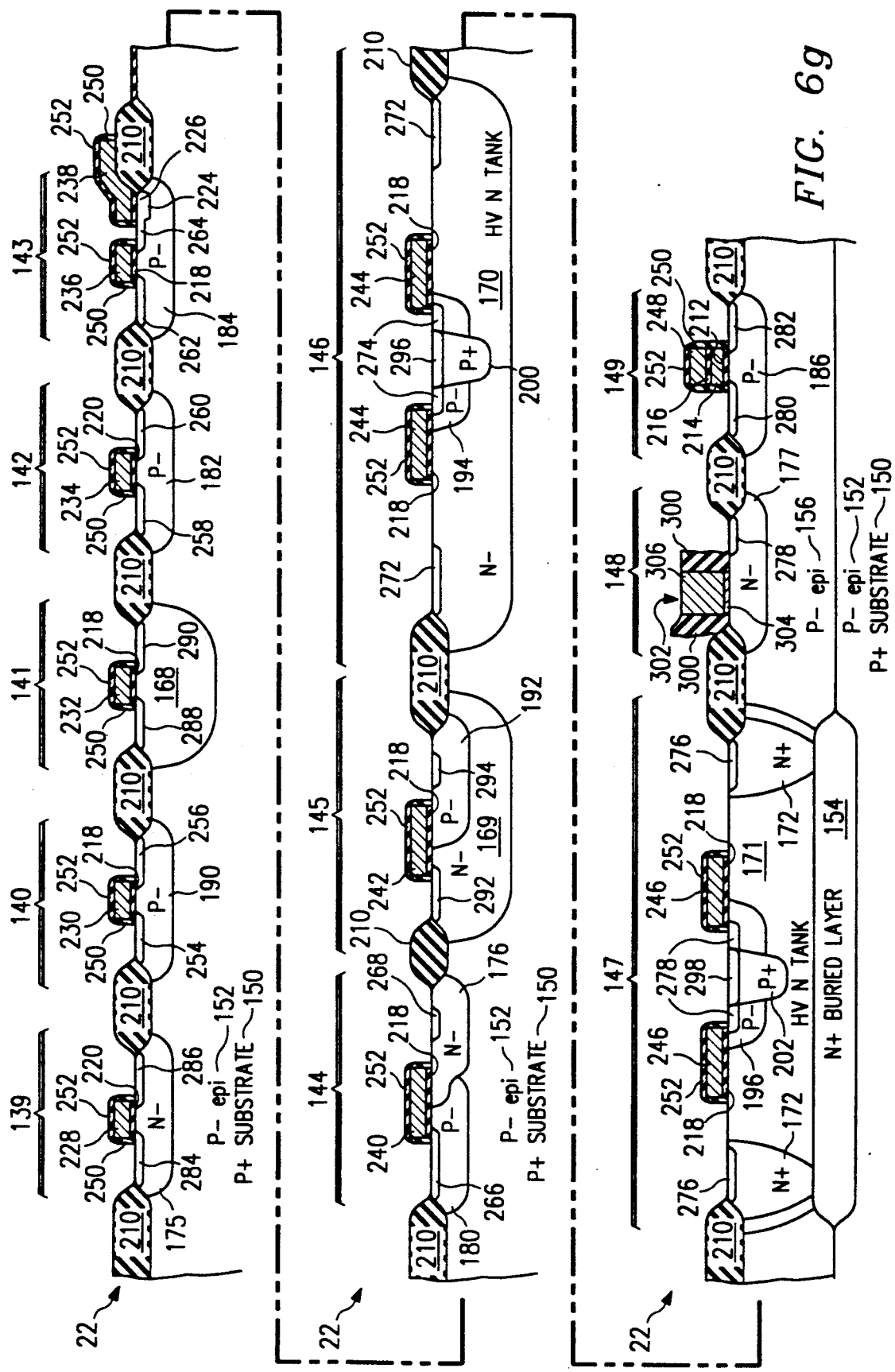

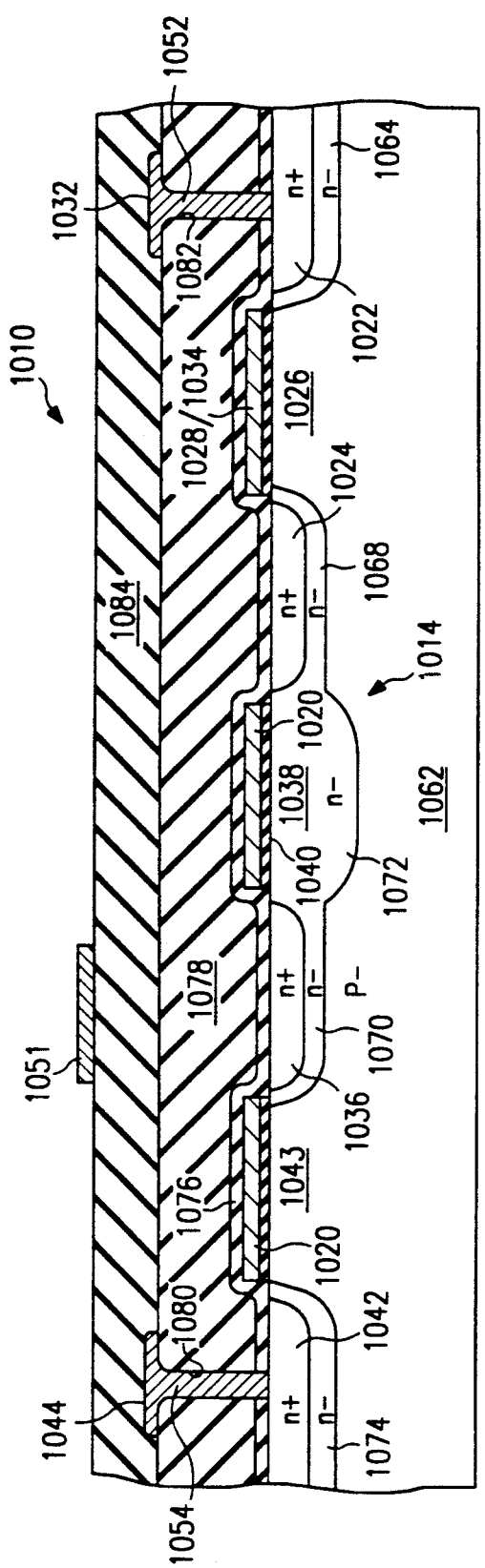
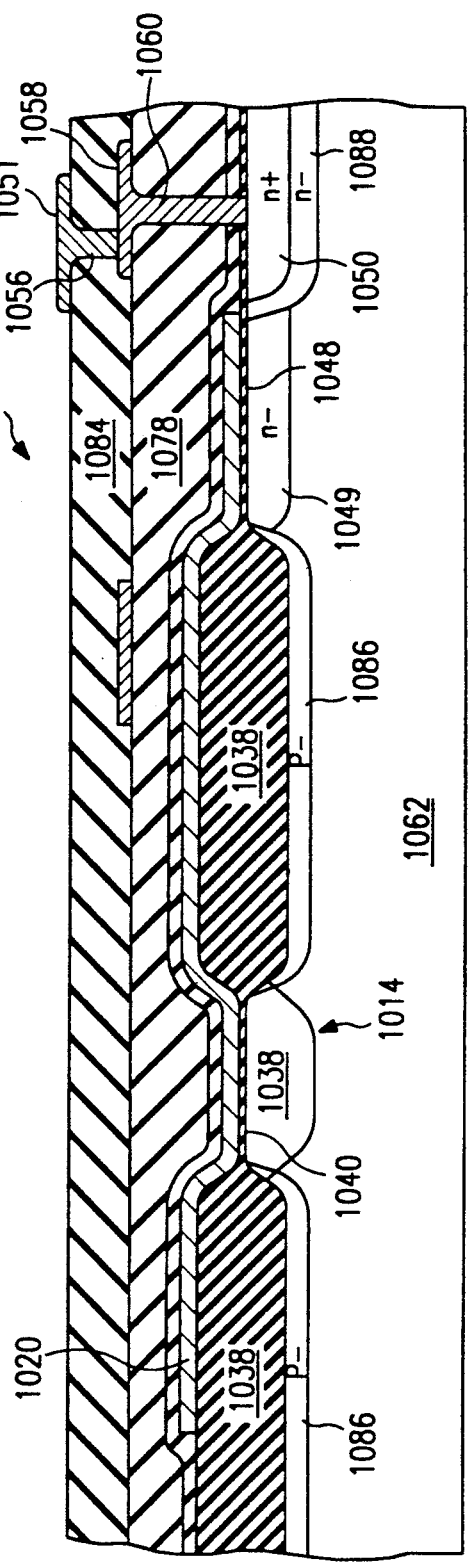
FIG. 27b
FIG. 27c

METHOD OF FORMING INSULATED GATE FIELD-EFFECT TRANSISTORS This application is a continuation of application Ser. No. 07/618,351, filed Nov. 23, 1990, which is now abandoned.

CROSS-REFERENCE TO RELATED APPLICATIONS

The following coassigned patent applications are hereby incorporated by reference:

| Serial No. | Filing Date |
| --- | --- |
| 07/618,353 | 11/21/90, abandoned; |
| 07/617,850 | 11/21/90, now abandoned; |
| 07/618,279 | 11/21/90, now abandoned; |
| 07/618,273 | 11/21/90 (pending) |

TECHNICAL FIELD OF THE INVENTION

This invention generally relates to integrated circuits, and more particularly to insulated-gate field-effect transistors, systems and methods.

BACKGROUND OF THE INVENTION

Without limiting the scope of the invention, its background is described in conjunction with stressful electrical or electronic environments such as automobile electrical systems, as an example.

Heretofore, in this field, difficulties have been encountered in designing field effect transistors that were able to withstand the high current densities and high transient voltages (often as high as 60 volts) to which these transistors were sometimes subjected as coupled to automotive power systems or the like. These voltages are often high enough to cause gate oxide breakdown between the conductive gate and the epitaxial layer on the drain side of the field effect transistor.

Accordingly, improvements which overcome the problem of gate oxide breakdown due to high electric fields, is presently desirable.

SUMMARY OF THE INVENTION

According to one aspect of the invention, an insulated-gate field-effect transistor with reduced gate insulator stress is formed at a face of a semiconductor layer of a first conductivity type. A thin gate insulator is formed on the face. A control gate is formed on the thin gate insulator. A first portion of the control gate is formed of a substantially dielectric material, and a second portion of the control gate adjacent the first is formed of a substantially conductive material. The first and second portions of the conductive gate are adjacent first and second lateral margins, respectively.

A source region formed in the semiconductor layer to be of a second conductivity type opposite the first conductivity type is adjacent the second lateral margin of the control gate. A drain region of this conductivity type is formed in the semiconductor layer to be substantially adjacent the first lateral margin of the control gate. A channel region of the first conductivity type is disposed between the source region and the drain region.

A technical advantage of the structure inheres in the second portion of the conductive gate being dielectric. Since the dielectric portion acts as an insulator, it can change potential as the gate-drain potential changes. Since the dielectric portion of the gate is only capacitively coupled to the drain, and as it makes a high resistance contact to the gate, its voltage can be lower than the oxide breakdown voltage when the transistor is subjected to a high voltage transient.

According to another aspect of the invention, a relatively thick insulator region is formed on the face of the semiconductor layer, the thick insulator region having first and second opposed lateral margins and a top face opposed to the semiconductor layer. A relatively thin gate insulator layer is formed on a portion of the face adjacent the first lateral margin of the thick insulator region. A conductive control gate is formed across the first lateral margin of the thick insulator, with a portion of the control gate disposed on the top face of the thick insulator and a further portion of the control gate disposed on the thin gate insulator layer. A source region is formed to be of a second conductivity type opposite the first conductivity type and to be adjacent the portion of the control gate that is disposed on the thin gate insulator. A drain region is formed on the face to be of the second conductivity type, and to be disposed adjacent the second lateral margin of the thick insulator region. According to this second aspect of the invention, the high electric fields experienced by conventional insulated-gate field-effect transistors near the drain region thereof are avoided by substantially thickening the gate oxide layer into a thick insulator layer. A technical advantage of the structure is conferred by its resistance to high voltage transients such as are encountered in automotive electrical systems.

BRIEF DESCRIPTION OF THE DRAWINGS

For a more complete understanding of the present invention, and the advantages thereof, reference is now made to the following description taken in conjunction with the accompanying drawings, in which:

FIG. 2 is a simplified electrical circuit diagram showing the connection of a microcontroller to various gauges and other peripheral driven components;

FIGS. 6a–6g are highly magnified schematic sectional views of different portions of a microcontroller chip showing successive stages in the simultaneous fabrication of several different semiconductor devices, the devices being shown in close association with each other only for the purpose of illustrating the effects of the integrated process on the devices;

FIG. 6g-1 is a more detailed schematic sectional view of a vertical DMOS transistor shown in FIG. 6a–h;

FIG. 6h-1 is a plan view of the vertical DMOS transistor shown in FIG. 6g-1;

FIG. 6g-1 being taken substantially along line g-1-g-1 of FIG. 6h-1;

FIG. 27b is an elevational sectional view taken substantially along line b—b of FIG. 27a;

FIG. 27c is an elevational sectional view taken substantially along line c—c of FIG. 27a;

DETAILED DESCRIPTION OF THE INVENTION

Preferred embodiments of the processes, devices and systems described herein and their advantages are best understood by referring to FIGS. 1 through 29 of the drawings, like numerals being used for like and corresponding parts within the various drawings.

Figure 6A:
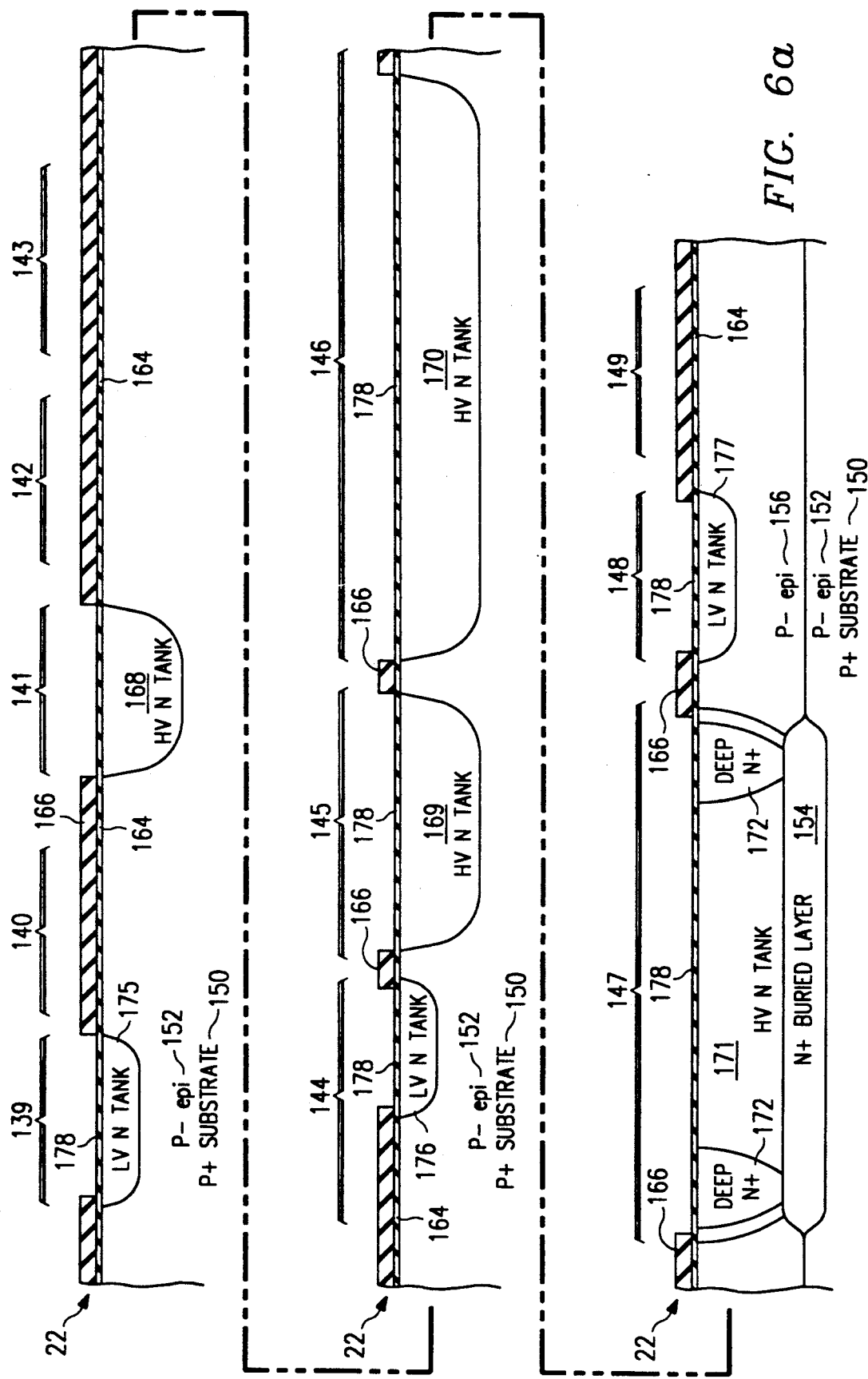
Figure 6C:
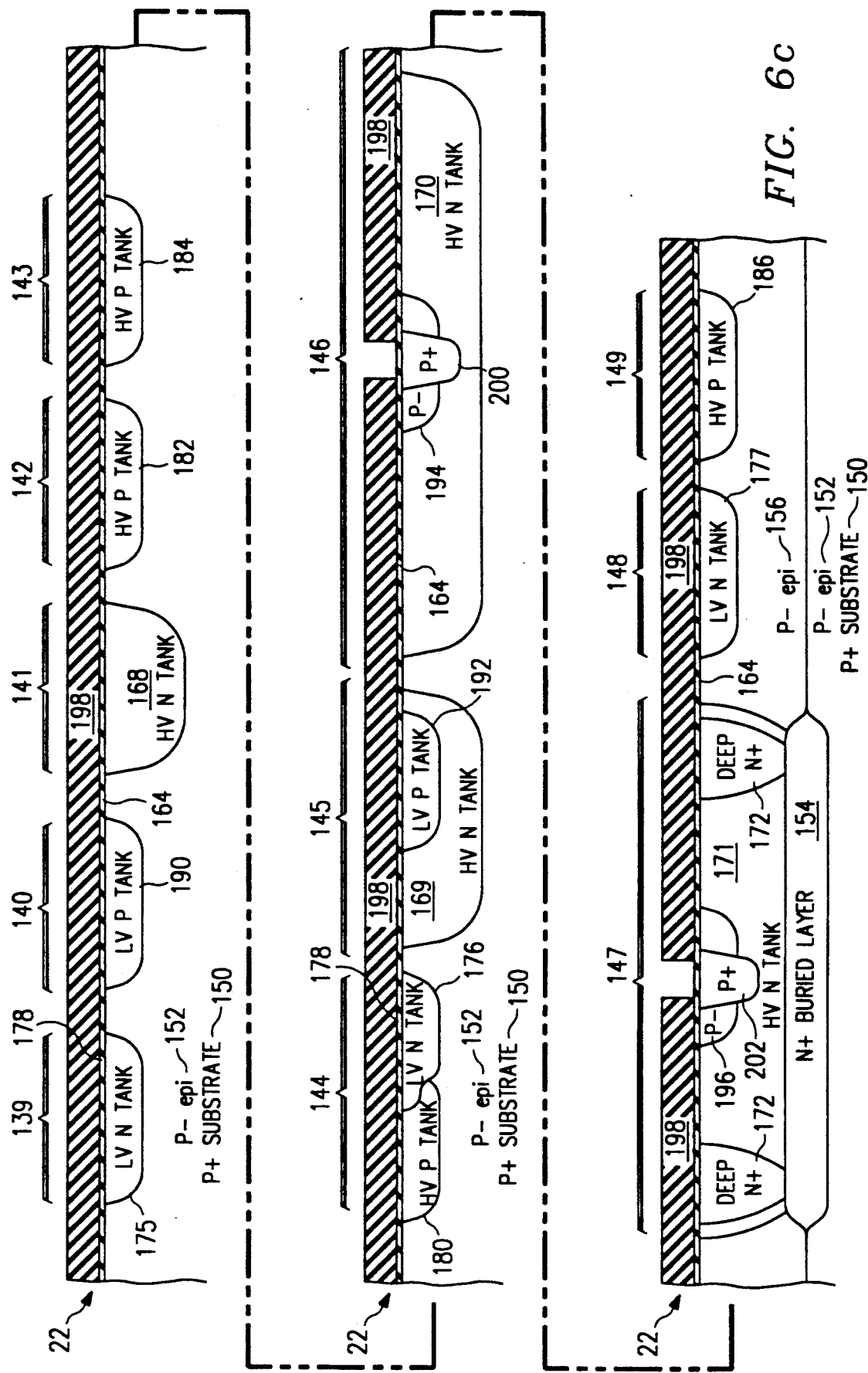
Figure 6F:
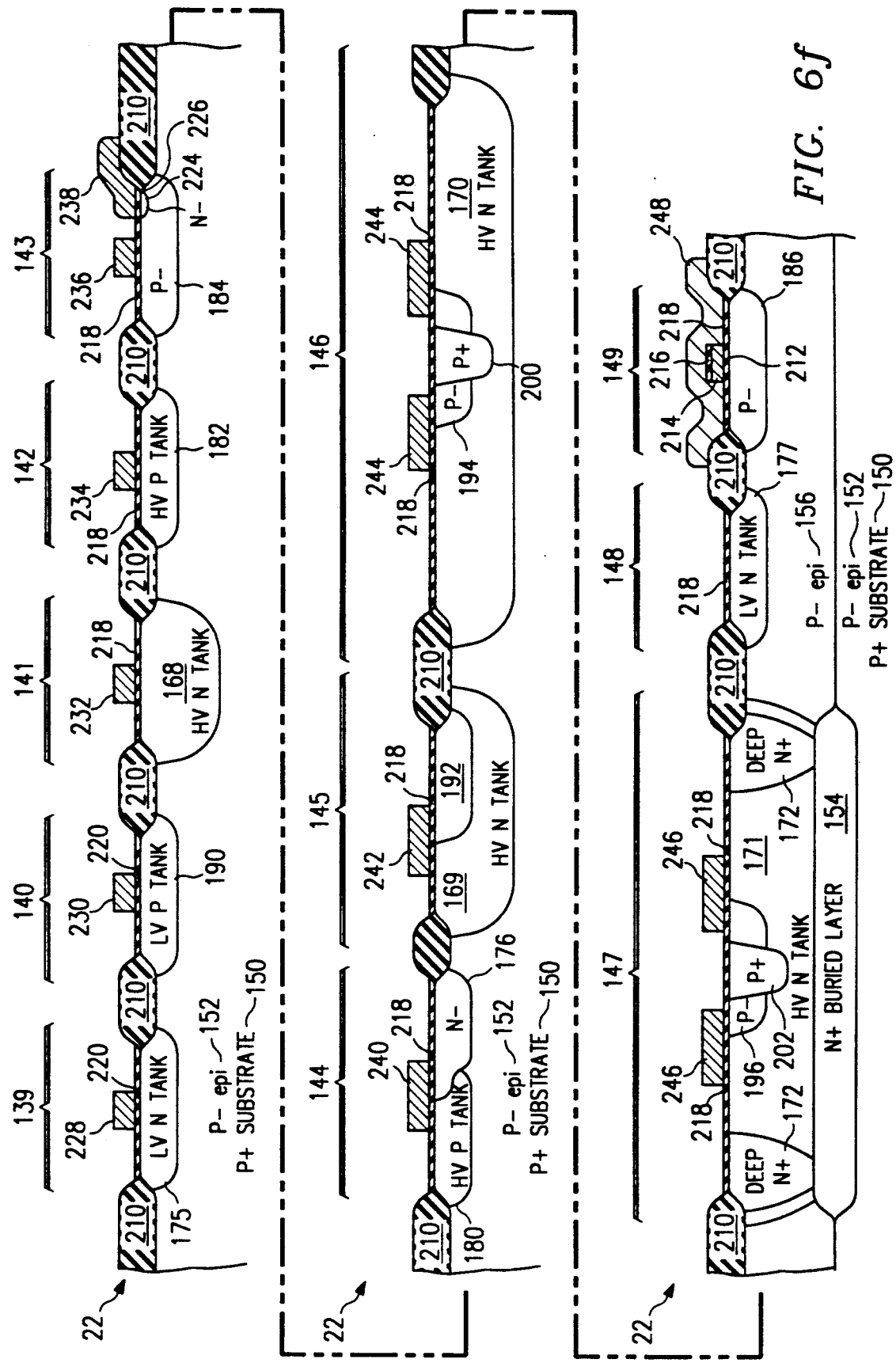
Figures 1, 6G:
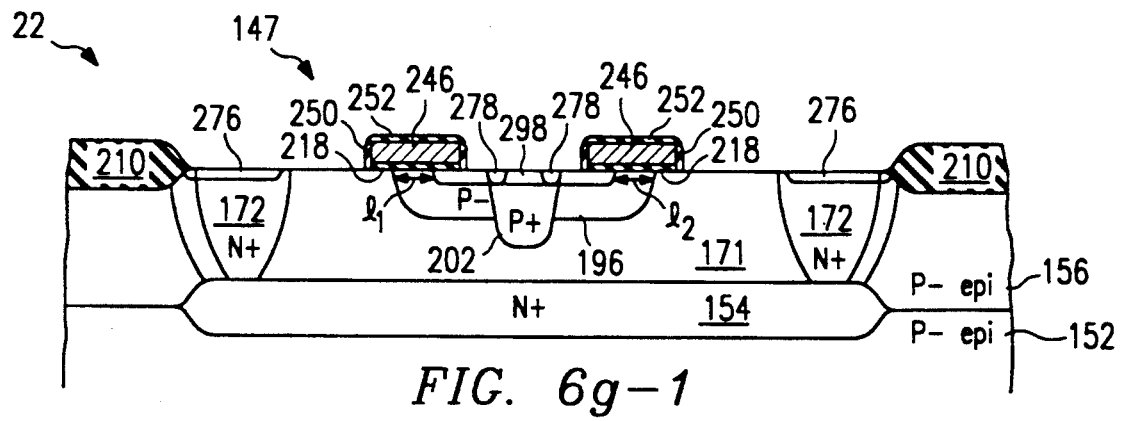

Referring first to FIG. 1, a perspective view of an automobile 10 is shown, in which one or more microcontrollers fabricated according to the integrated process described herein may be employed. Microcontrollers can be used, for example, in the heating, ventilating and air conditioning (HVAC) system 12 to control relative amounts of air flow and whether the air conditioning system should be engaged. Microcontrollers may also be used in the instrumentation 14 of the automobile, where they can function to drive analog gauges, VF displays, liquid crystal displays and heads-up displays. Microcontrollers can be used in the chassis 16 to control, for example, an antilock breaking system, limited slip differential traction, differential power steering and a fuel pump. In the drive train 18, microcontrollers can be used to control the ignition, fuel injection, gearing and shift pattern of the transmission, as well as a cruise computer. Microcontrollers also may be used to control the operation of any of several popular automobile options 20, including power seats, windows and locks, security systems, safety features such as air bags and seat belt sensors and multiplexed wiring for serving any and all of these.

Referring next to FIG. 2, a schematic representation of a microcontroller chip 22 is shown as employed as an instrumentation driver for driving a set 24 of analog gauges and liquid crystal mileage displays 26.

A 12-volt automobile battery 28 is connected to a voltage regulator and power supply 29 located on chip 22. The location of the regulator on-chip mandates that certain kinds of high-voltage power transistors be on this chip that are capable of withstanding transients that may be as high as 60 volts in automobile electrical systems. These power transistors therefore have different processing requirements than lower voltage logic transistors. Conventionally, the different process requirements of these power transistors have necessitated their location in a separate integrated circuit. The integrated process described herein, however, allows the power transistors, which for example are included in voltage regulator 29 and the other high-voltage or high power components on the chip 22, to be fabricated in a single process together with the rest of the devices on the chip 22. Regulator 29 supplies a variety of voltages to the rest of chip 22, including eighteen volts, five volts and zero volts.

Various sensors 30, 32, 34 and 36 provide data to chip 22 to update the various displays. Sensors 30–34 are connected to an analog/digital converter block 38. Sensors 30–34 can, for example, send analog signals related to the oil pressure, gasoline level, temperature of the engine and alternator voltage. While only three such sensors 30–34 are shown, several other sensors could be connected to chip 22 to sense various functions of the engine, such as engine speed and the like.

Sensor 36 counts wheel revolutions and pulses the number of these revolutions to a pulse receiver 40 located on chip 22. The chip 22 also incorporates LCD driver circuitry 42 for driving the odometer and trip meter liquid crystal displays 26. Various timers 44 are included on chip 22, including a "watch dog" timer for automatically resetting the currently running program to a beginning state responsive to either internally or externally induced software errors. Timer block 44 also includes clock generators (see FIGS. 3 and 3a) to supply synchronous signals to the rest of chip 22.

The microcontroller chip 22 also includes a preferably 16-bit CPU 46 for the performance of program instructions, a program memory 48 for the storage of such instructions, a random access memory 50 and an electrically erasable and programmable read-only memory 52. The CPU 46 includes a controller. The results of the instructions carried out by the CPU 46 may be stored in RAM 50. The EEPROM block 52 may be used, for example, for program memory for the program run on CPU 46, data storage, or constants concerning operation of the chip 22 or of the automobile 10 which are supplied by the user.

Another major block of the microcontroller chip 22 is the gauge driver block 54 that is used to drive the analog instrumentation block 24. The gauge driver block 54 includes a plurality of analog linear power modules requiring output power transistors. Gauge driver block 54 also includes HSD, LSD and H-bridge circuits.

Figure 3:
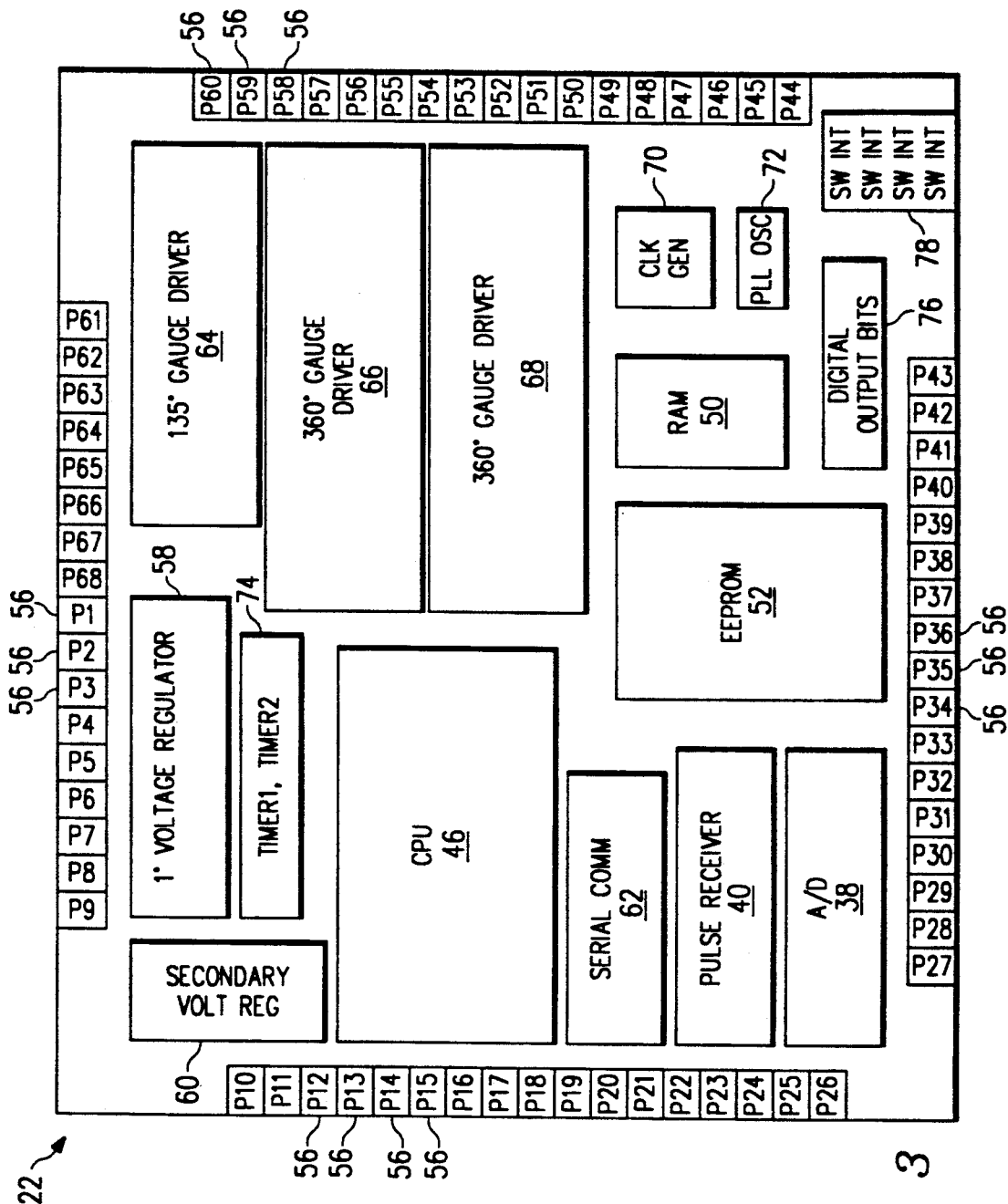
FIG. 3 is a physical chip layout of a microcontroller fabricated according to the process described herein.

FIG. 2 is a high level functional block diagram of the microcontroller chip 22. An actual physical layout of microcontroller chip 22 is illustrated in FIG. 3. FIG. 3 is an exemplary plan layout only. The microcontroller 22 has 60 pins 56 for external connection. The chip 22 is adapted to receive a standard automobile 12-volt power supply on two of the pins 56. The 12-volt power supply is connected to a primary voltage regulator 58 and a secondary voltage regulator 60. Primary and secondary voltage regulators 58 and 60 are represented by regulator block 29 in FIG. 2. Voltage regulators 58 and 60 generate all voltages required on chip 22, such as $V_{pp}$, $V_{dd}$ and $V_{ss}$. The CPU 46 shown in FIG. 3 also includes the program memory 48 as shown in FIG. 2. CPU 46 is interconnected by appropriate buses and communication lines (see FIG. 3a) to the remainder of the microcontroller chip 22. A random access memory (RAM) array 50 and an electrically erasable and programmable read-only memory (EEPROM) array 52 occupy respective blocks in the lower portion of the chip. Space is also provided for a serial communications interface 62 for serial connection to external devices, for the analog/digital converter 38 and for the pulse receiver 40.

The upper right-hand portion of the chip 22 is occupied by several gauge driver circuits, represented by block 54 in FIG. 2. These include a 135° analog gauge driver 64 and two 360° gauge driver circuits 66 and 68. Each of the gauge driver circuits 64-68 are analog linear power modules that are controlled by CPU 46 in response to the receipt of sensor signals from analog/digital interface circuit 38 and pulse receiver 40 (see FIG. 2). The timer block 44 on FIG. 2 is, for FIG. 3, further broken down into a clock generator circuit 70, a PLL oscillator circuit 72 and a modular timer circuit 74 located above CPU 46. The modular timer 74 includes components for two timers.

Chip 22 also includes a digital output circuit block 76. Digital output block 76 allows the parallel output of digital signals to another device, such as another microcontroller chip 22 or (as a bus expansion device) to off-board memory chips or other external devices. While the illustrated embodiment has only one digital output port 76, other similar digital output ports 76 could easily be included. Finally, the chip 22 includes four switch interface circuits 78 to allow the customer to select various modes of operation.

In addition to various low-voltage transistors, capacitors and other logic devices, the chip 22 includes several circuit blocks which need high power transistors. These include the analog/digital converter 38, the pulse receiver 40, the primary and secondary voltage regulators 58 and 60, and the gauge drivers 64, 66 and 68. The integrated fabrication process described herein allows these power circuits to be incorporated on the same substrate as the rest of the logic devices present on chip 22.

Figure 3A:
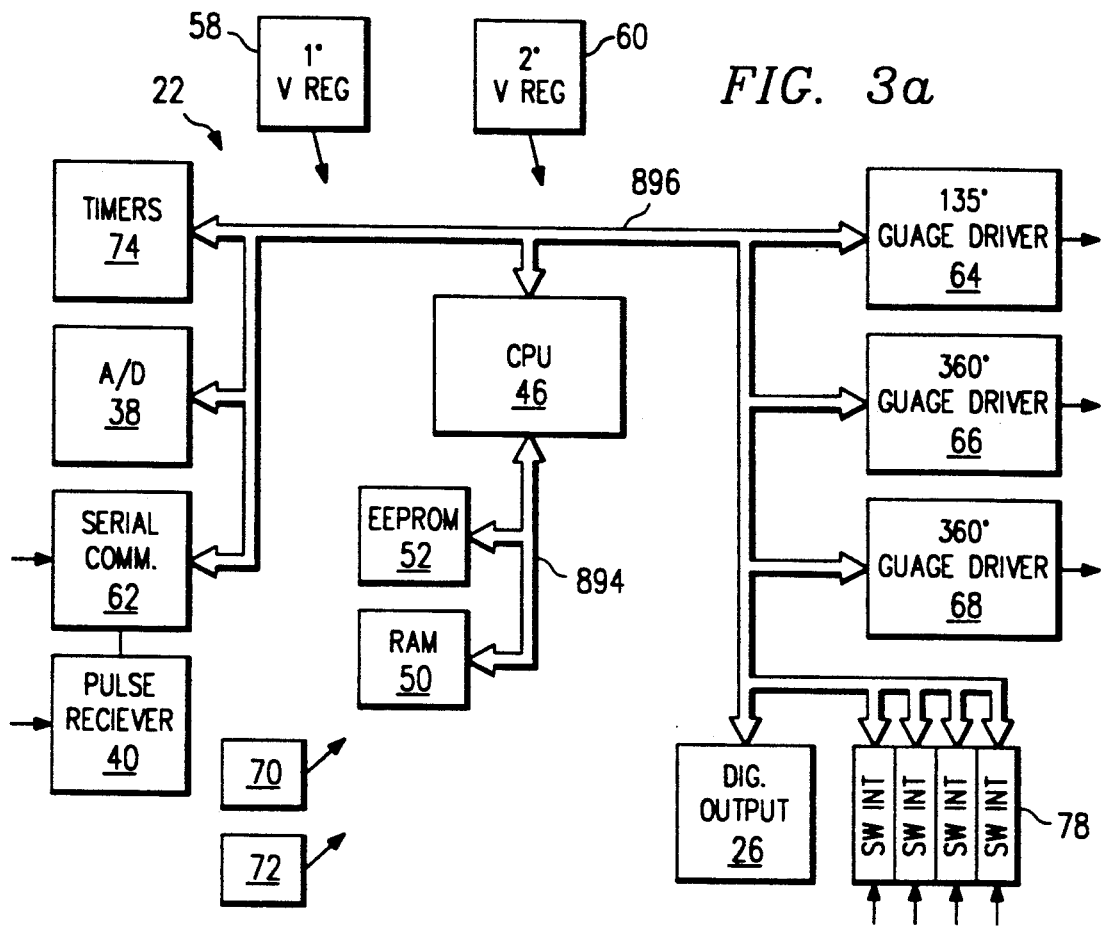
FIG. 3a is an electrical schematic block diagram of the chip shown in FIG. 3, showing system architecture.

Turning now to FIG. 3a, a schematic architectural block diagram of the chip 22 is shown. An internal bus 894 provides data and address lines between the CPU 46, the EEPROM memory 52 and the RAM 50. A peripheral bus 896 connects the CPU 46, which includes a controller, to the first and second timer 74, the analog/digital converter 38, the serial communications interface 62, the gauge drivers 64, 66 and 68, the digital output interface 76 and the switch interfaces 78. The primary and secondary voltage regulators 58 and 60 supply power at various predetermined voltages to the other components of the chip through separate lines, represented by the output arrows of these blocks. Similarly, the clock generator 70 and the PLL isolator 72 supply signals to the remainder of the chip 22 through their own independent lines as indicated.

Figure 4:
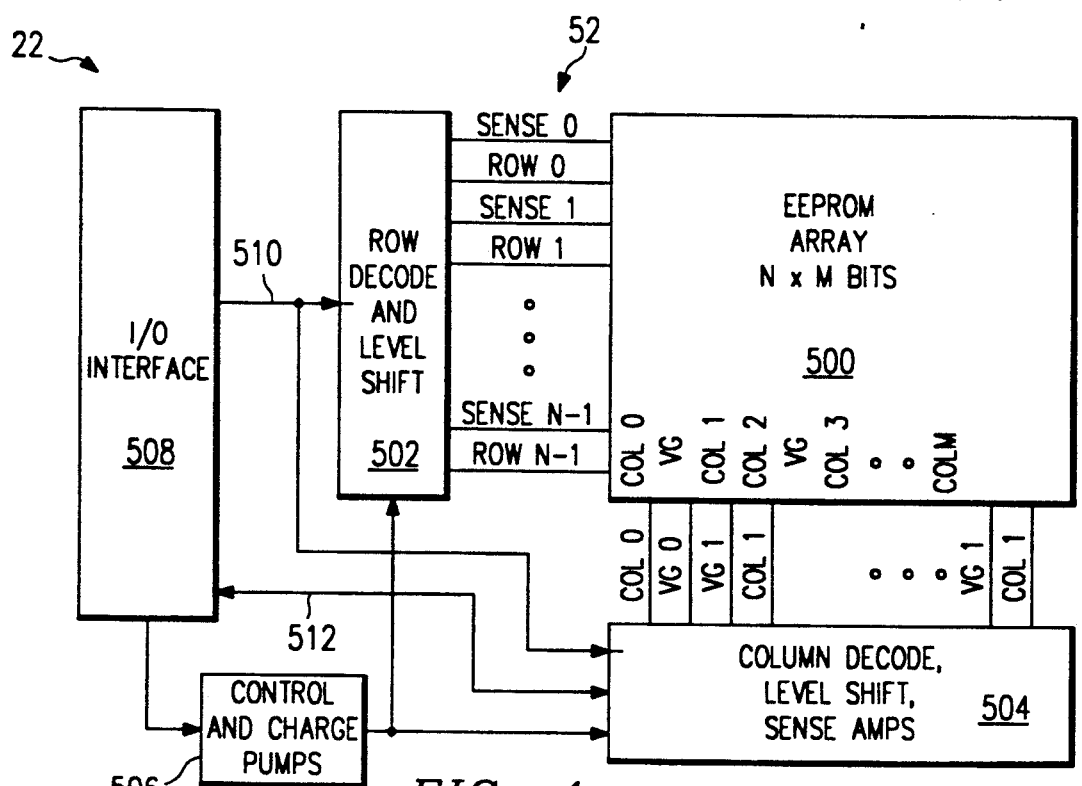
FIG. 4 is a schematic functional block diagram of a EEPROM memory matrix incorporated into the microcontroller shown in FIG. 3.

FIG. 4 is a schematic block diagram of the architecture of the EEPROM memory 52 as resident on chip 22. It is to be understood that the EEPROM array may stand alone as an independent integrated circuit and incorporate the novel cells described herein, as well as being a module on the integrated circuit microcontroller chip 22.

The array proper 500 has n rows and m columns, for an array of n×m bits. An array of suitable size for the microcontroller 22 described herein may have 256 words with 8 bits per word, for a total of 2048 bits. These may be organized in an array of, for example, 32 rows by 64 columns, or 64 rows by 32 columns.

To use the single-level poly EEPROM cell described herein, the array 500 needs to provide four lines to each cell: a sense line, a row line, a column line and a virtual ground line. A row decoder and level shifter 502 provides a plurality of sense lines, as paired with row lines as follows: sense 0, row 0, sense 1, row 1, etc. to sense n and row n. A column decoder, level shifter and sense amplifier section 504 provides a plurality of column lines col 0, col 1, col 2, col 3 . . . col m. Each pair of column lines share a virtual ground ($V_G$) line between them.

A block 506 includes circuitry for controlling the timing of the access to the EEPROM array 500 and charge pumps for providing control signals of appropriate voltages to the array 500 and the blocks 502 and 504. Control and charge pump block 506 is connected to an input/output interface block 508, which provides an interface with either the rest of the chip or, if the EEPROM memory 52 to be fabricated is not integrated with other functions, to other chips. The input/output interface chip 508 is connected through an address bus 510 to the row decoder 502 and the column decoder 504. A data bus 512 connects the input/output interface 508 with the column decoder block 504. It is through this path 512 that data are written or read from the array 500.

Integrated Process

Chip 22 is fabricated according to a novel, integrated process, wherein both power and non-power devices may be fabricated on the same chip with a minimum of process steps and a minimum number of masks. The process flow is arranged to provide the least amount of heat cycling to each the completed devices. That is, high temperature process steps are moved to the beginning of the process as much as possible, so as not to damage other device structures created later.

Figure 5:
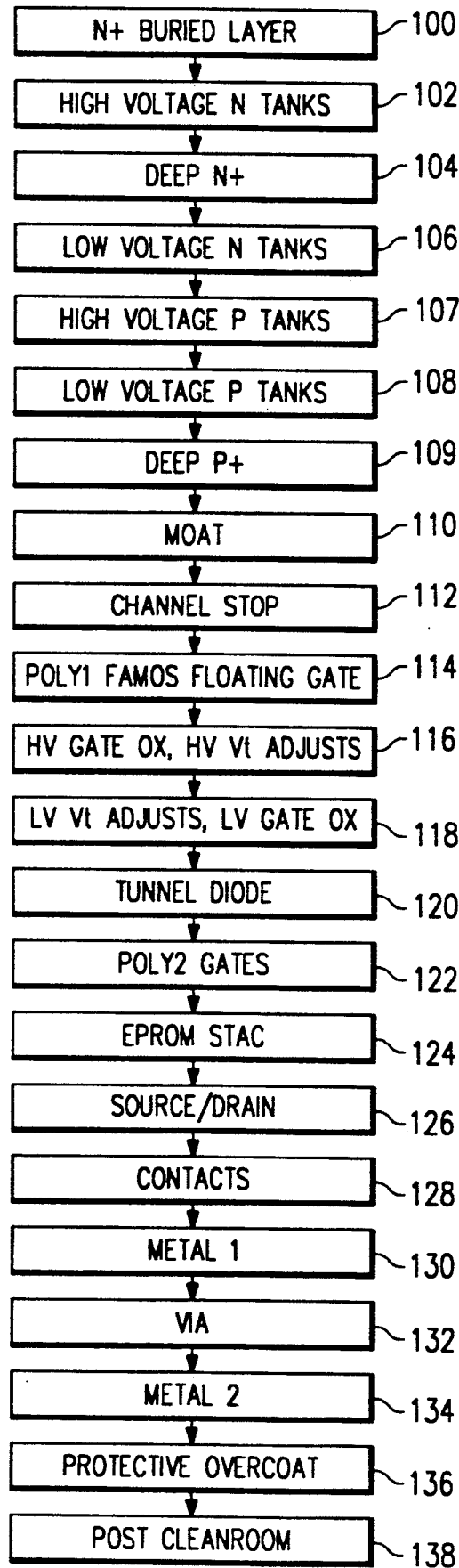
FIG. 5 is a high level process flow diagram associated with a microcontroller chip fabrication process more fully illustrated in FIGS. 6a through 6g.

FIG. 5 is a process flowchart that gives a broad overview of the process fabrication steps used in fabricating the microcontroller chip 22. After a broad, high level description of the process in conjunction with the flowchart shown in FIG. 5, a more detailed treatment of the process will be given in conjunction with FIGS. 6a to 6g below.

While the process is described in conjunction with the fabrication of devices in a (p) type silicon substrate and epitaxial layers, the process has application to (n) type semiconductor materials and to other semiconductors. The first major process step 100 is the selective creation of an (n+) buried layer formed in a p-type silicon layer. The (n+) buried layer is positioned between two (p−) epitaxial layers, the lower of which extends over a (p+) substrate. The (n+) buried layer is needed for vertical double diffused "metal oxide semiconductor (VDMOS) n-channel power transistors used, for example, in the voltage regulator blocks 58 and 60, the pulse receiver/driver 40, the analog/digital converter block 38 and the gauge driver blocks 64, 66 and 68 (see FIG. 3). A buried (n+) layer is also used as the collector for a vertical npn bipolar transistor, as will be later described. A laterally separate (n+) buried layer may be created for each VDMOS transistor, or one such layer may be used for several such transistors if these are intended to be connected in parallel.

After creating the (n+) buried layer, step 102 fabricates (n−) transistor tanks for the high voltage power transistors. These tanks are large diffused regions in which the power transistors themselves are fabricated. One technical advantage of the invention is that the same implantation used to create the high-voltage tanks for the power transistors are used to create tanks for other devices, such as n-channel 18-volt EEPROM gating transistors.

At step 104, at least one respective deep (n+) implant is used in order to connect each (n+) buried layer to surface contacts for the vertical transistors. At step 106, low-voltage device (n−) tanks are created to enclose conventional low-voltage ($V_{dd} \leq 5$ volts) logic field effect transistors, and further as well as components of, for example, vertical and lateral DMOS n-channel power transistors, drain-extended n-channel power transistors, and drain-extended p-channel power transistors. Low-voltage n-tanks are also used to enclose Schottky diodes. The high- and low-voltage tanks described herein differ in the dopant concentrations that are used to create them, and are thus implanted into the chip at different times. The high voltage tanks have less of a dopant concentration in them to preserve a high pn junction diode breakdown, but are deeper. The low-voltage tanks are shallower, but have a higher concentration of dopant.

At step 107, a plurality of high-voltage p-tanks are created in the epitaxial layer. The high-voltage p-tanks are used as tanks for 18 volt EEPROM gating transistors, Fowler-Nordheim tunneling EEPROM cells in the EEPROM array itself, as channel regions for drain extended p-channel transistors, and as tanks for floating gate avalanche injection electrically programmable read-only memory (FAMOS EPROM) cells. Step 108 involves the fabrication of low-voltage p-tanks as, for example, enclosures for low-voltage n-channel field effect logic transistors, as extended drains for extended drain p-channel field effect transistors, and as channel regions for n-channel LDMOS and VDMOS transistors.

At step 109, deep (p+) implantations are performed, for example, to form back gates for the lateral and vertical DMOS n-channel power transistors.

At step 110, the moat or isolating oxide regions surrounding the active device areas are defined with a mask. Channel stop implants that further isolate the devices from each other are carried out at step 12. In the same step 112, the previously defined isolating oxide regions are locally grown on the face of the semiconductor epitaxial layer.

Step 114 concerns the formation of a first-level polycrystalline silicon (poly 1) conductor for, for example, floating gate avalanche injection "metal" oxide semiconductor (FAMOS) EPROM cell, and/or double-level poly EEPROM cells.

Next, at step 116, the gate oxide for the control gates of the high-voltage and high power transistors is formed, and threshold voltage ($V_t$) adjust implants are performed for these transistors. At step 118, similar low-voltage $V_t$ adjust implants are performed through the high-voltage gate oxide layer. For the low voltage transistors, the relatively thick high voltage gate oxide is removed and a thin gate oxide is formed within step 118.

Step 120 concerns a portion of the EEPROM cell fabrication, and includes an (n+) Fowler-Nordheim tunnel diode implant and the formation of a thin tunnel oxide over the implant. At step 122, a second-level polysilicon (poly 2) layer is deposited, doped, patterned and etched to define gates for low- and high-voltage field effect transistors, single-level poly EEPROM cells, and to partially or completely define the control gate for FAMOS n-channel EPROM cells and double-level poly EEPROM cells. At step 124, a patterning and etching of certain double-level poly gate stacks occurs to complete the definition of the FAMOS n-channel EPROM cell control gates and, in one embodiment, stack-etched EEPROM cells.

In step 126, several source/drain implants and diffusions occur. The poly transistor and memory cell gates have sidewall oxides formed adjacent their lateral edges and cap oxides on other exposed polysilicon surfaces. A low-density diffusion (LDD) (n) type implant is made into the surface source/drain regions of the n-channel field effect transistors immediately before a main (n+) source/drain implantation. The LDD and (n+) implantations are annealed, followed (p+) source/drain patterning and implantation. The n-type source drain implantation step is further used to form back gates for p-channel transistors, and the (p+) source/drain implantation step is further used to form back gates for n-channel transistors.

In step 128, the formation of the semiconductor portions of the fabricated devices is essentially complete and all that is left is the conductive interconnection of these devices with each other and to the outside world, with the exception of Schottky diode devices. A mid-level oxide is deposited in step 128 and is patterned and etched to produce contact orifices. At step 130, the first level of metal is deposited, patterned and etched, including platinum only for PtSi Schottky diodes, but generally comprising a sputtered titanium tungsten alloy and an aluminum copper alloy on top of these. At step 132, a second-level of insulator is deposited over the first metal and vias are formed to the first metal. The second metal itself is deposited, patterned and etched at step 134. A protective overcoat is added at step 136, and various post-clean room processes are performed on the chip at step 138.

An integrated process flow will now be described in detail with the aid of FIGS. 6a–6g, which are schematic sectional views of various areas of chip 22 (FIG. 3) at various successive stages in the process. While the various devices formed during this integrated process flow are shown in FIGS. 6a–6g to be adjacent each other, this would not necessarily be the case in the finished semiconductor chip 22. The devices are shown in close association with each other only for the reader's convenience. The reader should understand that certain of the devices can (and most likely will) be separated by wide areas on the actual semiconductor chip 22. However, viewing the various devices in close association gives an understanding of the simultaneous application of each process step to each of the devices fabricated according to the process.

The integrated process described in here is modular, that is, not all of the illustrated devices need to be built for any one particular integrated circuit chip. Where certain of these devices are not required, some of the process steps shown in FIG. 5 are left out. For example, if an integrated circuit does not require EEPROM cells, then the tunnel diode step 120 would be left out. If the particular chip to be fabricated does not require power transistors having buried drain regions or collectors, then the (n+) buried layer step 100 and the deep (n+) step 104 would be omitted. If the process does not require FAMOS EPROM cells, the FAMOS floating gate step 114 and the EPROM stack step 124 would be omitted. Certain additions to the integrated process can be made for modifications of the illustrated cells, as will be explained hereafter. A principal technical advantage of the invention is the provision of a unified set of process parameters that can be applied to each of a plurality of distinctly different devices. The design rules for each of these devices can be stored in a library. The integrated circuit designer therefore is able to select different devices from this library with the assurance that an integrated process is available for building them, and that the devices so selected are compatible with this process. This considerably reduces design time for chips having new designs.

FIG. 6a is a schematic sectional view illustrating the beginning stages of the process. The beginning material is preferably a p-type silicon substrate 150 that, for example, may have a resistivity of about 0.015 and a [100] crystallography. A (p−) epitaxial layer 152 is grown on top of the silicon substrate 150.

The process of the invention is described in FIGS. 6a–6g in conjunction with the fabrication of eleven different devices, each formed within their respective device areas. The description below will detail the fabrication of a low-voltage p-channel field effect transistor 139, a low-voltage logic n-channel field effect transistor 140 (devices 139 and 140 being designed for voltages at or below about five volts), a p-channel isolation or gating field-effect transistor 141 for an EEPROM array, an n-channel isolation or gating field-effect transistor 142 for an EEPROM array, electrically programmable, read-only memory Fowler-Nordheim tunneling cell 143, a drain-extended n-channel field effect transistor 144, a drain-extended p-channel field effect transistor 145, a lateral diffused-source/drain "metal" oxide semiconductor (LDMOS) n-channel field effect transistor 146, a vertical diffused-source/drain "metal" oxide semiconductor (VDMOS) n-channel field effect transistor 147, a Schottky diode 148 and a floating gate avalanche metal oxide semiconductor (FAMOS) electrically programmable, read-only memory (EPROM) cell 149. The respective device areas in which these devices are to be made, and the devices themselves, are denoted by the same number throughout these drawings. Devices 141–147 and 149 are designed to be subjected to voltages and/or current densities much greater than the n-low-voltage logic transistors 139 and 140.

The first major device structure to be fabricated on the chip 22 is an (n+) buried layer 154. This process step corresponds to (n+) buried layer fabrication step 100 in FIG. 5. An oxide layer (not shown) is deposited on the surface of the (p−) epitaxial layer 152, and is patterned and etched to define an area in which the (n+) buried layer implant is to occur. The implant may be done, for example, with an n-type dopant such as antimony, at a dose of about $4 \times 10^{15}$ ions/cm$^2$ and at approximately 40 KeV. The implanted dopant is diffused in a subsequent high temperature step under an inert atmosphere. After the buried layer 154 has been formed, a further (p−) epitaxial portion 156 of the semiconductor substrate is grown on top of the buried layer 154 and the rest of the surface of the chip. This last epitaxial deposition is done to a depth of approximately 11 microns.

Once the (n+) buried layer 154 has been formed and buried, the next step in the preferred process is to form high-voltage n-tanks for various of the devices. The term "high-voltage" denotes the voltages to which devices formed in these tanks will be subjected; these higher voltages, such as twelve and eighteen volts and transients of up to sixty volts, require larger and deeper tanks in which the devices are respectively formed, but with smaller dopant concentrations. The creation of the high-voltage (n−) tanks corresponds to high-level step 102 in FIG. 5.

An oxide layer 164 and a nitride layer 166 are grown. The nitride layer 166 is then patterned and etched to define the areas in which the high-voltage n-tank implant is to occur. The n-tank implant is then conducted, preferably with phosphorus at a dose of about $2.5 \times 10^{12}$ ions/cm$^2$ and at an energy of about 80 KeV. This creates high-voltage (n−) tank regions 168, 169, 170 and 171. Portions of tanks 168 and 169 will form the channel regions for the p-channel transistor 141 and 145, respectively. Tanks 170 and 171 will form portions of the drains for PMOS transistors 146 and 147, respectively.

The (n+) buried layer 154 serves as the drain or source of the vertical DMOS field effect transistor 147. Conductive connection will have to be made to buried layer 154 to connect it to other devices on chip 22. The illustrated way to do this is through deep (n+) implants 172, the creation of which corresponds to step 104 in FIG. 5. An alternative way to perform this connection is through conductive trench connections, described later in this application. In the embodiment illustrated in FIGS. 6a–6g, a deep (n+) pattern is defined on the chip surface by photoresist, and any remaining portion of nitride layer 166 is etched by plasma (not shown). A deep (n+) implant is then performed using phosphorus at about $1.0 \times 10^{16}$ ions/cm$^2$ and about 80 KeV. The high-voltage n-tank regions 168–171 and the deep (n+) regions 172 are then driven in with a thermal step at about 1200° C. under an inert atmosphere for several hours.

N-type tank implantations are next performed for low-voltage devices. This corresponds to high level step 106 in FIG. 5. The nitride layer 166 is patterned and etched, and it and a photoresist layer (not shown) used to define the nitride etch are used as a mask for the implantation of low-voltage (n−) tanks 175, 176 and 177. N-tank 175 will be used as the enclosing tank for the low-voltage p-channel field effect logic transistor 139. N-tank 176 will be used as a portion of the drain of a drain-extended n-channel power transistor 144. N-tank 177 will be used as the enclosing tank of a Schottky diode 148. One of the technical advantages of the process described herein is that the drain 176 of the drain-extended n-channel field effect transistor 144 is created at the same time as the n-tanks 175 and 177. This simplifies the process, by reducing the number of required masks and mitigates damage to the chip 22 by unnecessary implantation, etching, thermal and cleanup steps.

It should be noted that the approximate implantation boundaries given in the shown sectional views are the boundaries obtained after all thermal steps have been completed. At this early stage in the processing, the boundaries are not so deep or wide, but they approach the illustrated boundaries as further thermal steps are performed on the semiconductor chip 22.

After the low-voltage n-type implantation step 106 (FIG. 5), a pad oxide 178 is grown within the previously etched areas. The nitride mask 166 is then stripped in a hot phosphoric acid etch in preparation for the next process step.

Referring now to FIG. 6b, further steps in the preferred process are shown. Steps occurring immediately next in the process correspond to high-voltage p-tank formation step 107 in FIG. 5. High-voltage p-tanks, which are respectively used as an isolating tank for the EEPROM cell 143, as a channel region for the drain-extended n-channel power field effect transistor 144, and as a tank for the FAMOS EPROM cell 149, are patterned using a layer of photoresist (not shown). A (p−) implant is next performed with boron at a dose of about $1.4 \times 10^{12}$ ions/cm$^2$ and at an energy of approximately 40 KeV. This creates high-voltage p-tank regions 180, 182, 184 and 186. The implantation of high-voltage p-tank 180 changes the p/n diode boundary between it and the low-voltage n-tank 176 as shown.

Proceeding to step 108 of FIG. 5, low-voltage p-tanks are next patterned with a photoresist layer 188 and a p-type implant is performed, preferably with boron at a dose of about $2.5 \times 10^{12}$ ions/cm$^2$ and an energy of approximately 40 KeV. This implantation causes the creation of low-voltage p-tank 190 for the low-voltage n-channel field effect transistor 140, region 192 as a drain of the extended-drain p-channel transistor 145, region 194 as a channel region of the lateral DMOS n-channel transistor 146, and region 196 as a channel region of the vertical DMOS n-channel power transistor 147. The photoresist layer 188 is then stripped.

Referring now to FIG. 6c, further process steps will be illustrated, which correspond to the deep (p+) fabrication step 109 in FIG. 5. A layer 198 of photoresist is patterned as a mask for the implantation of deep (p+) implants used in the fabrication of back gates for the lateral DMOS n-channel transistor 146 and the vertical DMOS n-channel transistor 147. The implant is done preferably with boron at a dose of about $1 \times 10^{12}$ ions/cm$^2$ and an energy of about 40 KeV. After the high-voltage p-tank, low-voltage p-tank and deep (p+) implants, a thermal tank drive step is performed at about 1100° C. under an inert atmosphere for about 500 minutes. The deep (p+) implant step yields a deep (p+) back gate region 200 in the lateral DMOS n-channel transistor 146, and a deep (p+) back gate region 202 in the center of the vertical DMOS n-channel transistor 147. Layer 198 of photoresist is then stripped. The (p−) tanks 194 and 196 are positioned to be spaced by a substantial margin away from the lateral margins of the high-voltage n-tank 170 and the high-voltage n-tank 171, respectively. The p-tank 196 is also significantly spaced from the deep (n+) diffusion 172, which in a preferred embodiment takes an annular or endless form. The deep (p+) implantations 200 and 202 are preferably centered within, and interiorly spaced from the lateral margins of, the respective p-tanks 194 and 196.

The process now enters the moat step 110 as shown in the process diagram of FIG. 5. This portion of the process is illustrated in part by FIG. 6d. A moat pad oxide layer (not shown) is formed across the surface of chip 22 to a depth of about 400 Angstroms using hydrogen peroxide as a reactant. Thereafter, a layer of nitride (layer 204 may be taken in FIG. 6d to represent the nitride and pad oxide together) is formed to a depth of about 1400 Angstroms in a thermal step at 800° C. using a silicon nitride depositing system, such as a combination of ammonia and dichlorosilane. The resultant nitride/oxide moat layer 204 is then patterned and plasma-etched to leave the moat mask 204 as shown. The moat nitride/oxide layer 204 is left over the central regions of the n and p tanks as a protection from subsequent implant and localized oxidation (LOCOS) steps.

The channel stop step 112 of FIG. 5 is next performed. For those devices to be fabricated on chip 22 formed in (n−) tanks, it is desirable that the channel stop dopant not be implanted in areas left exposed by the moat layer 204. Therefore, a photoresist layer 206 is patterned to define many of the lateral edges of the channel stop regions. The channel stop implant may be performed, for example, with a (p) type dopant such as boran at a dose of about $3 \times 10^{13}$ ions/cm$^2$ and at an energy of about 30 KeV. It will produce the channel stop regions represented by the pluses 208 in FIG. 6d. The channel stop regions 208 have been omitted from the subsequent sectional views shown in FIGS. 6e–6g for the purpose of clarity. The channel stop implant acts to augment the conductivity type of the (p−) epitaxial layer 152 to (p) type in the implanted channel stop regions 208. It prevents the formation of parasitic transistors between the devices. The photoresist layer 206 is subsequently ashered and cleaned from the surface of chip 22.

Turning now to FIG. 6e, further steps under the high-level channel stop step 112 as shown in FIG. 5 will be described. Localized oxidation (LOCOS) next occurs to about 7600 Angstroms in thickness (the thicknesses of the sections shown in FIGS. 6a–6g not being to scale) under an oxidizing atmosphere such as hydrogen peroxide for about nine to ten hours at about 900° C. The oxidation occurs in those areas left open by the nitride/oxide mask 204 shown in FIG. 6d. This produces the isolating oxide regions 210 shown in FIG. 6e. The oxide portion of masking layer 204 is removed in a hydrofluoric acid dip for two minutes, and the nitride portion of layer 204 is removed in a hot phosphoric acid solution at about 185° C. for about 185 minutes.

After a cleanup step, a dummy oxide layer (not shown) is grown on the exposed silicon surface to remove damaged material. This dummy oxide layer is subsequently stripped with a hydrofluoric acid wet etch.

Continuing to refer to FIG. 6e, further steps in the process are shown. These steps correspond to the "FAMOS floating gate" step 114 as shown in FIG. 5. An EPROM floating gate oxide layer 212 is grown for the floating gate avalanche metal oxide semiconductor (FAMOS) EPROM cell 149. This oxide layer 212 is grown to a depth of approximately 350 Angstroms under an oxygen atmosphere at about 900° C. Then, a first layer 214 of polycrystalline silicon (poly 1) is deposited on the chip surface to a depth of about 2000 Angstroms using, for example, silane as a gaseous silicon carrier at about 625° C. Poly 1 layer 214 is doped to render it conductive with phosphorus by subjecting the chip 22 to a nitrogen-oxygen-POCl$_3$ atmosphere at about 900° C. for about 20 minutes. The poly 1 layer 214 is then deglazed, patterned and etched to produce the FAMOS floating gate 214 and gate oxide 212 as shown in FIG. 6e.

During the step of forming the gate oxide layer 212 and depositing the poly 1 layer 214, the poly 1 layer was deposited on other, non-array portions of the chip 22 (not shown). Following the deposition, patterning and etching of the poly 1 layer 214, an interlevel oxide layer is grown on the exposed surfaces of the poly 1 layer 214 to a depth of approximately 110 Angstroms under an oxygen atmosphere at about 950° C. This is followed by an interlevel nitride layer grown to approximately 250 Angstroms in depth at about 800° C. under an atmosphere of ammonia and dichlorosilane. The combined nitride/oxide sandwich is illustrated as a single layer 216 for cell 149 in FIG. 6e.

After the step of forming the nitride/oxide insulator layer 216, a layer of photoresist (not shown) is used to cover the layer 216 for all of the FAMOS n-channel EEPROM cells 149. Non-array portions of the nitride layer 216, however, are left exposed. The non-array portions of the nitride layer 216 are then etched and removed.

Returning momentarily to FIG. 5, the next high level process step is the high-voltage device $V_t$ adjust step 116. Under this step, a layer of photoresist (not shown) is deposited on the chip and patterned to expose the high-voltage n-tanks 158, 160, 162 and 164. These tanks are implanted with boron at a concentration and energy sufficient to alter the threshold voltage of the p-channels by approximately one volt. The layer of photoresist (not shown) is then stripped. A second threshold voltage adjust implant is performed for those devices using the high-voltage p-tank structures 182, 184, 180 and 186.

A layer of photoresist (not shown) is deposited on the chip 22 and patterned to selectively expose these areas while covering up all others. An n-channel $V_t$ adjust implant is then performed using boron to alter the threshold voltage by about 0.85 volts.

After the high-voltage $V_t$ adjust implants, a high-voltage gate oxide layer 218 is grown on exposed portions of the silicon to a depth of from 325 to 500 Angstroms at about 900° C. under an oxygen atmosphere.

Incorporated in the next high-order process step 118 (FIG. 5) is a low-voltage $V_t$ adjusting implant. Continuing to refer to FIG. 6e, a layer of photoresist (not shown) is deposited on the surface of the chip 22 and patterned to expose the low-voltage tanks 175, 190, 182, 176, 192, 194, and 196. An implant of boron is then made through the high-voltage gate oxide layer 218 then existing on the low-voltage tank areas. After this implantation step occurs, and using the same patterned layer of photoresist, the gate oxide layer 218 is etched from the surfaces of the low-voltage n and p-tanks immediately above described. Gate oxide layer 218 is left on the high-voltage tanks 168, 182, 184, 180, 169, 170, 171 and 186 after this etch step.

Next, the old layer of photoresist is stripped and a low-voltage gate oxide layer 220 is grown on the low-voltage tanks of field-effect transistors 139 and 140 in the place of the etched-away high-voltage gate oxide layer 218. The low-voltage gate oxide layer 220 is grown to a depth of approximately 200 Angstroms under a thermal step with an oxygen atmosphere.

The next high level process step, as shown in FIG. 5, is step 120 comprising the fabrication of a tunnel diode for EEPROM cell 143 fabricated on the chip 22. Referring again to FIG. 6e, a layer 222 of photoresist is deposited on the surface of chip 22 and patterned to define an implantation area for the tunnel diode. A phosphorous implant is then made through the oxide layer 218 then existing above the area to be implanted to create an (n−) tunnel region 224. The portion of the oxide layer 218 existing over the tunnel region 224 is then etched back to the semiconductor surface. Photoresist layer 222 is then stripped. Next, a tunnel oxide layer 226 is grown back on the exposed surface to a depth of approximately 90 Angstroms under an oxygen atmosphere at approximately 850° C. This completes the high level step 120 as shown in FIG. 5.

FIG. 5's next high-level process step 122 concerns the deposition, doping and definition of a plurality of conductive level 2 poly gates. Referring to FIG. 6f, these next steps in the fabrication process are illustrated. A second layer of polycrystalline silicon (poly 2) is deposited to a depth of approximately 4500 Angstroms. This may be accomplished, for example, using silane as the depositing agent at about 625° C. The poly 2 layer is then doped with phosphorus to render it conductive with, for example, POCl$_3$ in a thermal step at about 900° C. with nitrogen and oxygen present. The poly 2 layer is then deglazed. A layer of photoresist (not shown) is deposited across the surface and patterned. The second poly layer is then etched to define the following poly 2 gates: a low-voltage p-channel transistor gate 228, a low-voltage n-channel transistor gate 230, a p-channel EEPROM transistor gate 232, an n-channel EEPROM transistor gate 234, an n-channel EEPROM control gate 236, an EEPROM floating gate 238, a drain-extended n-channel transistor gate 240, a drain-extended p-channel transistor gate 242, an annular or endless lateral DMOS n-channel transistor gate 244, an annular or endless vertical DMOS n-channel transistor gate 246, and a FAMOS n-channel control gate 248 (this last gate is only partially defined at this point).

Turning now to FIG. 6g, the remaining principal steps of the integrated fabrication process are illustrated. Returning momentarily to FIG. 5, the next steps illustrated in FIG. 5g are the EPROM stack etch step 124, the source/drain fabrication step 126, and the contact step 128. A layer of photoresist (not shown) is deposited over the surface of the chip 22 and patterned to expose unwanted portions of second poly layer 248 in EPROM area 149. The patterned photoresist defines a stack including the EPROM floating gate oxide 212, the EPROM floating gate 214, the nitride/oxide sandwich layer 216 and the second poly control gate 248. Using the same photoresist mask, all of these layers are successfully etched until the "stack" 212, 214, 216 and 248, as illustrated in FIG. 6g, is produced. The patterned photoresist layer is then removed.

Following the stack etch, a 2000 Angstrom-thick layer of oxide (not shown) is deposited over the chip 22 and anisotropically etched back to produce sidewall oxide regions 250. Because the original thickness of the oxide at features of the face having vertical relief are deeper than the thickness of the oxide layer generally, regions 250 are left over from the etchback. After the etchback, a 300 Angstrom layer of cap oxide is grown in a thermal step under an oxygen atmosphere to insulate the exposed surfaces of gates 228, 230, 232, 234, 236, 238, 240, 242, 244, 246 and 248.

A layer of photoresist (not shown) is next deposited over the surface of chip 22 and patterned to expose device areas 140, 142 and 143. Selected portions of device areas 144, 145, 146 and 147 are also left open. EPROM device area 149 is also left open. A low density diffusion (LDD) implantation is then performed with a mobile n-type dopant such as phosphorus at a dose of about $4.0 \times 10^{14}$ ions/cm$^2$ and at an energy of approximately 80 KeV. This creates source/drain regions 254, 256, 258, 260, 262 and 264, source region 266 for the drain-extended n-channel transistor 144, contact region 268 for the drain of transistor 144, drain contact region 272 and annular source/drain region 274 for the lateral DMOS n-channel transistor 146, deep (n+) contact region 276 and an annular source/drain region 278 for the vertical DMOS transistor 147, contact region 278 for the Schottky diode 148, and source/drain regions 280 and 282 for the FAMOS EPROM cell 149.

A second (n+) source/drain implant follows the LDD implant into the same areas, making them (n+), and is performed with arsenic at a dose of approximately $5 \times 10^{15}$ ions/cm$^2$ and at an implantation energy of approximately 120 KeV. Thereafter, these two implantations are annealed at about 900° C. under a nitrogen atmosphere to obtain the implantation boundaries shown. In particular, a portion of the phosphorus dopant in (n+) regions 274 and 278 diffuses partially under the respective gate oxides 218 for the LDMOS transistor 146 and the VDMOS transistor 147.

The (n+) source/drain patterned photoresist layer (not shown) is stripped and replaced with a layer of photoresist (not shown) which is patterned to define a plurality of (p+) source/drain regions. A (p+) source/drain implant is performed with boron at a dose of about $2 \times 10^{15}$ ions/cm$^2$ and an energy of about 25 KeV. This implant step creates (p+) source/drain regions 284, 286, 288 and 290 for the low-voltage and EEPROM gating p-channel field effect transistors 139 and 141, respectively; a source 292 and a drain contact region 294 for the drain extended p-channel transistor 145; and central back gate contact regions 296 and 298 for the lateral DMOS transistor 146 and the vertical DMOS transistor 147, respectively.

The steps described immediately above correspond to the source/drain fabrication step 126 in FIG. 5. The process next proceeds to "contacts" step 128. After a cleanup step, borophosphate silicon glass (BPSG) is deposited and densified. A layer (not shown) of photoresist is patterned and etched for the contacts (not shown) for each of the devices 139-149. The BPSG is only shown with respect to the Schottky diode device area 148, where it is indicated by 300. The patterned photoresist is used as a mask for successive wet and plasma etches of the contact orifices, including orifice 302 of the Schottky diode 148.

After another cleanup step, platinum is deposited in the Schottky diode orifice(s) 302 only and sintered to create a platinum silicide layer 304. Nonreacted platinum is removed. Then, in orifice 302 and in the other contact orifices (not shown) a refractory metal such as titanium-tungsten alloy is sputtered on a depth of approximately 3300 Angstroms. This is followed with another approximately 6000 Angstroms of an aluminum copper alloy to complete the first level metallization. This first layer of metal (metal 1) is then patterned, etched and sintered. A metal 1 contact is represented by 306 in FIG. 5g; like metal contacts are made to each of the various device terminals of devices 139-149. Some of these contacts are not made within the sectional planes shown in FIG. 6g, and others have been omitted for the purpose of clarity.

The remaining process steps are not represented by any structure in FIG. 6g, as they are straightforward to persons having ordinary skill in the art. A middle level insulator layer is deposited over the first level metallization, and vias are patterned and etched into it. A second metal layer, formed successively by sputtering a titanium tungsten alloy and an aluminum copper alloy, is then patterned and etched. A nitride/oxide layer is deposited over the surface of chip 22. This nitride/oxide layer forms a protective overcoat, which is patterned and etched to expose the lead pads 56 of chip 22 (see FIG. 3). Post cleanroom steps follow at step 138 in FIG. 5.

FIG. 6g-1 is a more detailed sectional view of the vertical DMOS transistor 147. As described above, the source/drain region 278 is the recipient of an LDD (low density diffusion) implant of phosphorus as well as an (n+) implant of a heavier (n) type dopant such as arsenic. The low-voltage p-tank 196 is created with a dopant such as boron.

According to the prior art, the structure equivalent to the p-tank 196 and the source/drain region 278 were implanted as self-aligned to the interior lateral margins of the poly gate 246, as augmented by the sidewall oxide regions 250. Since phosphorus is a very mobile dopant, the source/drain region 278 had a tendency to diffuse laterally under the gate 276 at a faster rate than the boron defining (p−) channel region 196, diminishing or eliminating the metallurgical channel lengths $l_1$ and $l_2$. To prevent this problem, the dopant concentration of the source/drain region 278 was made to be considerably less than optimum, or about $10^{18}$ ions/cm$^3$.

Because the integrated process forms the low-voltage p-tank 196 before the application of the poly gates 246, the dopant concentration within the source/drain regions 278 can be increased to at least on the order of $10^{20}$ ions/cm$^3$. Since the (n+) regions 278 are self-aligned to the poly gate 246, the channel length $l_1$, $l_2$ is determined by the alignment of the poly to the low-voltage p-tank 196. The structure and advantages of the LDMOS transistor 146 are similar.

Figures 1, 6H:
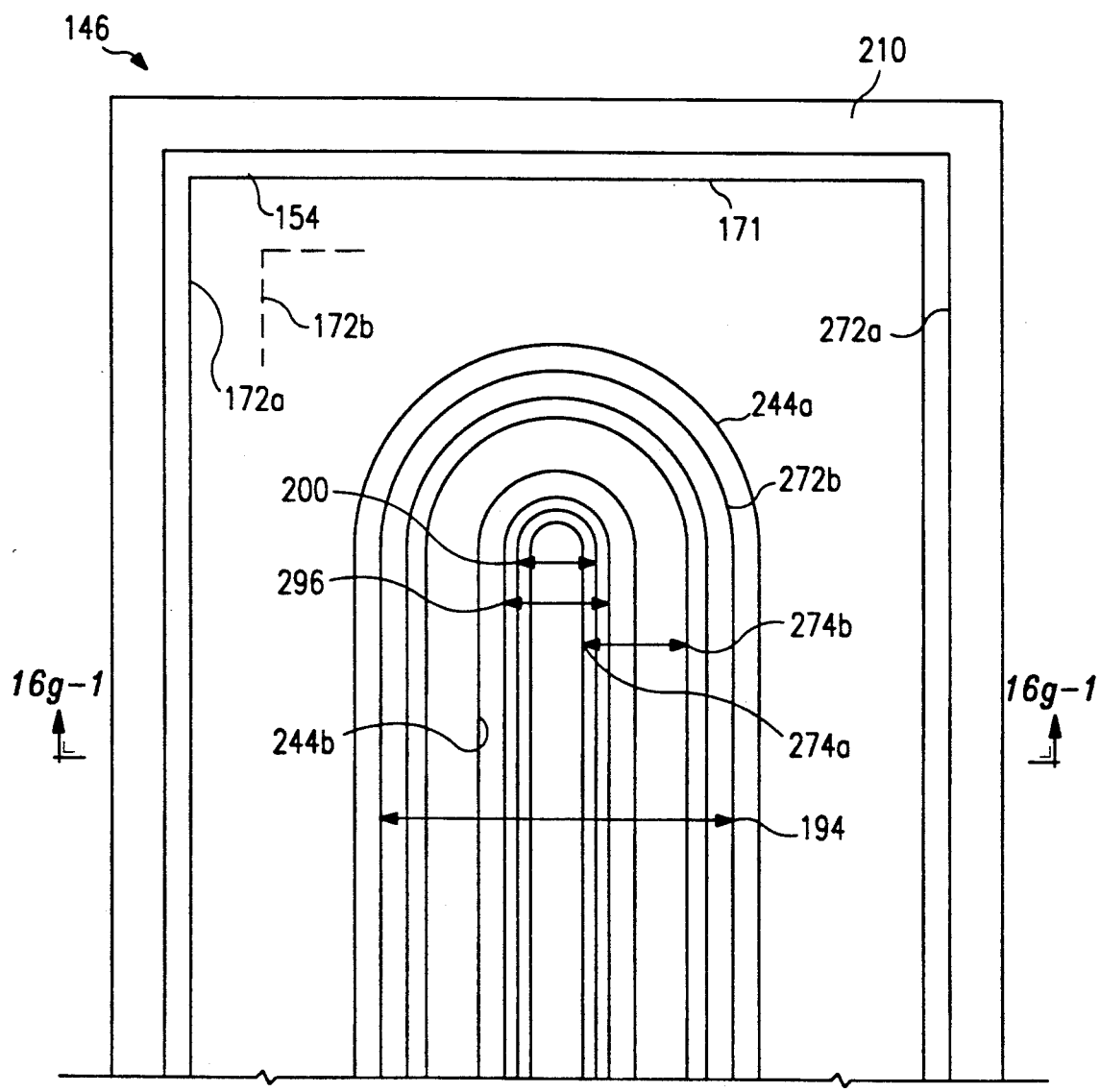

FIG. 6h-1 is a plan view of LDMOS transistor 146. The sectional view in FIG. 6g-a could be taken substantially along line 6g-1 - 6g-1 of FIG. 6h-1, except for the buried layer and deep diffusion structures of the VDMOS transistor shown in FIG. 6g-1. A moat oxide boundary 210 forms a rectangular (picture frame) border around the active device area. The boundary of the high-voltage n-tank is shown by a rectangular border line 170 set to the interior of the moat oxide 210. For the vertical DMOS structure 147, a deep diffusion region is required, and the interior limit of this is shown in phantom at 172b. This is also the approximate boundary of the deep diffusion contact region 276. FIG. 6h-1 shows a single "stripe" of an LDMOS or VDMOS structure disposed within (n−) tank 170. The exterior oval line 244a marks the exterior limit of the poly gate 244. In the LDMOS case, the next interior line represents the interior boundary of a laterally exterior (n+) source/drain region 272, which extends from the internal boundary of the moat oxide 210 (shown at 272a) to a point underneath the poly gate 244 at 272b. In the VDMOS case, the internal boundary of this exterior source/drain region is kept at the interior boundary of the deep diffusion region shown at 172b.

The next limit encountered as one proceeds inwardly is a metal one conductor margin. The exterior boundary of the internal annular (n+) source/drain region is next encountered at 274a. The external boundary of the low-voltage p-tank 194 may be the same as the internal boundary of the exterior source/drain region 272b. The next boundary inward is the interior lateral margin 244b of the annular poly gate 244. The exterior lateral margin of the deep (p+) diffusion surface contact region 296 appears next. Radially inwardly of this is the exterior limit of the deep (p+) back gate 200. The last limit encountered as one proceeds inwardly is the interior boundary 274b of the (n+) source/drain region 274.

Only a portion of the plan view of the LDMOS transistor 146 is shown. While, in a typical case, as delimited by the exterior margin of the poly 244a, the transistor 146 may be approximately 32 microns in diameter, the transistor 146 may be 500 to 1010 microns long. Further, several such "stripes" can be placed within the same n-tank 170 and connected in parallel. Similarly, these same parallel "stripes" can share the same endless annular deep (n+) diffusion region 122, in the case of the vertical DMOS transistor structure, and the same (n+) buried layer 154 (see FIG. 6g).

While devices 139-149 have been used by way of example to show an integrated process for the fabrication of each, further devices may also be built using the same process flow. The following series of FIGS. 7-14 are all arranged in a similar manner. For example, FIGS. 7a-7h all illustrate a low-voltage p-channel field effect transistor 303 similar to the transistor 139 shown in FIGS. 6a-6g, with the addition of a back gate connection. Of these, FIGS. 7a-7g are schematic sectional views corresponding, respectively, to FIGS. 6a-6g. FIG. 7h is a schematic plan view of the transistor 303. This pattern is repeated throughout the rest of the FIGS. 8-14 for other devices. Throughout FIGS. 7-14, like characters identify structures corresponding to those found in FIGS. 6a–6g wherever possible.

Figure 7A:
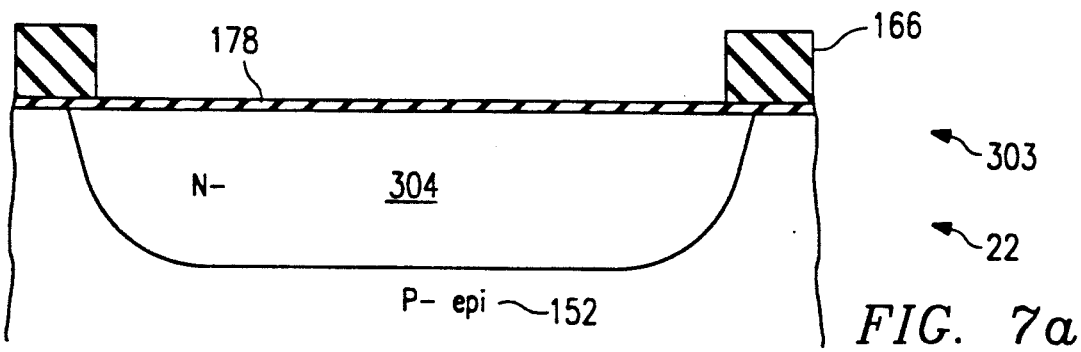
FIGS. 7a-7b and 7d-7g are highly magnified schematic sectional views of steps in the fabrication of a p-channel, low-voltage, back-gated field effect transistor using the integrated process described herein.
Figure 7B:
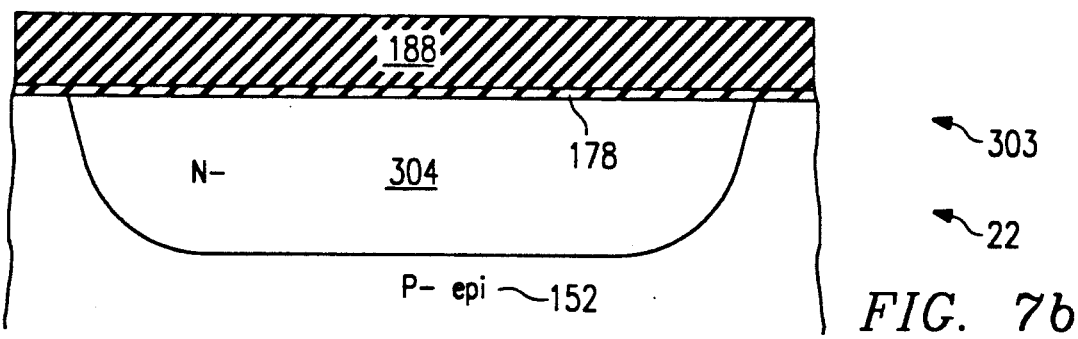
Figure 7D:
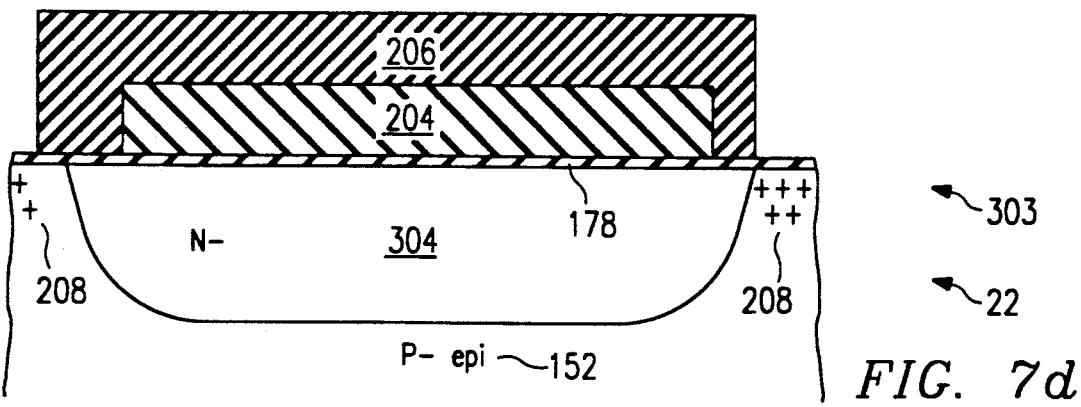

Referring particularly to FIG. 7a, a low-voltage p-channel transistor indicated generally at 303 with a back gate connection may be fabricated during the same process flow as the devices shown in FIGS. 6a–6g. The low-voltage n-tank 304 is implanted at the same time as tank 175 (FIG. 6a). A photoresist layer 166 has been patterned and used as a mask for a low-voltage n-tank 304. In FIG. 7b, the n-tank 304 and the covering oxide layer 178 are left undisturbed. Nothing remarkable happens to device area 303 at the stage shown in FIG. 6c, so FIG. 7c has been omitted. In FIG. 7d, the n-tank 304 and the oxide layer 178 are masked off by a combination of the nitride/oxide layer 204 and the patterned channel stop-defining photoresist layer 206. P-type channel stop regions 208 are then implanted, as shown by the pluses in this Figure.

Figure 7E:
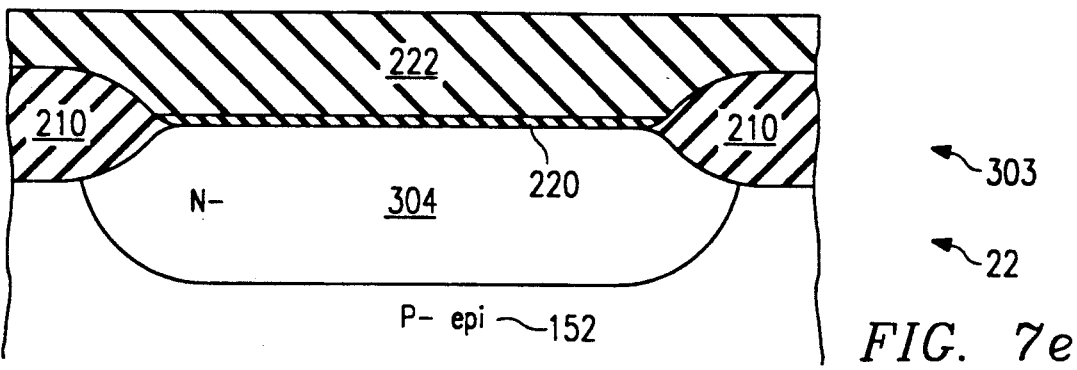

In FIG. 7e, after stripping photoresist layer 206, a localized oxidation (LOCOS) process is used to create the isolating oxide regions 210 in those areas left uncovered by nitride/oxide layer 204 (FIG. 7d). After the high-voltage gate oxide (not shown) is etched off and the low-voltage $V_t$ adjust implant is performed, a gate oxide layer 220 is grown on the face of tank 304. FIG. 7e shows the status of the device 303 at the time that the tunnel diode 224 (FIG. 6e) is implanted; the entirety of the device 303 is shown masked off by photoresist layer 222.

Figure 7F:
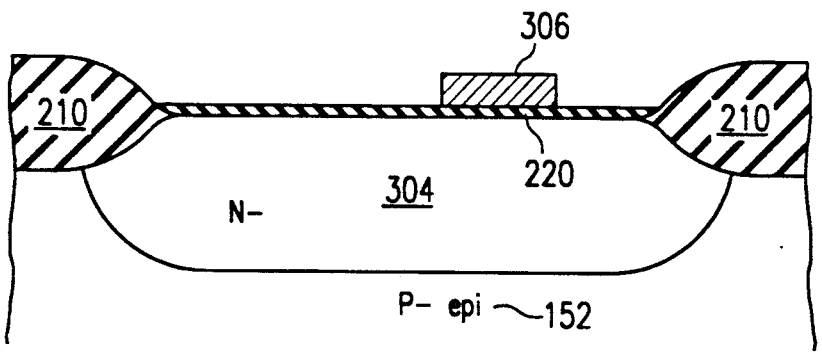
Figure 7G:
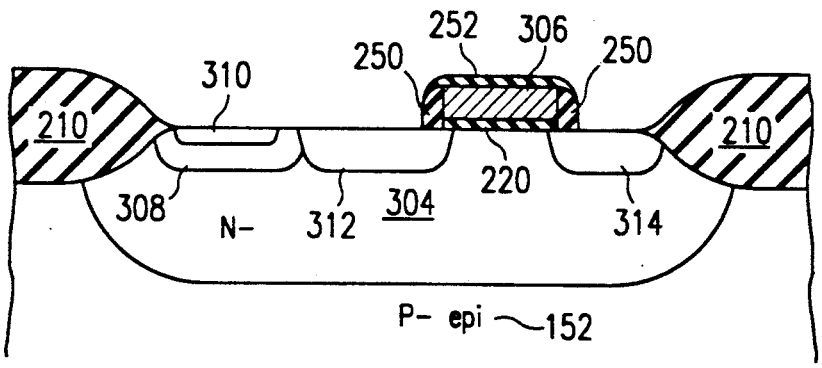
Figure 7H:
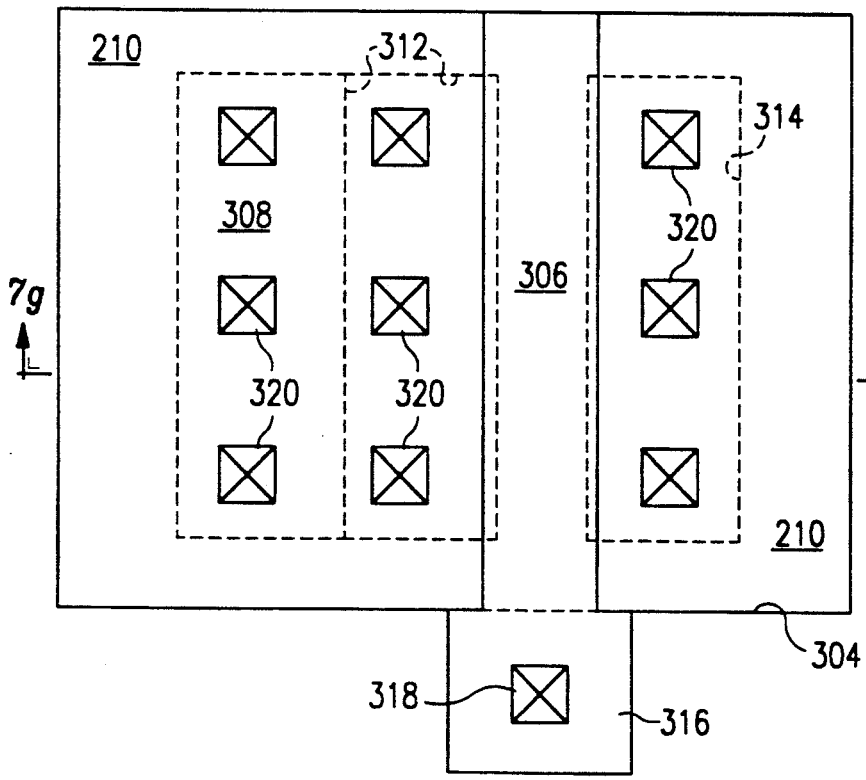
FIG. 7h is a schematic plan view of the transistor shown in FIG. 7g, FIG. 7g being taken substantially along line 7g—7g of FIG. 7h.

A poly 2 gate 306 is deposited, doped, patterned and etched as shown in FIG. 7f. In FIG. 7g, the gate 306 is insulated with sidewall oxide regions 250 and a cap oxide 252. The LDD implant described for FIG. 6g creates an (n−) implanted region 308. The remainder of the transistor area 303 is masked with photoresist for this implantation step. This is immediately followed with an (n+) implantation that occurs at the same time as the (n+) source/drain arsenic implantation occurring during step 126 (FIG. 5). This creates an (n+) region 310. Regions 308 and 310 act as a back gate connection to the n-tank 304. During the (p+) source/drain implantation described in connection with FIG. 6g, source/drain regions 312 and 314 are created in a manner similar to regions 284 and 286 of transistor 139 (FIG. 6g).

Referring now to FIG. 7h, a plan view of a completed device 303 is schematically shown. The low-voltage n-tank 304 is indicated by a solid rectangular line enclosing the active device area. The source/drain implantations are shown by the dotted line enclosures indicated at 312 and 314. The back gate connection region 308 is shown enclosed with a dotted border. The top, bottom and left borders of region 308, the top and bottom borders of region 312, and top, bottom and right borders of region 314 are defined by the lateral edges of the moat oxide layer 210. Implantations 312 and 314 are self-aligned to the edges of the LOCOS oxide 210 and the margins of the second-level poly gate 306 as augmented by the sidewall oxide 250 (see FIG. 7g). Second-level poly gate 306 is extended to a pad 316 to which a contact 318 is made from the first level metal. The first level metal is also used to make contacts 320 to the back gate region 308, the source/drain region 312 and the source/drain region 314 of the transistor 303.

Figure 8B:
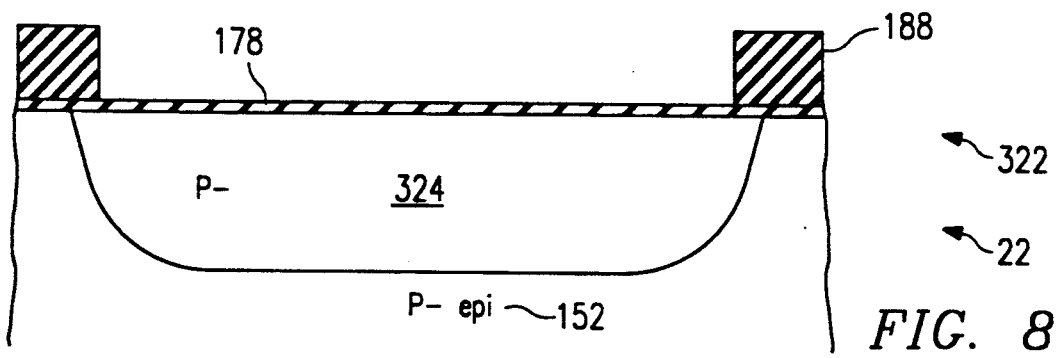
FIGS. 8b-8g are highly magnified schematic sectional views of successive stages in the fabrication of a low-voltage, back-gated n-channel field effect transistor according to the integrated process described herein.
Figure 8C:
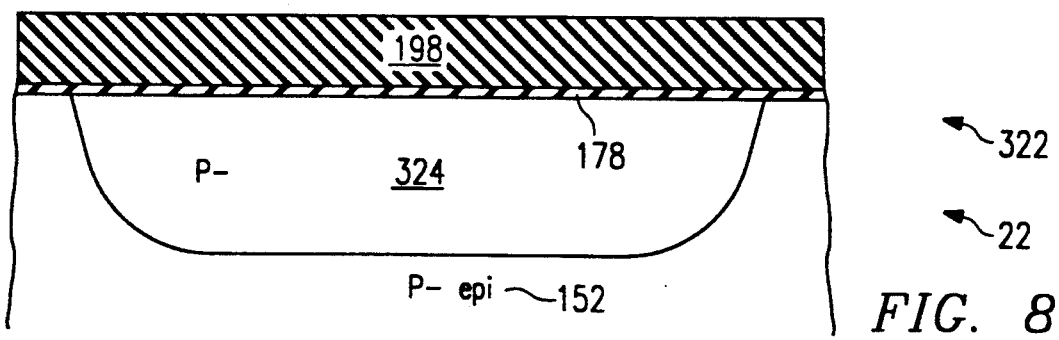
Figure 8D:
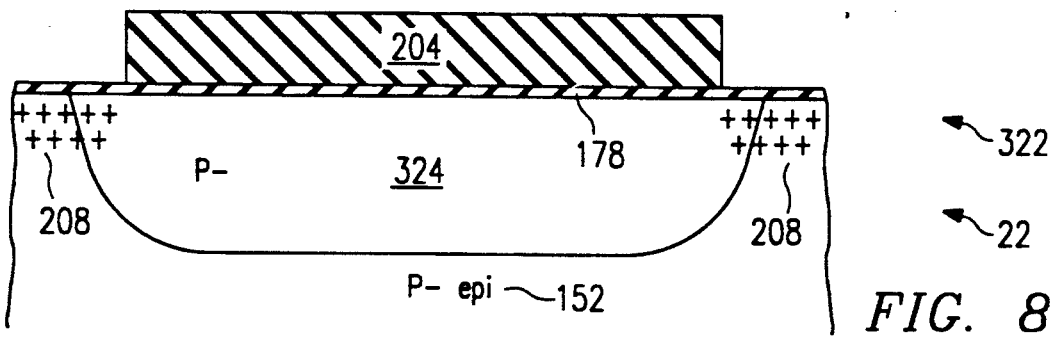
Figure 8E:
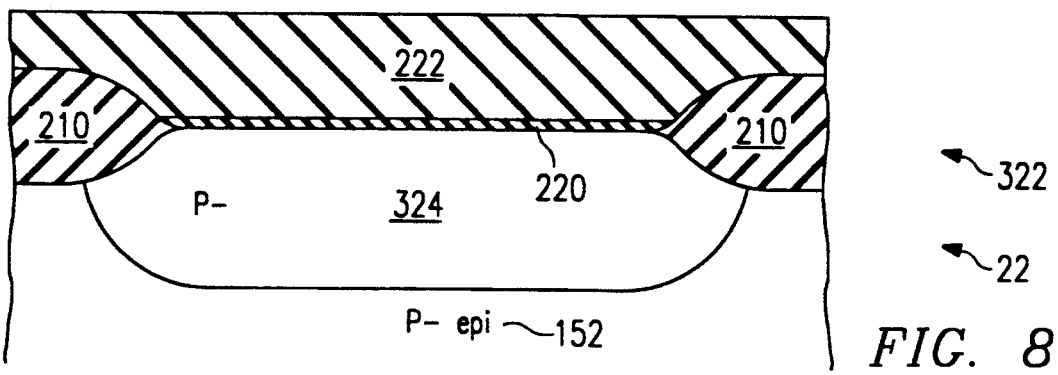

FIGS. 8b–8h illustrate successive stages in the fabrication of a low-voltage n-channel field effect transistor 322 with a back gate connection. There is no FIG. 8a, as nothing of note occurs in the device area which will become the back-gated transistor 322 at the process stage shown in FIG. 6a. FIG. 8b shows the implantation of a low-voltage p-tank 324 at the same time that p-tank 190 is formed in FIG. 6b. The p-tank 324 is defined by a layer 188 of patterned photoresist. In FIG. 8c, the device area 322 is masked off with a layer 198 of photoresist. In FIG. 8d, the nitride/oxide layer 204 is used by itself as a mask for the implantation of channel stops 208, which are not shown in the remaining Figures in the sequence. Isolating oxide regions 210 are grown in FIG. 8e in those regions left unmasked by nitride/oxide layer 204 (FIG. 8d). A high-voltage gate oxide 218 (not shown in FIG. 8a) is grown on the surface of the tank 324. The tank 324 is masked off from the high-voltage $V_t$ adjust implant, but is patterned to receive the low-voltage $V_t$ adjust implant. Then, after a cleanup step, a gate oxide layer 220 is grown. As shown, the device area 322 is masked off with a photoresist layer 222 during the EEPROM tunnel diode implantation step.

Figure 8F:
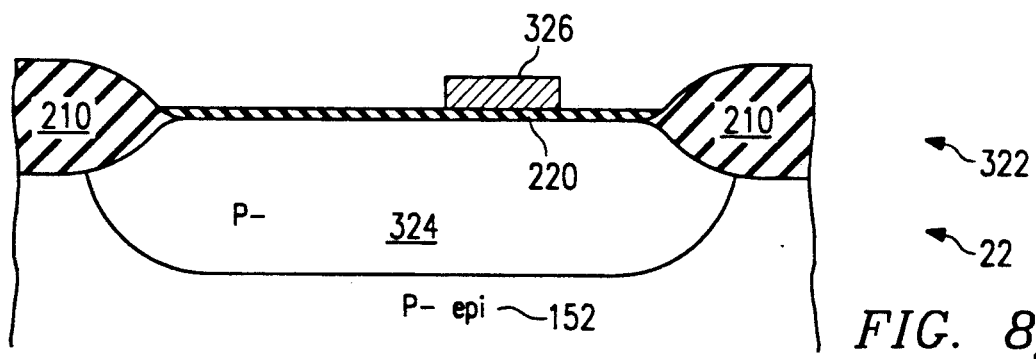
Figure 8G:
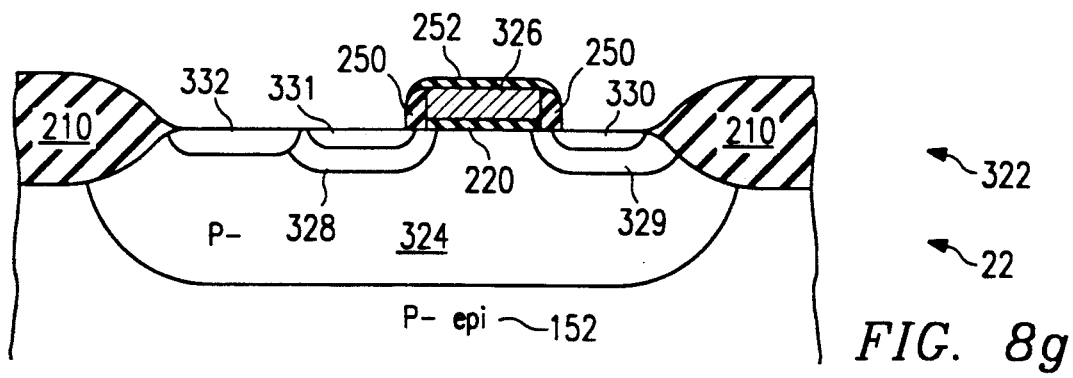

In FIG. 8f, a polycrystalline silicon gate 326 is deposited, doped, patterned and etched. This gate 326 has sidewall oxide regions 250 added to it in FIG. 8g, as well as a cap oxide 252. The gate/sidewall oxide structure 326, 250 is used to partially self-align a pair of (n) implantations: a low density (n−) implant forming source/drain region 328 and source/drain region 329, performed with phosphorus, and a high density implant forming regions 330 and 331, performed with arsenic. At the end of the fabrication process, regions 328 and 329 are diffused to extend underneath the gate 326, while the arsenic defining areas 330 and 331 stays more in place. Finally, a region 332 is patterned and implanted during the (p+) source/drain implanting step with boron to create a back gate connection to the (p−) tank 324.

Figure 8H:
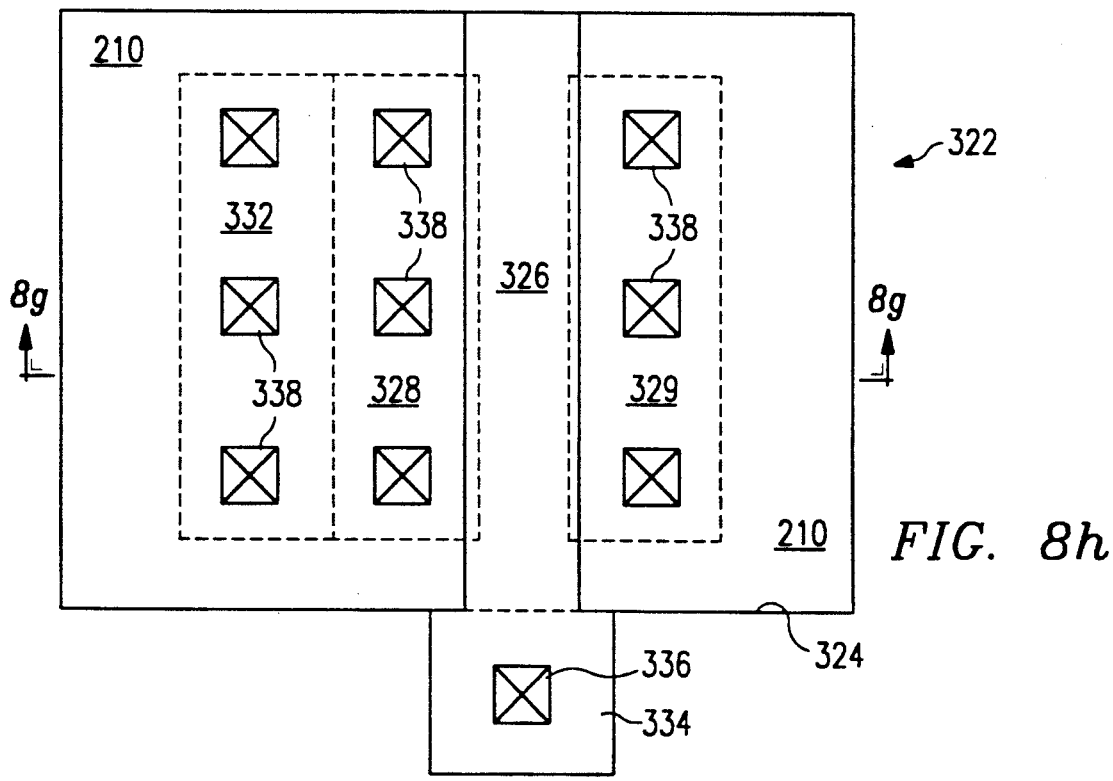
FIG. 8h is a schematic plan view of the transistor shown in FIG. 8g, FIG. 8g being taken substantially along line 8g—8g of FIG. 8h.

FIG. 8h is a schematic plan view of the low-voltage n-channel transistor 322. The p-tank boundary is indicated at 324. Source/drain areas 328 and 329 are defined on two sides (for region 328) or three sides (region 329) by the isolating LOCOS oxide 210. The implantations 328, 329, 330 and 331 (see FIG. 8g for the last two regions, which have been omitted in FIG. 8h for clarity) are self-aligned to the gate 326 and accompanying sidewall oxide regions 250 (not shown in FIG. 8h). The back gate diffusion 332 is self-aligned on its left side to LOCOS oxide 210. The right side is thereof defined using photoresist. The poly 2 gate 326 is extended to a pad 334, and a contact 336 is made to it from the first metal layer (not shown). Conductors of the first metal layer also make connection to the back gate connection 332 and the source/drain regions 328 and 329 through corresponding contacts 338.

Figure 9A:
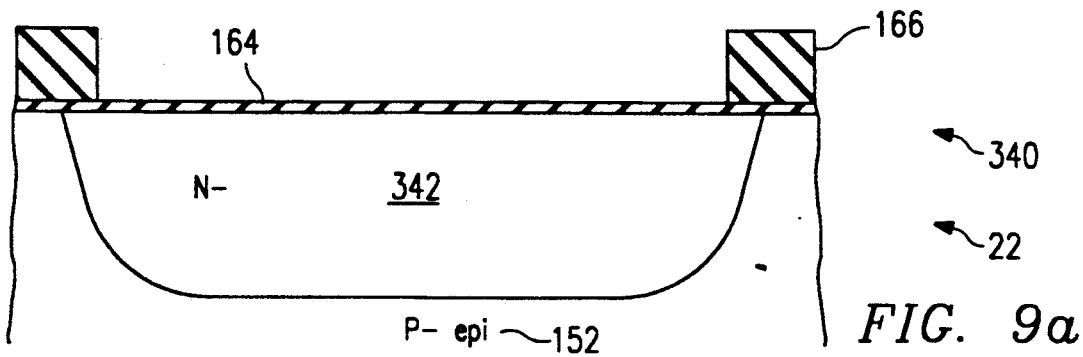
FIGS. 9a-9b and 9d-9g are highly magnified schematic sectional views of successive stages in the fabrication of a high-voltage, back-gated p-channel field effect transistor according to the integrated process described herein.
Figure 9B:
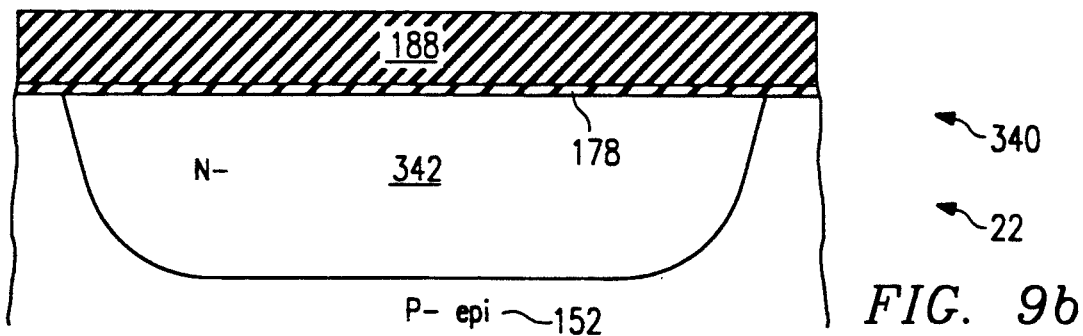

Turning now to FIGS. 9a–9h, the fabrication process of the invention as applied to an 18-volt back-gated NMOS field effect transistor 340 will be described. The transistor 340 is similar to the high-voltage NMOS transistor 141, and both may be used in conjunction with the gating of erase voltages or programming voltages to an EEPROM array. FIG. 9a, corresponding to FIG. 6a in the main sequence, illustrates the formation of a high-voltage n-tank 342 that is formed at the same time that high-voltage n-tanks 168, 169, 170 and 171 are formed. Peripheral portions of the device area 340 are masked over by a nitride layer 166 during the formation of the low-voltage n-tanks in FIG. 6a, and tank 342 is masked by a layer of photoresist (not shown). As shown in part by FIG. 9b, no process steps are performed on the device area 340 during the steps illustrated by FIGS. 6b and 6c. FIG. 9c has therefore been omitted.

Figure 9D:
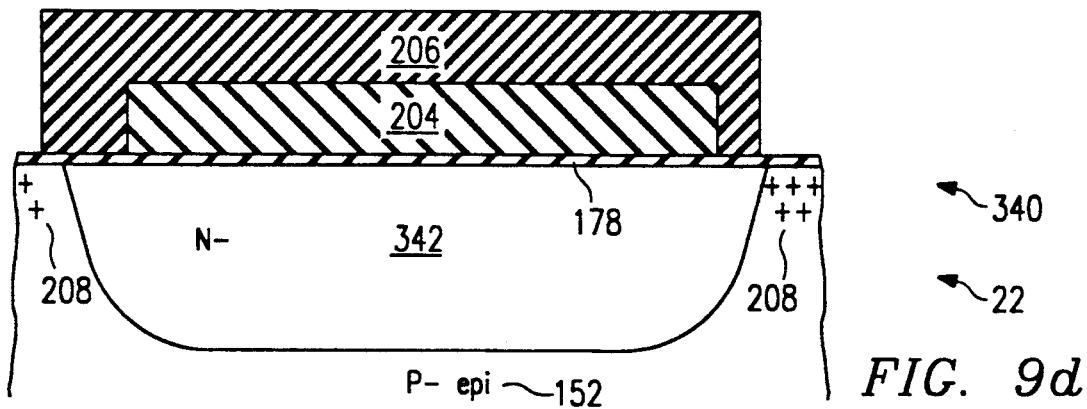
Figure 9E:
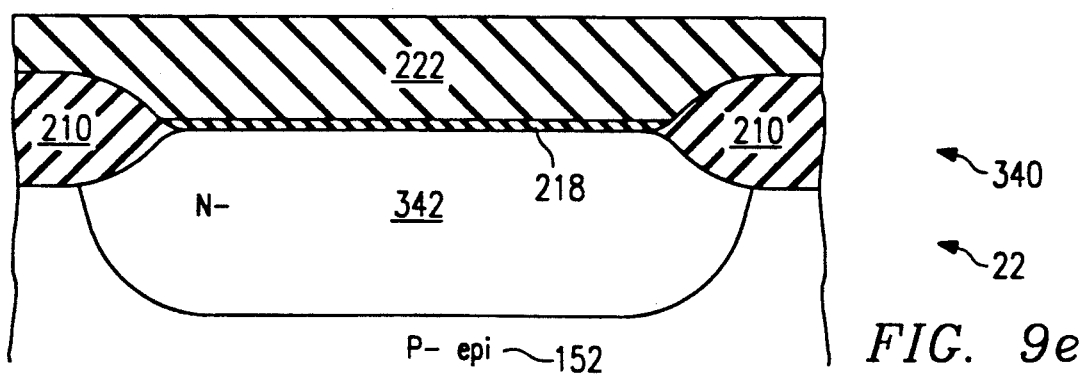

Turning to FIG. 9d, the tank 342 is partially masked by the nitride/oxide layer 204 and the mask is completed by a patterned photoresist layer 206. This photoresist layer 206 is used for the implantation of channel stop regions, indicated at 208 by "+" signs. For the purpose of clarity, the channel stop regions 208 are omitted from the other Figures in this sequence. In FIG. 9e, isolating or moat oxide regions 210 are selectively grown at those portions of the surface of the semiconductor layer left exposed by nitride/oxide layer 204 (see FIG. 9d). The tank 342 is left exposed to receive a high-voltage $V_t$ adjust implant. Thereafter, a high-voltage gate oxide layer 218 is grown to a depth of approximately 500 Angstroms.

Figure 9F:
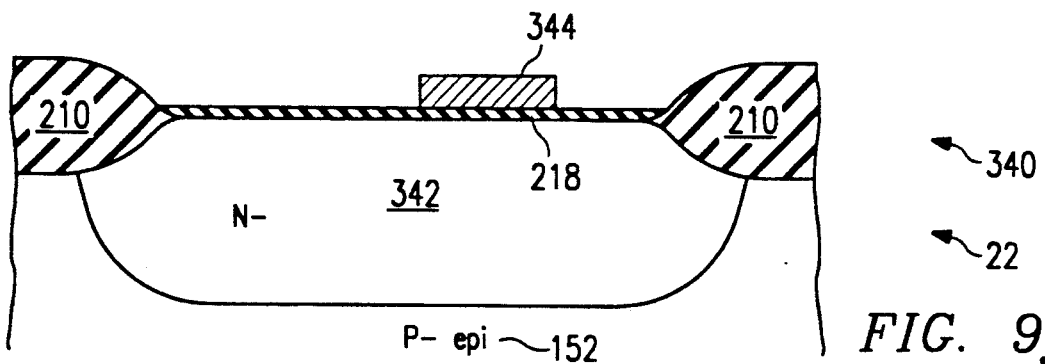
Figure 9G:
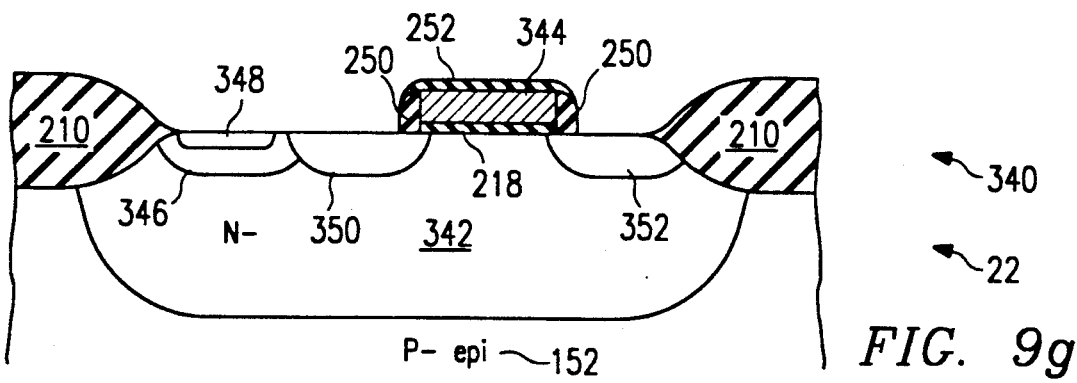

In FIG. 9f, the second polycrystalline silicon layer is deposited, doped, patterned and etched to produce a conductive gate 344. In FIG. 9g, sidewall oxide regions 250 are added, as is cap oxide layer 252. After the formation of the cap oxide 252, a tank connection region 346 is formed by the implantation of phosphorus during the (n−) low density diffusion implantation step. This is performed with phosphorus as a dopant. The same mask is used for an arsenic implant that forms (n+) region 348. Source/drain regions 350 and 352 are formed during the (p+) source/drain implantation step and are self-aligned to gate 344.

Figure 9H:
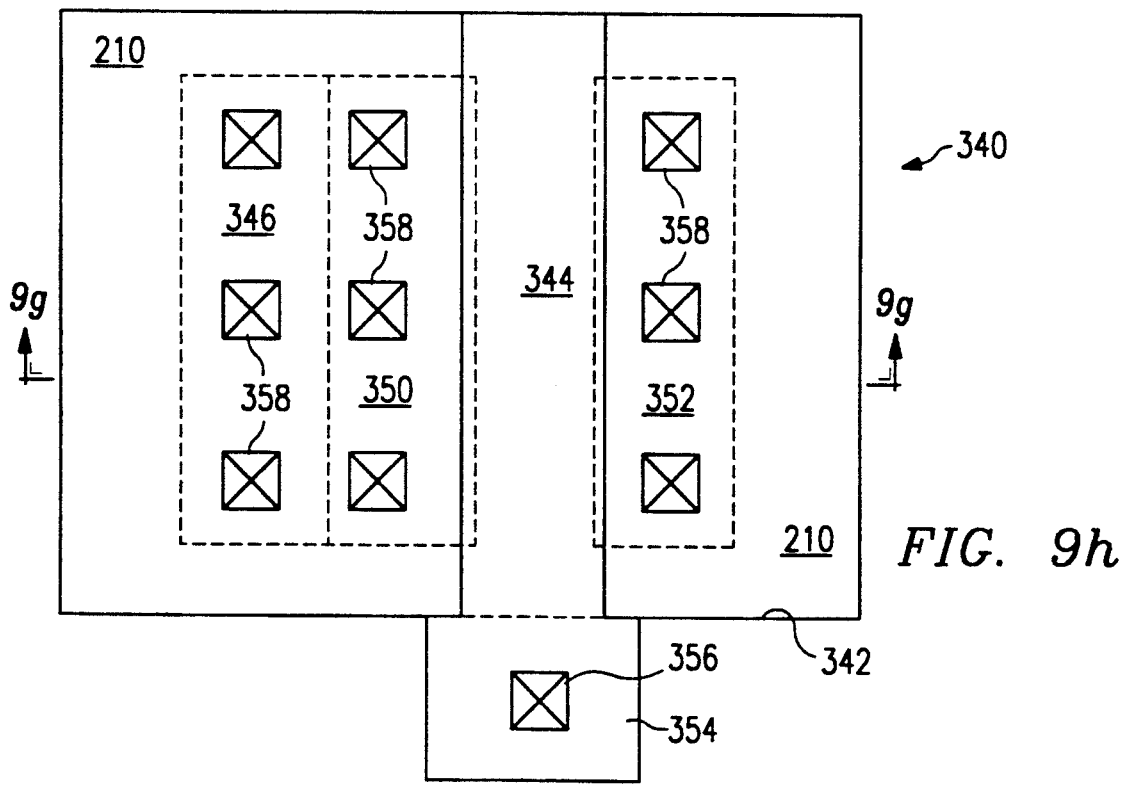
FIG. 9h is a schematic plan view of the transistor shown in FIG. 9g, FIG. 9g being taken substantially along line 9g—9g of FIG. 9h.

In FIG. 9h, a schematic plan view of the device 340 is shown. While the schematic representation of device 340 looks similar to the representations showing in FIGS. 7h and 8h, there are dimensional differences due to the fact that this transistor 340 is meant to handle a $V_{dd}$ of 18 volts across its channel. The n-tank boundary 342 is larger than the tank boundary shown in FIGS. 7h and 8h, and is deeper. The overhang of moat oxide 210 is wider and the gate 344 is also wider. The gate 344 extends to a pad 354, which is connected to a first metal conductor by an appropriate contact 356. As before, the source/drain region 350 is defined by the isolating LOCOS oxide layer 210 on its top and bottom sides, by photoresist on its left side, and by the floating gate 344 and its accompanying sidewall oxide 250 (see FIG. 9g) on its right side. The source/drain region 352 is self-aligned by the edge of the isolating oxide 210 on three of its sides and by the sidewall-oxide gate 344 on its left side. Back gate connection region 346 is defined on three sides by the oxide 210 and by patterned photoresist on its right side. Appropriate contacts 358 are made between respective metal one conductors (not shown) and the regions 346, 350 and 352.

Turning next to FIGS. 10b–10h, successive stages in the fabrication of a back-gated 18 volt NMOS field effect transistor 360 are shown. Field effect transistor 360 is similar to the n-channel FET 142 illustrated in FIGS. 6a–6g. This 18 volt transistor is useful for the gating of high-voltages to the EEPROM array of EEPROM cells such as may be composed of cells 143 (see FIG. 6g).

Figure 10B:
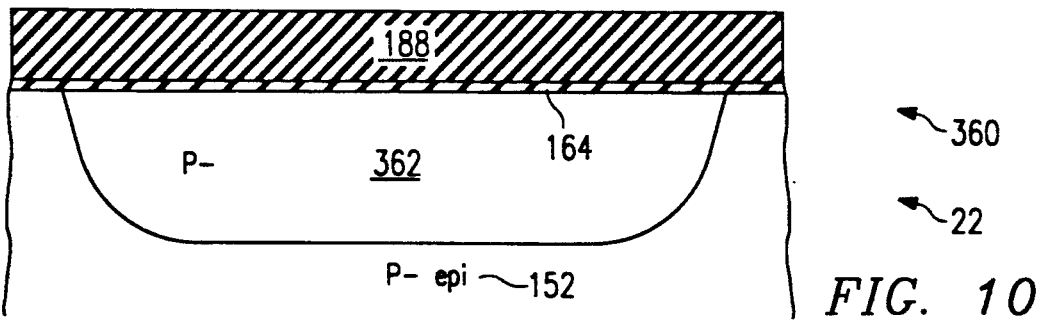
FIGS. 10b-10g are highly magnified schematic sectional views of successive stages in the fabrication of a high-voltage, back-gated n-channel field effect transistor according to the integrated process described herein.
Figure 10C:
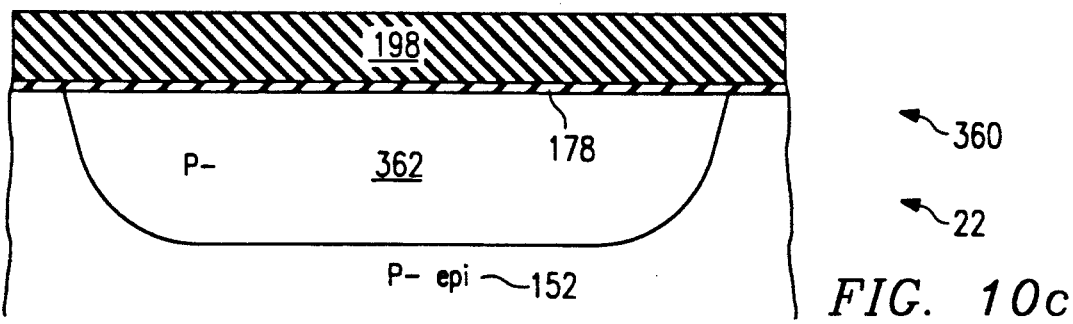
Figure 10D:
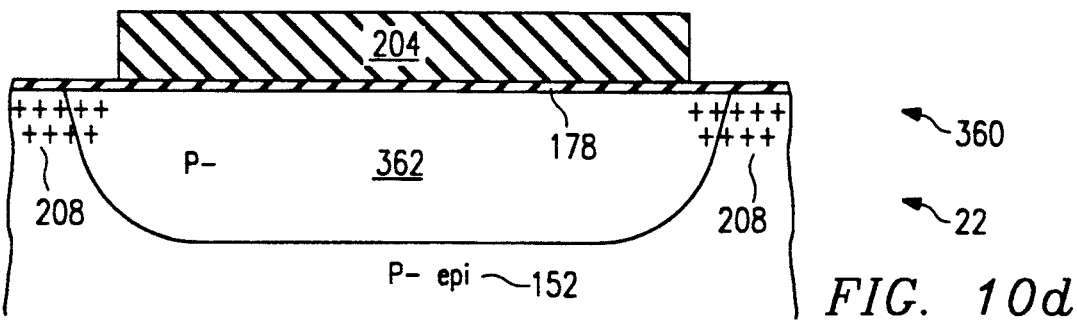
Figure 10E:
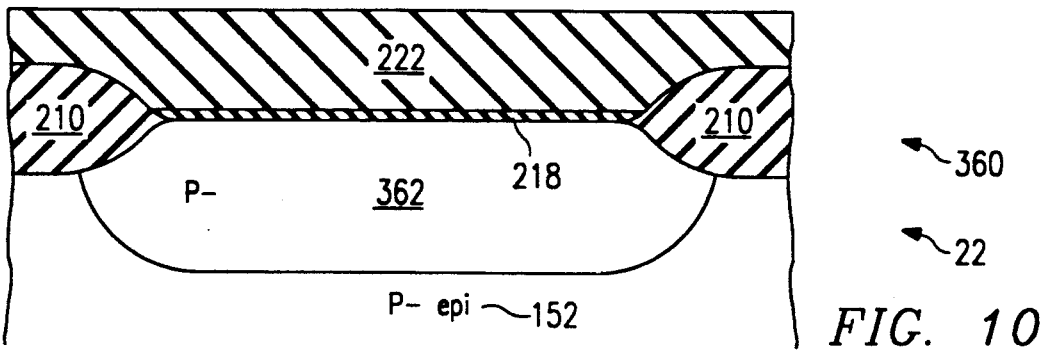

There is no FIG. 10a in this sequence, because no tank has yet been formed in the device area 360 at the time that FIG. 6a represents. In FIG. 10b, a high-voltage p-tank 362 has been formed. An oxide layer 164 and a photoresist layer 188 mask off the tank 362 at this time in order to perform the implantation of low-voltage p-tanks elsewhere on the chip 22. In FIG. 10c, the high-voltage p-tank 362 remains masked off by the oxide layer 178 and another photoresist layer 198 so that a deep (p+) back gate region 202 can be implanted for the vertical DMOS transistor 147 (see FIG. 6c). In FIG. 10d, the patterned and etched nitride/oxide layer 204 is used by itself to define the limits of (p+) channel stop regions 208, represented in FIG. 10d by pluses, but not represented elsewhere in this drawing sequence. Isolating oxide regions 210 are grown in FIG. 10e on those areas of the epitaxial layer surface that are left uncovered by the nitride/oxide layer 204 (see FIG. 10d). After the stripping of the nitride/oxide layer 204, a high-voltage $V_t$ adjust implant is performed on the tank 362, followed by the growth of a 500 Angstrom high-voltage gate oxide layer 218. The photoresist layer 222 thereafter applied masks off the entire chip surface with the exception of a tunnel diode implantation region 224 (see FIG. 6e).

Figure 10F:
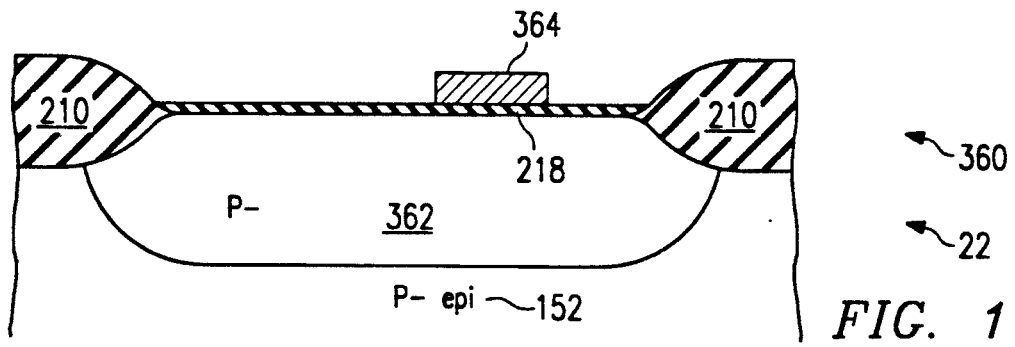
Figure 10G:
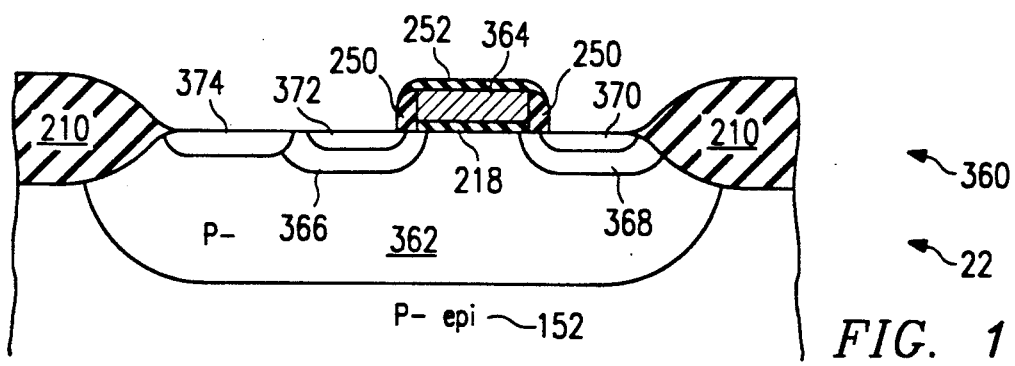

The second-level poly layer is deposited, doped, patterned and etched to create a conductive gate 364 in FIG. 10f. In FIG. 10g, sidewall oxide regions 250 and a cap oxide layer 252 are added to the gate 364. Then, a relatively light concentration of phosphorus is implanted to form (n−) regions 366 and 368 which laterally diffuse underneath the gate oxide 364 upon the subsequent application of an anneal. An arsenic implant is used to create (n+) regions 370 and 372, using the same mask as was used for (n−) implants 366 and 368. Finally, during the implantation of the (p+) sources and drains, a p-tank contact region 374 is implanted, as partially defined using photoresist and as partially self-aligned to the edge of the isolating oxide 210.

Figure 10H:
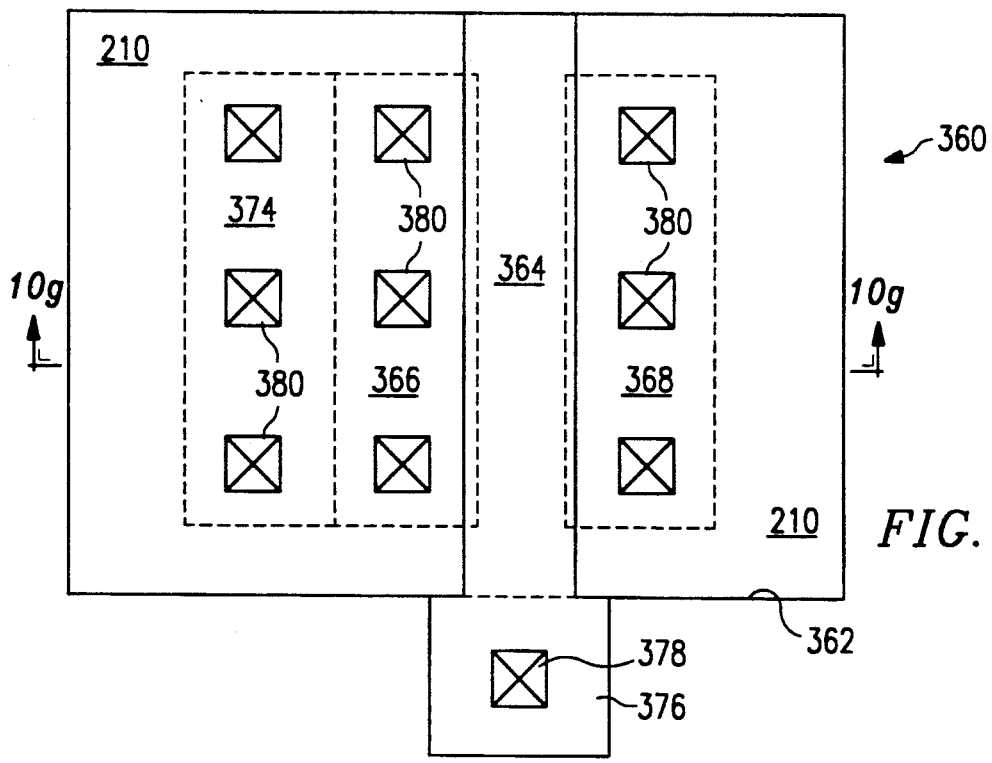
FIG. 10h is a schematic plan view of the transistor shown in FIG. 10g, FIG. 10g being taken substantially along line 10g—10g of FIG. 10h.

In the plan view schematically shown in FIG. 10h, the lateral limits of the p-tank 362 are indicated by a solid rectangle. The field oxide 210 provides a border that is relatively wider than the lower voltage devices. Likewise, the poly gate 364 is wider in order to define a channel wide enough to handle a large voltage and to prevent punch-through between the source/drain regions 366 and 368. The source/drain region 368 is defined on three sides by the moat oxide 210 and on a remaining side by gate 364. The source/drain region 366 is defined on its top and bottom sides by the moat oxide 210, on its right side by the gate 364 and its left side by patterned photoresist. The back gate connection region 374 is defined on three sides by the isolating oxide 210 and on its right side by patterned photoresist. Suitable contacts 380 are made to corresponding metal 1 lines (not shown) from the back gate connection region 374, the source/drain regions 366 and the source/drain region 368.

Turning next to FIGS. 11a–11g, successive steps in the fabrication of a lateral diffused source/drain n-channel "metal" oxide semiconductor (LDMOS) field effect transistor 382 are illustrated, as these stages are integrated into the process illustrated herein. The lateral DMOS transistor 382 is first provided a high-voltage n-tank 384 which is formed at the same time as the high-voltage n-tank 170 in FIG. 6a. The n-tank 384 is masked by an oxide layer 178, and the peripheral portions of device area are covered by a nitride layer 166, during the time that the low-voltage n-tanks are implanted (see FIG. 6a). Photoresist (not shown) covers the central tank area 384 at this time. Proceeding to FIG. 11b, a layer 188 of photoresist is patterned and a low-voltage p-tank 386 is implanted at the time that the other low-voltage p-tanks 190–196 (see FIG. 6b) are implanted. Then, the layer 188 of photoresist is stripped and a deep (p+) diffusion 388 is defined by a patterned layer of photoresist 198 and implanted as shown in FIG.

Figure 11A:
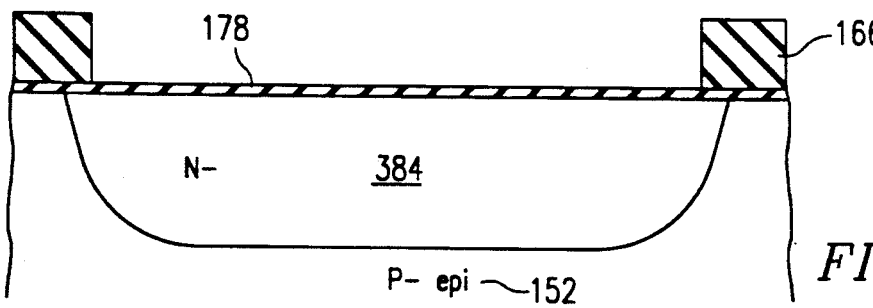
FIGS. 11a-11g are highly magnified schematic sectional views of successive stages in the fabrication of a lateral diffused MOS (LDMOS) n-channel transistor fabricated according to the integrated process described herein.
Figure 11B:
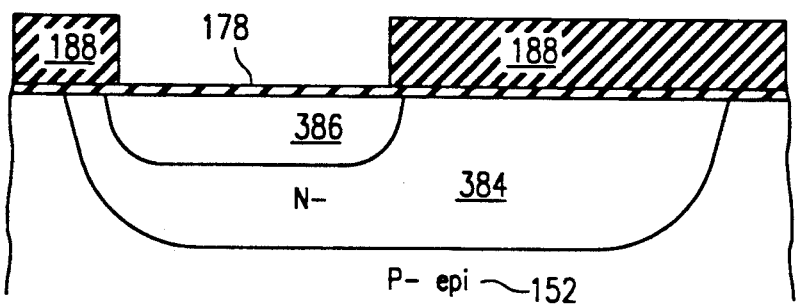
Figure 11C:
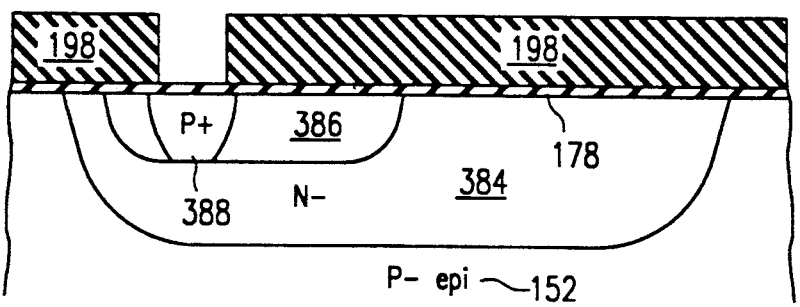
Figure 11D:
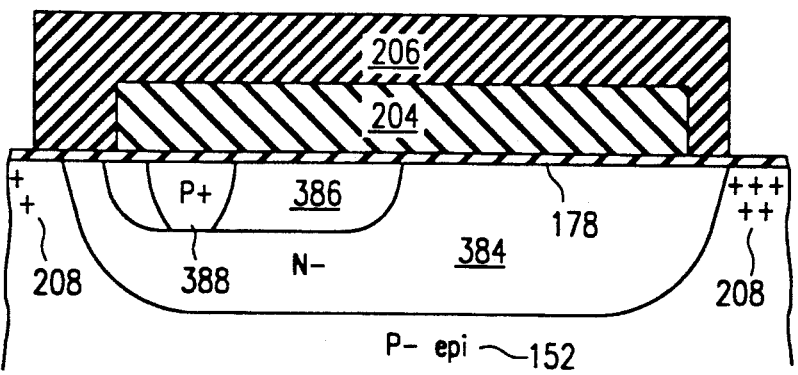
Figure 11E:
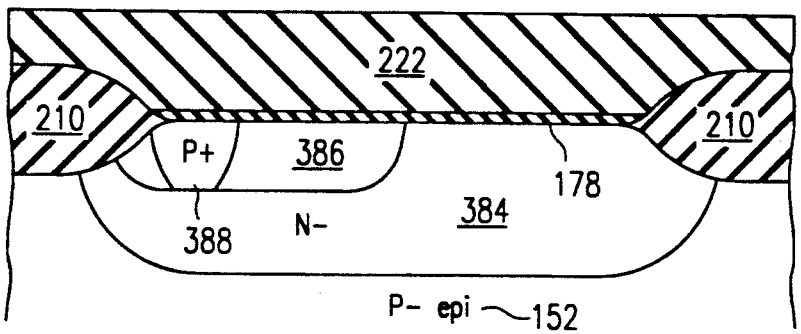

11c. In FIG. 11d, a layer 204 of nitride and oxide in conjunction with a layer 206 of photoresist is used to provide the mask for the channel stops 208. The photoresist layer 206 is then stripped and localized oxide 210 is grown in those areas of the device area 382 not covered by patterned and etched nitride/oxide mask 204 (see FIGS. 11d and 11e). The nitride/oxide layer 204 and the oxide layer 164 are next removed. A high-voltage $V_t$ adjust implant is next implanted into the tank 384. Then, a high-voltage gate oxide layer 218 is grown to a depth of approximately 500 Angstroms. A photoresist layer (not shown) is used to mask off the device 382 at the time that the low-voltage $V_t$ adjusts are implanted, and when the low-voltage gate oxide 220 (see FIG. 6e) is done. A photoresist layer 222 is patterned to define the tunnel diode 224 and is left undisturbed over the device area 382 at the time this occurs.

Figure 11F:
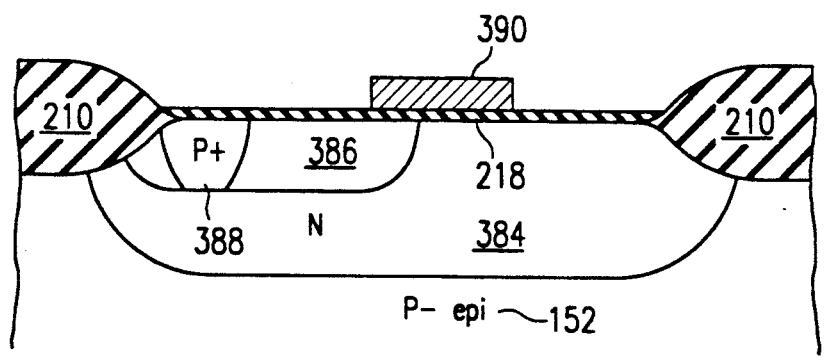
Figure 11G:
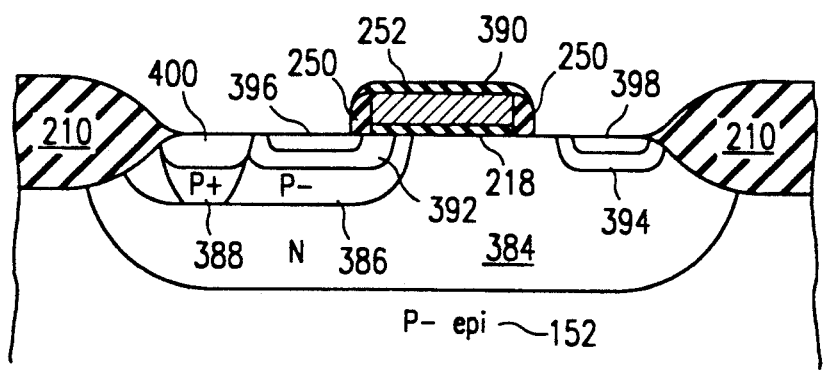

After the tunnel diode implant step, the stage of the process represented by FIG. 11f is reached. FIG. 11f shows how the poly 2 layer is deposited, doped, patterned and etched to produce a gate 390 on the surface of gate oxide layer 218. In FIG. 11g, sidewall oxide regions 250 are formed on the lateral margins of, and a cap oxide 252 is grown on the exposed top of polysilicon gate 390. A layer of photoresist (not shown) is used to define those edges of source/drain implantation regions 392 and 394 that are not defined by the gate 390 or the edges of LOCOS oxide region 210. A lightly doped diffusion using phosphorus is then implanted to produce the (n—) regions 392 and 394. These diffuse laterally and downwardly as shown from the original implant limits during a subsequent anneal. A subsequent arsenic implant is used to create regions 396 and 398 using the same source/drain implant mask.

During the p-type source/drain implant stage, a layer of photoresist (not shown) is patterned to define one edge of the implanted (p+) back gate connection region 400.

Figure 11H:
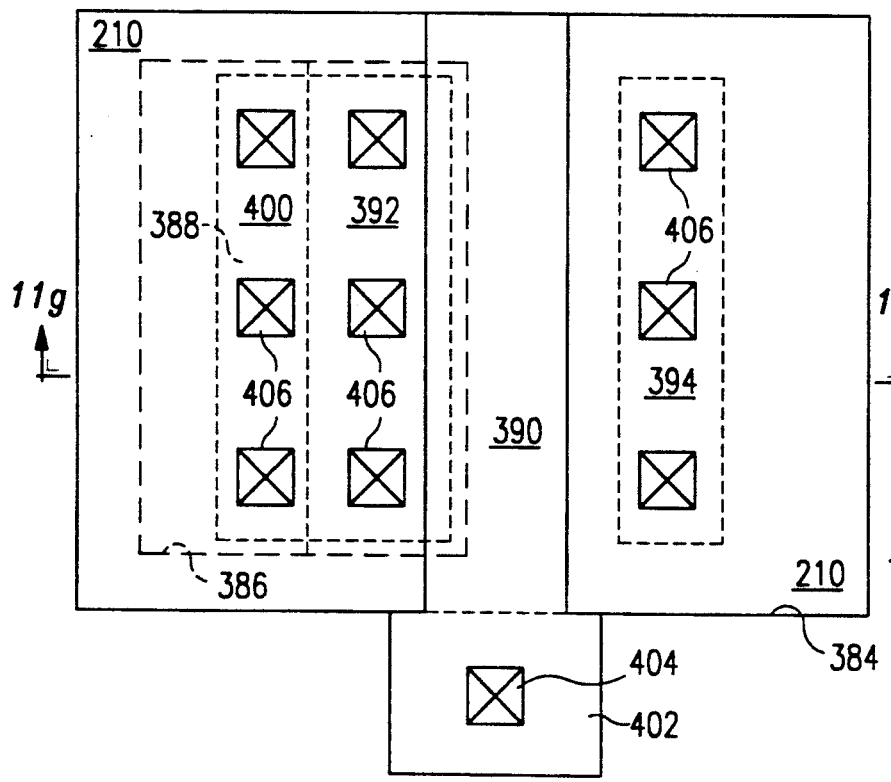
FIG. 11h is a schematic plan view of the LDMOS transistor shown in FIG. 11g, FIG. 11g being taken substantially along line 11g—11g of FIG. 11h.

A schematic plan view of the LDMOS transistor 382 is shown in FIG. 11h. The implantation limits of the n-tank 384 are shown by the solid line rectangle. The p-tank 386 implantation mask limit is shown by a dotted line. This implantation mask 386 extends under the edge of the LOCOS oxide 210 that provides a moat for the active device area. The deep (p+) diffusion region 388 occupies a left portion of the implantation area for the p-tank 386. The source/drain region 392 is defined on its left side by a patterned layer of photoresist (not shown), on its top and bottom sides by the moat oxide 210 and on its right side by the poly 2 gate 390, as accompanied by the sidewall oxide regions 250 (not shown in FIG. 11h). The source/drain region 394 is defined by the moat oxide 210 on three sides, and on its left side by a patterned layer of photoresist. The poly gate 390 is extended to a pad 402, and a contact 404 is made to the pad 402 from a first metal (not shown). Appropriate contacts 406 are made from regions 400, 392 and 394 to respective first level metal lines (not shown).

Figure 12A:
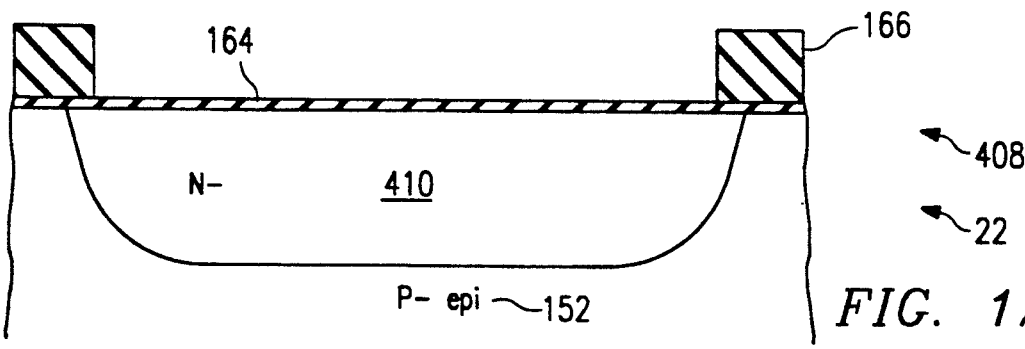
FIGS. 12a-12b, 12d and 12f-12g are highly magnified schematic sectional views of successive stages in the fabrication of a vertical npn bipolar transistor according to the integrated process described herein.
Figure 12B:
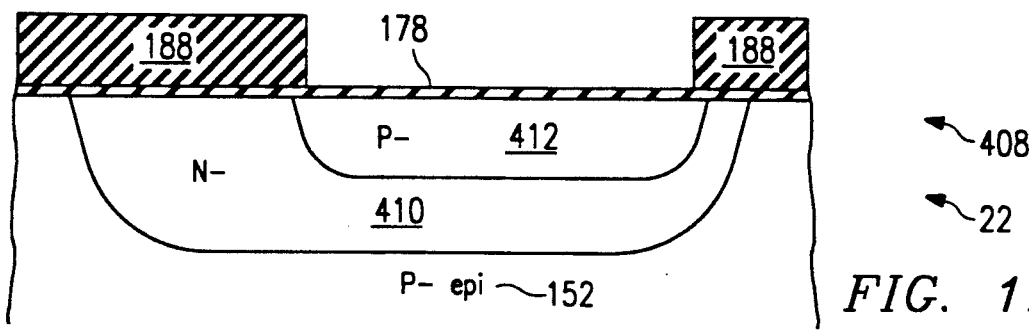

Turning next to FIGS. 12a–12g, successive highly magnified sectional views are shown of fabrication stages of a vertical npn bipolar transistor 408 that is fabricated during the integrated process described herein. In FIG. 12a, an (n—) tank 410 is shown that is formed at the time of the other high-voltage n-tanks (see FIG. 6a). At the beginning of the time represented by FIG. 12a, an oxide layer 164 and a photoresist layer (not shown) mask the n-tank region 410. Nitride layer 166 has been patterned and etched to allow the implant of tank 410. The nitride layer 166 is at this point patterned and etched, for a low-voltage n-tank implantation step (see FIG. 5a); a photoresist layer (not shown) masks off device area 408 at this time. Turning to FIG. 12b, a photoresist layer 188 is deposited and patterned for the implantation of a (p—) tank 412 which is performed simultaneously with the implantation of the low-voltage p-tanks 190, 192, 194 and 196. The high-voltage n-tank 410 forms the collector of the npn transistor 408, while p-tank 412 forms its base.

Figure 12D:
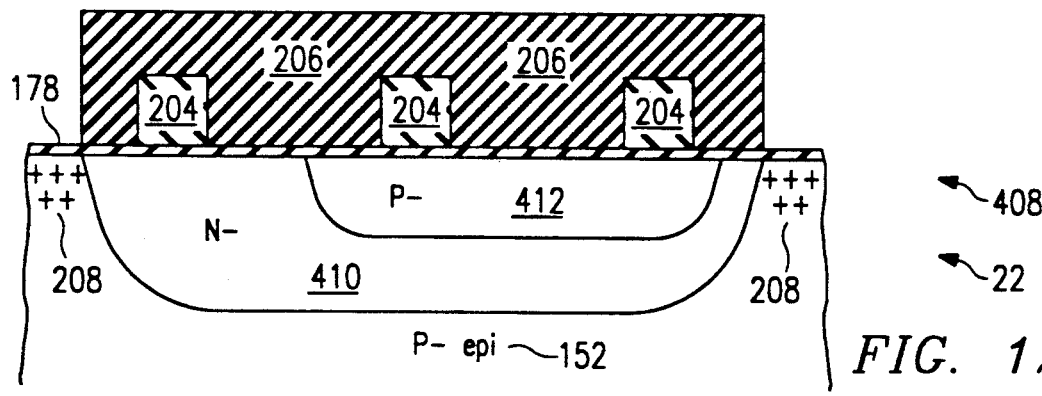
Figure 12F:
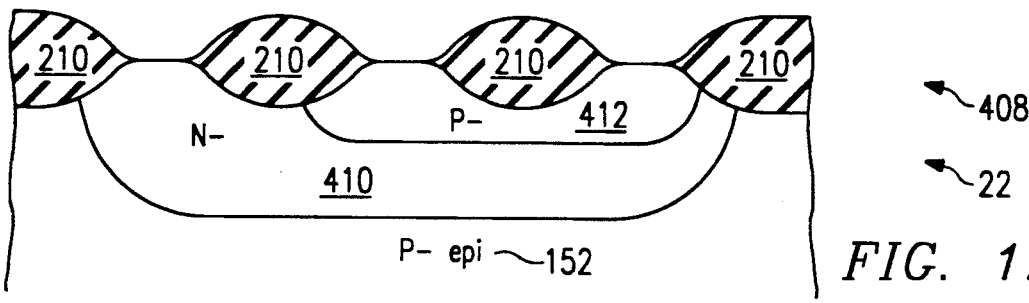
Figure 12G:
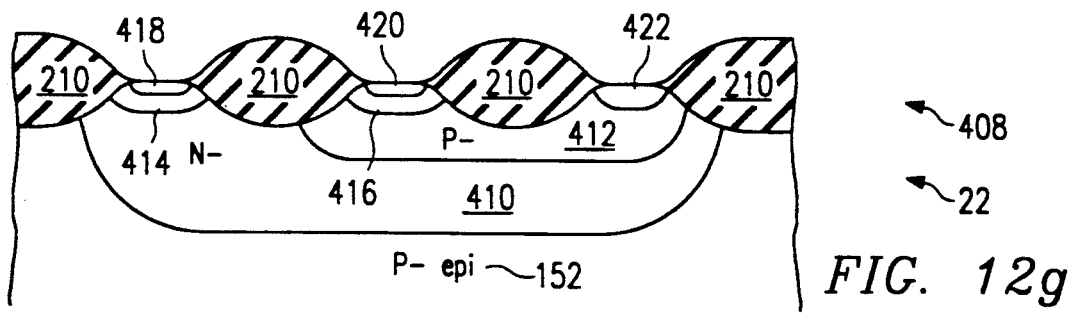

Next in this sequence is FIG. 12d, there being no FIG. 12c because nothing of interest happens to this device 408 during the time of the integrated fabrication process that FIG. 6c represents. A nitride/oxide layer 204 and a photoresist layer 206 are used to mask off the n-tank 410 so that a channel stop implantation can be implanted, forming channel stops 208 as indicated by the pluses in FIG. 11d but not elsewhere in this sequence of Figures. The next fabrication step affecting transistor 408 is done at the time represented by FIG. 6f, and is shown in FIG. 12f. At this time, localized oxidation is used to form LOCOS oxide regions 210 on those surfaces of tanks 410 and 412 left exposed by the nitride/oxide mask 204. Oxide regions 210 are shown used in FIG. 12g for the self-alignment of base, emitter and collector contact regions. During the LDD (n—) source/drain implantation occurring elsewhere on chip 22, collector contact region 414 and emitter 416 are implanted using phosphorus. This is immediately followed by an implant of arsenic to create (n+) regions 418 and 420. Next, during the p-type source/drain implantation stage occurring elsewhere in chip 22, region 422 is implanted using boron.

Figure 12H:
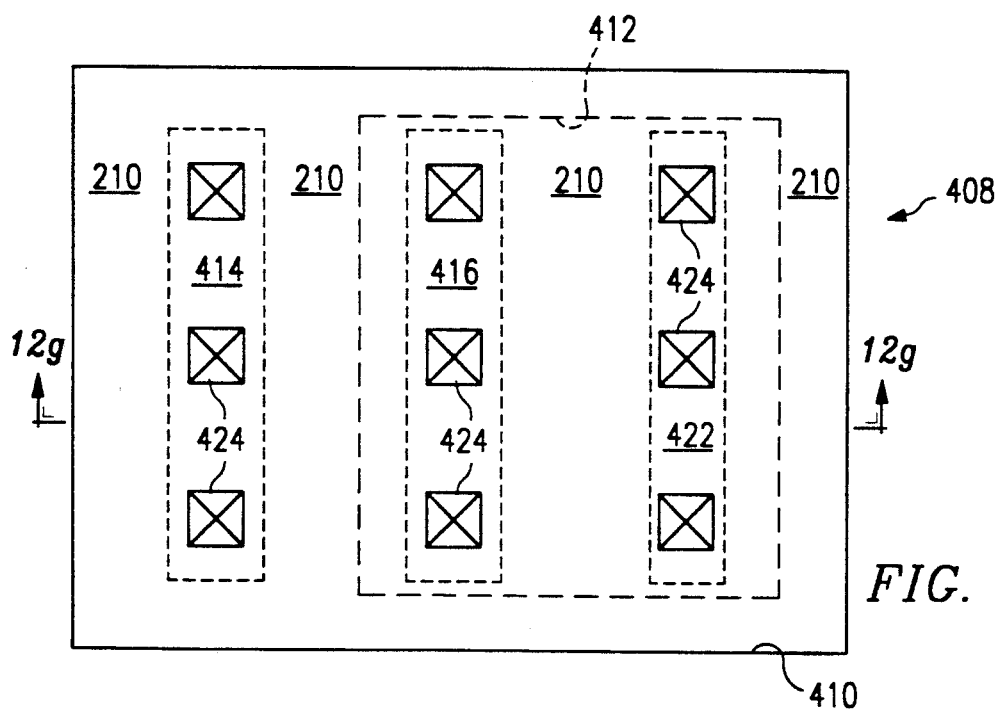
FIG. 12h is a schematic plan view of the vertical npn bipolar transistor shown in FIG. 12g, FIG. 12g being taken substantially along line 12g—12g of FIG. 12h.

A schematic plan view of the vertical npn bipolar transistor 408 is shown in FIG. 12h. The high-voltage n-tank mask limit is shown by a dark rectangular line 410, and the corresponding limit of the p-tank 412 is shown by a dashed line. Collector contact region 414, emitter 416 and base contact region 422 are defined by the lateral edges of LOCOS oxide 210. Appropriate contacts 424 are made respectively to the collector contact region 414, the emitter 416 and the base 422 to connect to respective metal one conductors (not shown).

FIGS. 13a and 13c–13g are highly magnified schematic sectional views of a high-voltage p-channel field effect transistor fabricated according to the integrated process of the invention. This transistor, indicated generally at 426, has reduced gate oxide stress, as will be described in more detail below. There is no FIG. 13b, as nothing of interest happens in this area of the chip 22 during the corresponding stage of the fabrication process as shown by FIG. 6b.

Figure 13A:
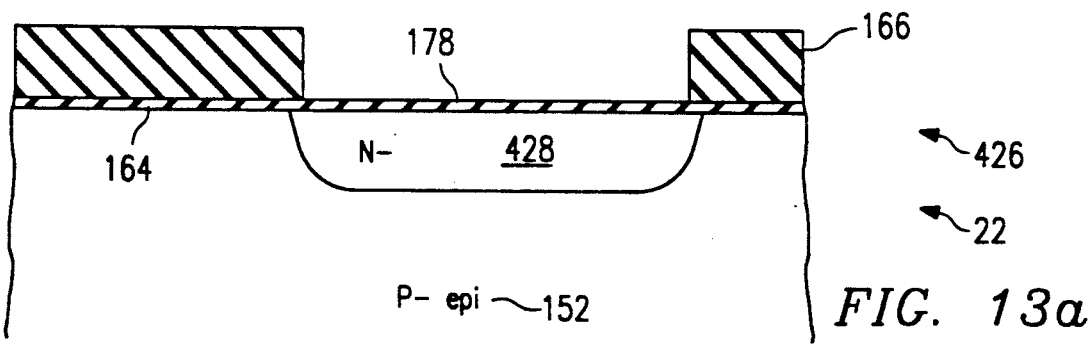
FIGS. 13a and 13c-g are highly magnified schematic sectional views of successive stages in the fabrication of a back-gated extended-drain n-channel field effect transistor with reduced gate oxide stress.
Figure 13C:
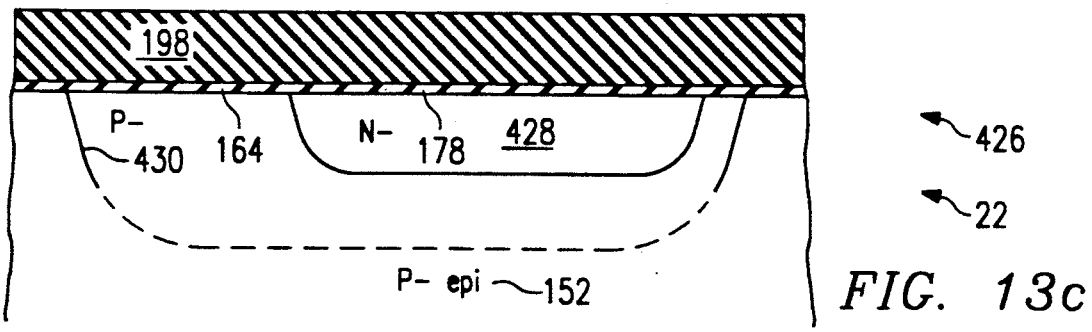

As shown in FIG. 13a, a low-voltage n-tank 428 is made within device area 426 at the same time as, and with the same dopant, as low-voltage n-tanks 175, 176 and 177 as shown in FIG. 6a. By the time the stage represented by FIG. 13c is reached, a high-voltage p-tank 430 has been implanted into device area 426 to surround the n-tank. Since the p-tank 430 is of the same conductivity type as the (p—) epitaxial layer 252 in which it is formed, the boundary of the p-tank 430 deep within the layer 150 is somewhat indeterminate, and is shown by a dotted line. This is also the case because, as in all of the tanks fabricated in the integrated process, the dopant concentration decreases as one moves away from the surface of the epitaxial layer. The depth of the p-tank 430 is somewhat greater than the depth of the n-tank 428.

FIG. 13c shows n-tank 428 and p-tank 430 covered with respective oxide layers 164 and 178, and a layer 198 of photoresist. The layer 198 of photoresist is patterned to define deep (p+) diffusions elsewhere on the chip 22.

Figure 13D:
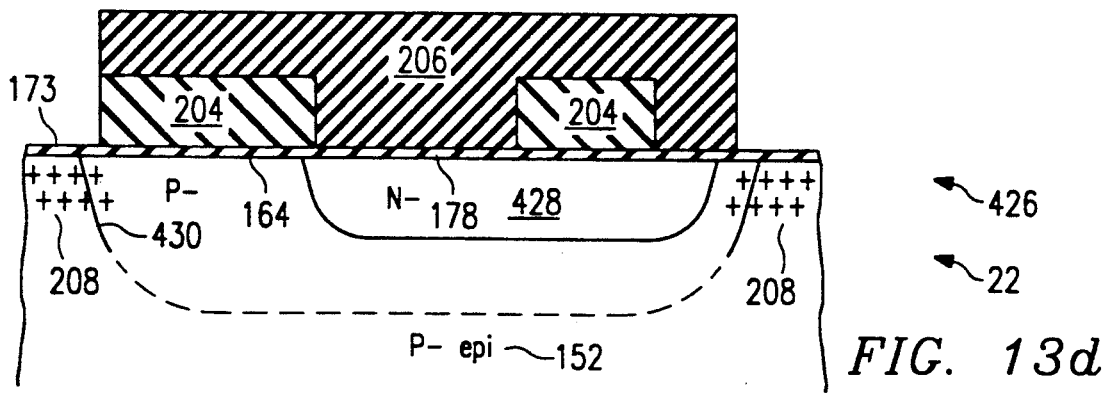
Figure 13E:
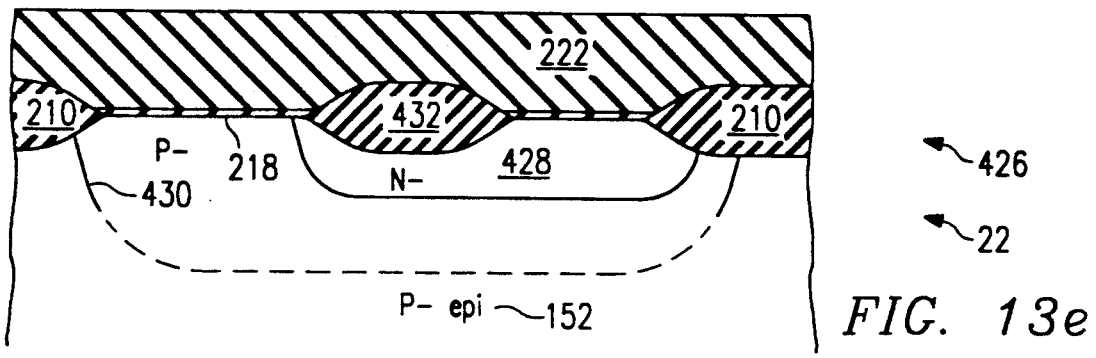

Referring next to FIG. 13d, a patterned and etched nitride/oxide layer 204 in conjunction with a patterned layer 206 of photoresist 206 is used to define the implantation of (p) channel stop areas 208, represented by pluses within FIG. 13d, but not elsewhere in this sequence of Figures. The photoresist layer 206 is then stripped and LOCOS oxide regions 210 and 432 (FIG. 13e) are grown on those areas of the device area 426 which are left exposed by the nitride/oxide layer 204. Region 432 is preferably positioned toward the left end of, but within, Nitride/oxide layer 204 and oxide layers 166 and 178 are next removed. A high-voltage gate oxide layer 218 is grown to a depth of approximately 500 Angstroms on those areas of the tanks 428 and 430 not covered by the localized oxide regions 210 and 432. A high voltage n tank $V_t$ adjust implant is performed following the deposition of the high voltage gate oxide layer 218.

Figure 13F:
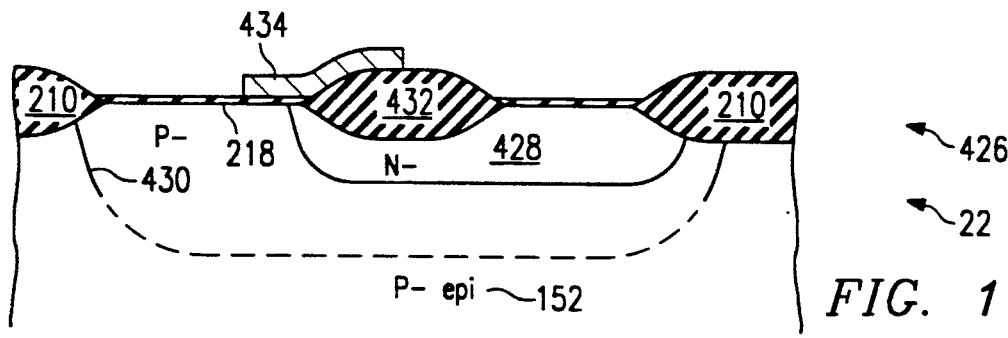

Turning next to FIG. 13f, the poly 2 layer is deposited, doped, patterned and etched to leave a conductive gate 434. The gate 434 is disposed partially on the moat oxide region 432 and partially on gate oxide 218 to the left of oxide region 432.

Figure 13G:
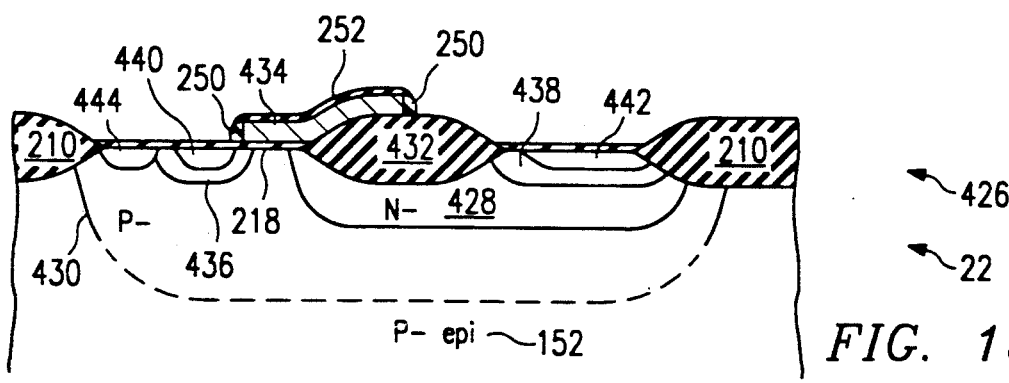

In FIG. 13g, sidewall oxide regions 250 are formed on the lateral sides of the gate 434, and a cap oxide 252 is formed on the upper surface thereof. The low density diffusion (n−) implant is next patterned and phosphorus is implanted and eventually diffused to create source/drain regions 436 and 438. Using the same patterned photoresist mask, regions 440 and 442 are created with an arsenic implant. A (p) type source/drain implantation is used with a patterned layer of photoresist (not shown) to create the (p+) back gate connection region 444.

Figure 13H:
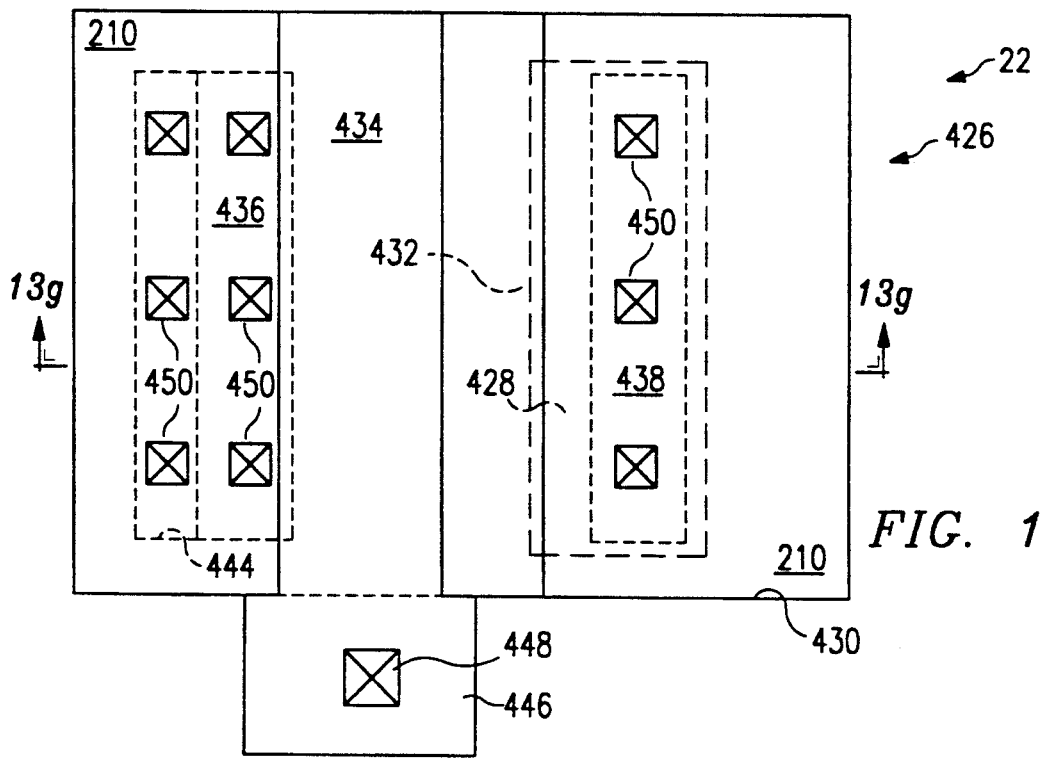
FIG. 13h is a schematic plan view of the transistor shown in FIG. 13g, FIG. 13g being taken substantially along line 13g—13g of FIG. 13h.

FIG. 13h is a schematic plan view of the reduced gate oxide stress p-channel field effect transistor 426. The top, bottom and left sides of the back gate connection region 44 are self-aligned to the lateral edge of the moat oxide 210. The right side of the back gate connection region 444 is defined by a layer of patterned photoresist (not shown), and another layer of patterned photoresist is used to define the left edge of the source/drain region 436. The top and bottom edges of the source/drain region 436 are self-aligned to respective edges of the moat oxide 210, while the right edge thereof is self-aligned to the sidewall oxide 250 (see FIG. 13g) on the nearest side of the gate 434. Source/drain region 438 is completely self-aligned by the lateral edges of the moat oxide regions 210 and 432.

With reference to FIGS. 13g and 13h, the LOCOS oxide region 432 is situated under the drain end of the conductive gate 434 in order to avoid problems with gate oxide breakdown. A large voltage will appear from gate 434 to the (n+) drain region 442, large enough to rupture most normal thin oxides. The inclusion of the oxide region 432 eliminates this problem.

Figure 14G:
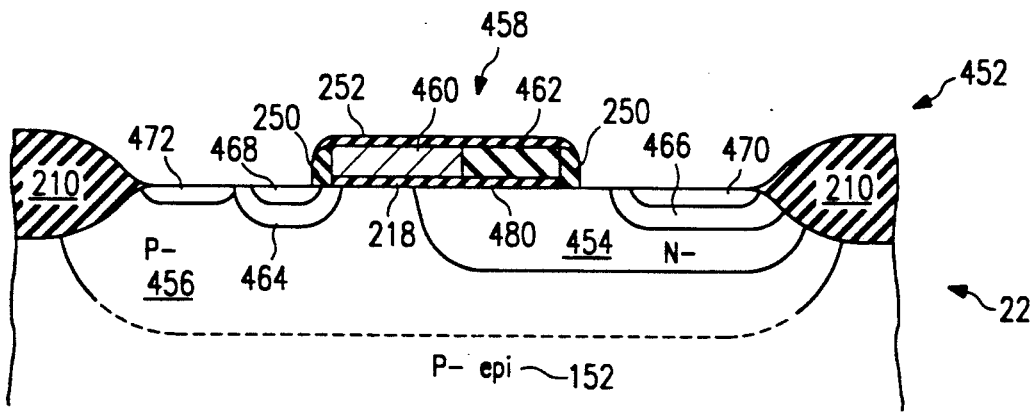
FIG. 14g is a highly magnified schematic sectional view of a back-gated n-channel extended-drain field effect transistor with reduced gate oxide stress fabricated according to the integrated process described herein.
Figure 14H:
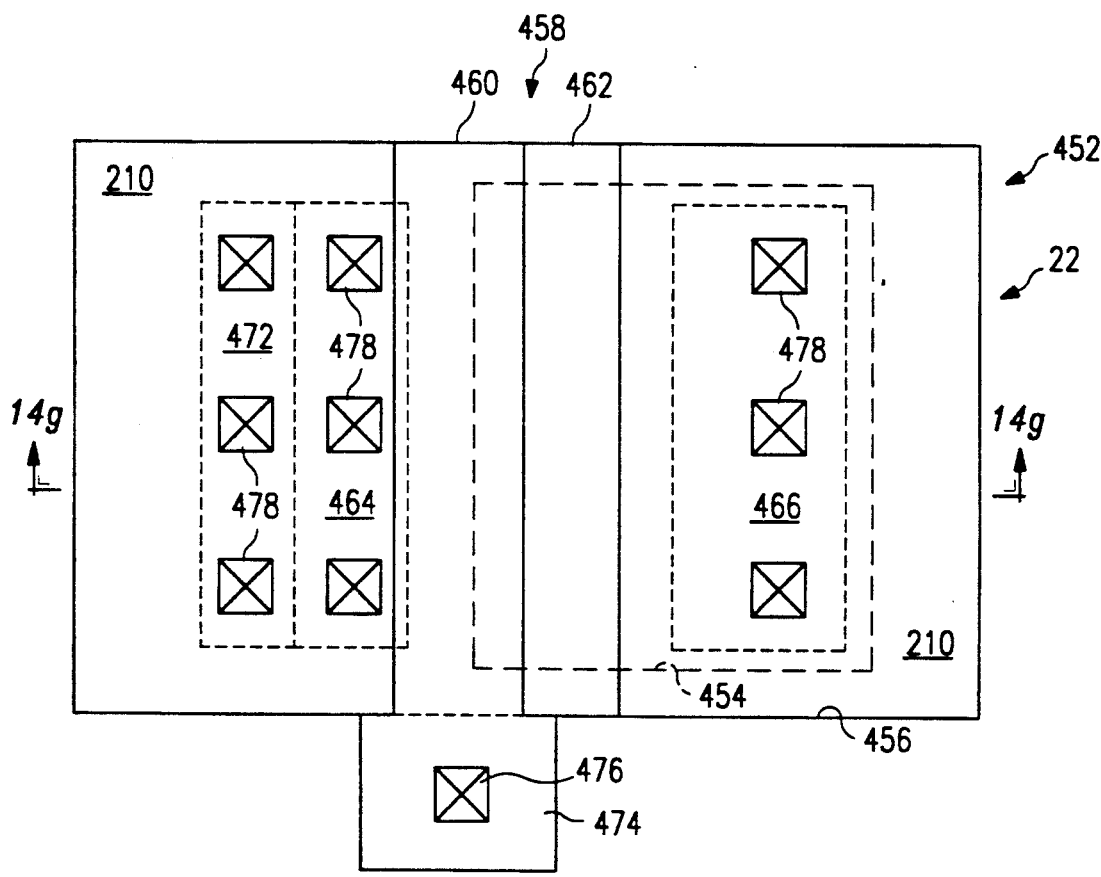
FIG. 14h is a schematic plan view of the field effect transistor shown in FIG. 14g, FIG. 14g being taken substantially along line 14g—14g of FIG. 14h.

Referring next to FIGS. 14g and 14h, an alternative embodiment of a high-voltage power field effect transistor having reduced gate insulator stress is illustrated. The process steps corresponding to FIGS. 6a–6f have been omitted as being straight forward in view of the steps performed in FIGS. 13a and 13c–g.

In FIG. 14g, a highly magnified sectional view of a largely completed field effect transistor 452 is shown. Like transistor 426 (see FIG. 13g), a low-Voltage n-tank 454 is implanted, followed by a high-voltage p-tank 456. Localized oxide 210 defines a moat for the active device area 452.

After the growth of a high-voltage gate oxide 218 and a $V_t$ adjust implant, the poly 2 layer that will form the gate indicated generally at 458 is deposited. However, instead of a blanket doping of the gate 458, a section 462 thereof is covered with a mask, such as patterned photoresist, such that a section 462 of the gate 458 will not receive any phosphorus dopant. The remaining section 460 of the gate 458 does receive phosphorus during the POCl₃ doping step. The gate 458 is then defined in an etch step.

Another approach to the formation of the gate 458 is to mask it off completely during the POCl₃ poly doping step, and dope the gate 458 instead during the (n+) source/drain implantation stage. Under this alternative embodiment, the (n+) source/drain mask is extended to cover portion 462 of the poly gate 458, while leaving portion 460 exposed to the phosphorus and arsenic dopants. The intrinsic, i.e., undoped portion 462 acts as an insulator.

Either during or after the completion of the gate 458, (n+) source/drain regions 464 and 466 are implanted into the epitaxial layer 152. The mask used to define the step will control the position of the eventual left edge of the source region 464. The drain region 466 can either be self-aligned to the edges of the moat oxide 210 and the sidewall oxide 250, or the drain region 466 can be spaced away from the gate 458 by an appropriate layer of patterned photoresist. FIG. 14g shows the source/drain implantation 466 as spaced away from the gate 458, while the plan view shown in FIG. 14h shows the implantation 466 self-aligned to the gate 458.

The implantations 464 and 466 are performed with phosphorus, whose atoms diffuse by a substantial amount laterally from their initial sites of implantation under subsequent thermal steps. The phosphorus implantations 464 and 466 are followed by arsenic implantations 468 and 470, creating corresponding (n+) regions. The arsenic ions are not nearly as mobile as the phosphorus ions, yielding a graded into (n+) source and drain regions.

A subsequent mask is used to define the (p+) region 472 used for contacting the p-tank 456 as a back gate connection.

FIG. 14h is a plan view of device 452, FIG. 14g being taken substantially along line 14g–14g of FIG. 14h. The moat oxide 210 is used to define the top, bottom and left sides of the back gate connection region 472, the top and bottom sides of the source region 464, and the top, bottom and right sides of the drain region 466. Unlike the corresponding device shown in FIGS. 13g and 13h, there is no thick oxide underneath the gate 458. The doped portion 460 of the gate 458 is extended to a pad 474, where it is contacted from first metal through an appropriate contact 476. Contacts 478 are provided to connect the terminals of transistor 452 to points external to the device.

Returning momentarily to FIG. 14g, since the intrinsic poly gate region 462 acts as an insulator, its potential will change as the gate/drain potential changes. The region 480 of the gate oxide layer 218 can have a high electric field that would normally break down the gate oxide in a normal (doped gate) transistor. However, since the undoped gate portion 462 is only capacitively coupled to the drain 466, and has a high-resistance contact to doped gate portion 460, the voltage experienced at portion 480 can now be lower than the oxide breakdown voltage. The provision of an undoped gate portion 462 in the place of a field oxide region 432 (see FIG. 13g) allows the area used by transistor 452 to be smaller, and thus increases power efficiency per area of the chip 22. Further, since a thin oxide 218 is formed underneath the entirety of the gate 458, the gain or transconductance of the transistor 452 is higher. The transistor 452 is especially useful in an automobile microcontroller as a transistor within the voltage regulator 58 or other microcontroller component exposed directly to 12-volt battery voltage, as it is more able to withstand the 60-volt transients which sometimes are experienced in automotive power supplies.

Figure 15G:
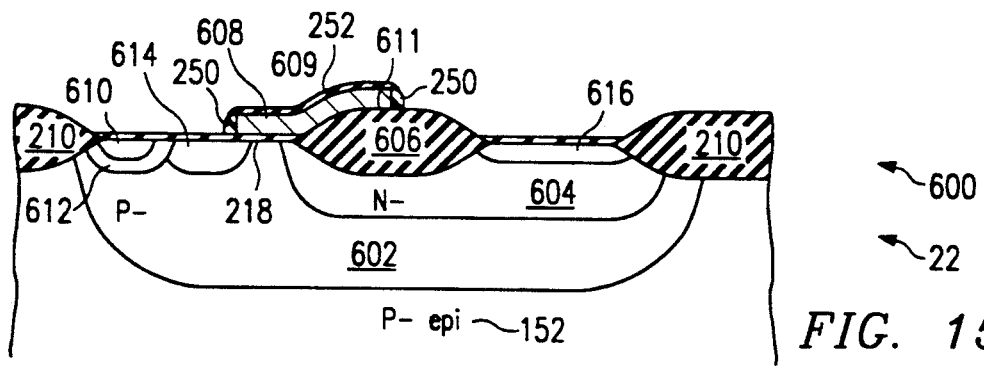
FIG. 15g is a highly magnified schematic sectional view of a back-gated, extended-drain p-channel field effect transistor with reduced gate oxide stress fabricated according to the integrated process described herein.
Figure 15H:
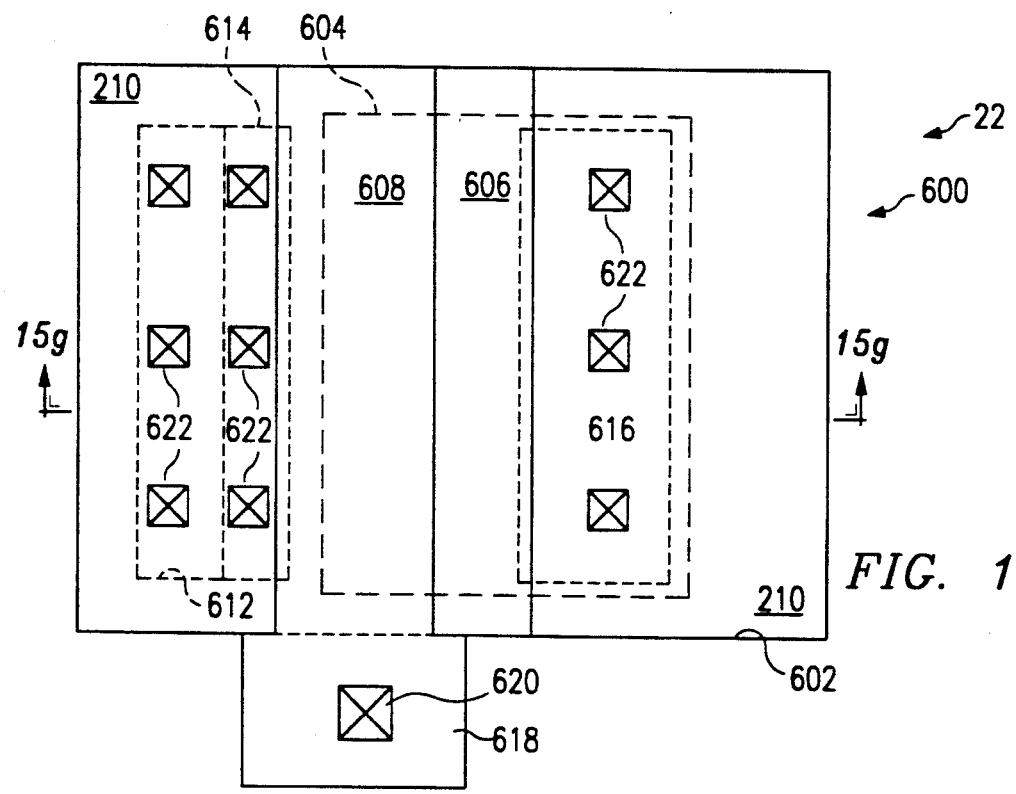
FIG. 15h is a schematic plan view of the field effect transistor shown in FIG. 15g, the section shown in FIG. 15g being taken substantially along line 15g—15g of FIG. 15h.

Referring now to FIGS. 15g and 15h, another insulated field effect transistor indicated generally at 600 is illustrated, transistor 600 being somewhat similar to the one shown in FIGS. 13a and 13c through 13h. The transistor 600 is a p-channel version of the field effect transistor 426. Sectional views corresponding to FIGS. 6a–6f have been omitted as being largely similar to views 13a and 13c–13f. The highly magnified schematic sectional view shown in FIG. 15g corresponds to FIG. 6g, and FIG. 15h is a plan view of the same cell, with FIG. 15g being taken substantially along the line 15g—15g of FIG. 15h. Like the cell 426 illustrated in FIGS. 13a and 13c–13h, the field effect transistor 600 has an increased tolerance for 60 volt transients as are commonly experienced in automobile electric systems, as the gate insulator 218 of this cell 600 experiences reduced stress when subjected to the voltages.

During the time that the high-voltage n-tanks are implanted, high-voltage n-tank 602 is implanted in the device area 600. This is followed in due course by the implantation of a low-voltage p-tank 604 to occupy an area of the high-voltage n-tank 602 somewhat offset from its center. The high-voltage n-tank 602 is subjected to a high-voltage $V_t$ adjust implant (not shown) at the same time that this adjust happens to other high-voltage n-tanks on the chip 22.

Appropriate channel stop regions (not shown) are implanted at the periphery of the n-tank 602. The nitride/oxide mask 204 (see, e.g., FIG. 13d) is patterned and etched so as to leave exposed a central area within tanks 602 and 604. When the localized oxidation step subsequently occurs (see FIGS. 6e, 13e), a relatively thick central oxide region 606 will be grown at the same time that the moat oxide 210 is grown, preferably positioned to the right of the (p−) tank 604 boundary.

A high-voltage gate oxide layer 218 is grown on the remaining, exposed silicon surfaces of tanks 602 and 604. Then, a conductive poly 2 gate 608 is deposited, doped, patterned and etched to leave the conductive gate structure 608 as shown. Conductive gate 608 crosses a lateral margin 609 of the oxide island 606, and extends for a substantial distance on a top face 611 thereof. Another substantial portion of the conductive gate 608 extends across tank 602 beyond the leftmost lateral margin of the (p−) tank 604.

Sidewall oxide 250 and cap oxide 252 are added as previously described for other devices manufactured during the integrated process. During the implantation of the (n+) source/drain regions, a layer of photoresist (not shown) is used to define the right implant limit of a low density (n−) diffusion 612, preferably implanted using phosphorus. This is followed with an (n+) implant 610 of arsenic. Regions 610 and 612 constitute a back gate connection to the (n−) tank 602. In the (p+) source/drain implantation step, a layer of photoresist (not shown) is used to define the leftmost lateral margin of the source region 614. The remaining lateral edges of source region 614 and a drain region 616 are self-aligned to either the leftmost lateral margin of the conductive gate 608 (as augmented by the sidewall oxide 250), or by corresponding lateral margins of the oxide island 606 and the moat oxide 210.

FIG. 15h is a schematic plan view of the field effect transistor 600. The conductive gate 618 extends upwardly on to the top surface of the oxide or stripe 606 (appearing as an island in the section shown substantially along line 15g—15g). The top, bottom and left sides of the (n+) back gate connection 612 are defined by the moat oxide 210. The right margin is defined by a layer of patterned photoresist (not shown). The top and bottom margins of the (p+) source region 614 are defined by the moat oxide 210, its left boundary being defined by the patterned (p+) source/drain diffusion layer of photoresist (not shown), and its rightmost boundary self-aligned to the left margin of the conductive gate 618. The (p+) drain region 616 is self-aligned on all of its margins to the moat oxide 210 and its extension 606. The conductive gate 608 is extended beyond the limits of the n-tank 602 to a pad 618, and an appropriate contact 620 is made to the gate 608 from metal 1 (not shown). Also, contacts 622 are made from various metal 1 conductors to the implanted regions 612, 614 and 616.

While central oxide stripes and non-doped portions of control gates have been illustrated in conjunction with a drain-extended field effect transistor, these techniques for reducing gate oxide stress can be used for any field effect transistor subjected to unusually high voltages.

Figure 16G:
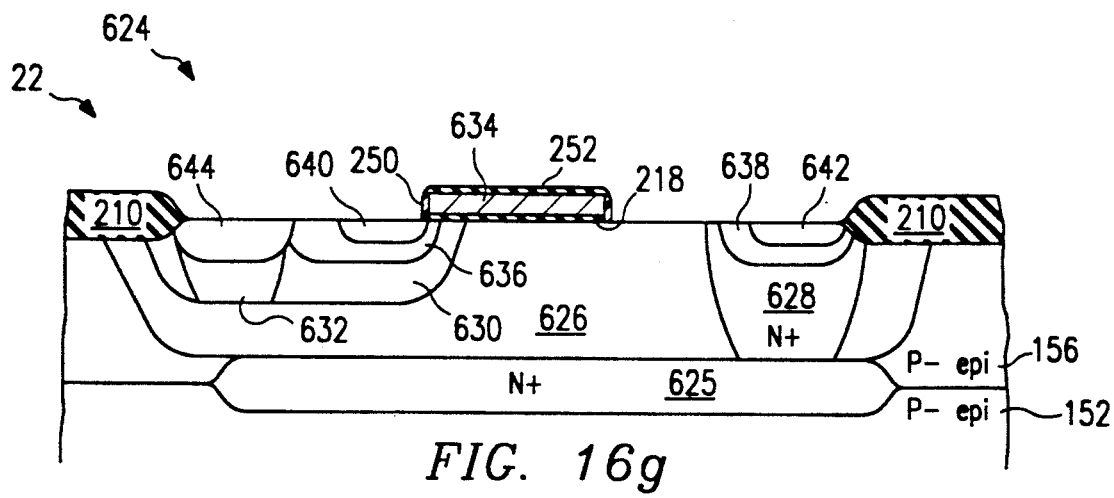
FIG. 16g is a highly magnified schematic sectional view of a back-gated, vertical n-channel field effect transistor fabricated according to the integrated process described herein.
Figure 16H:
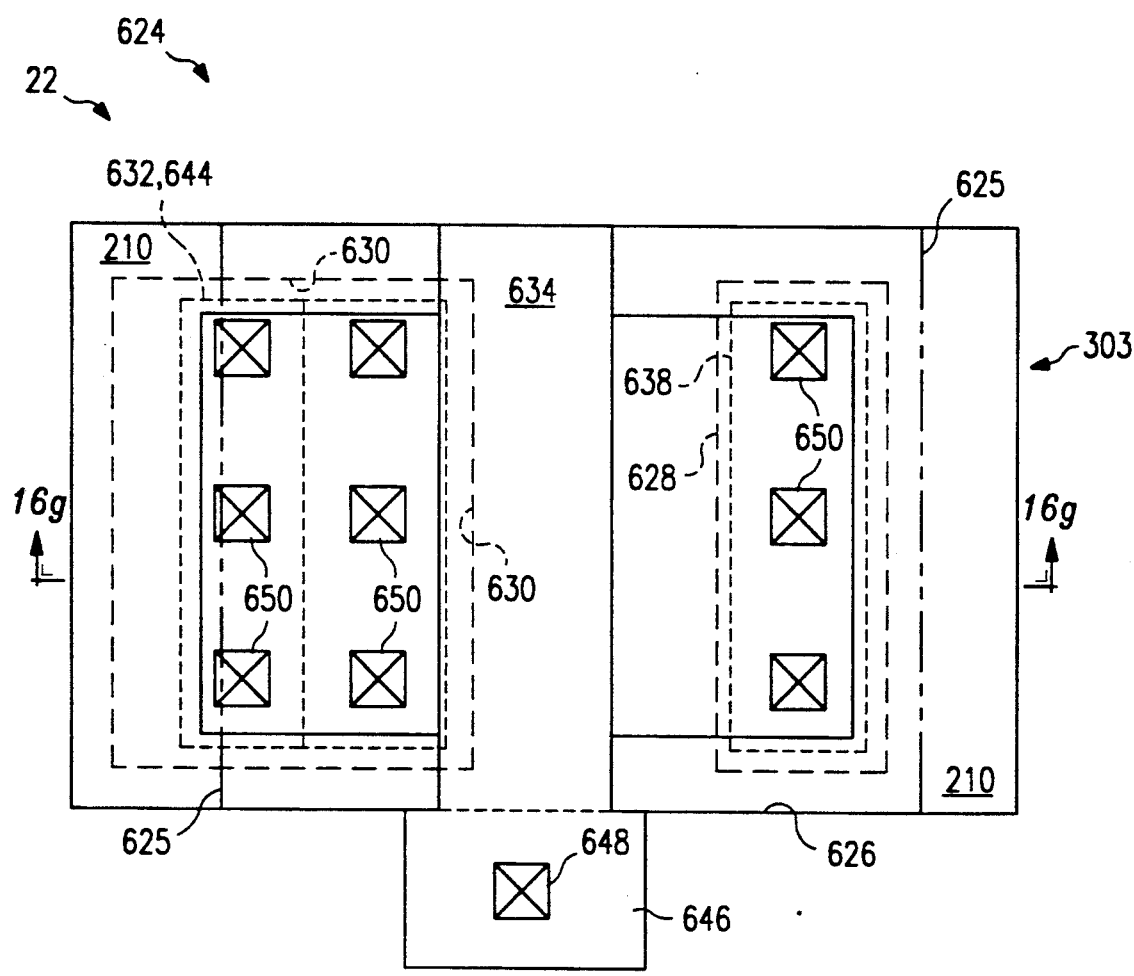
FIG. 16h is a schematic plan view of the vertical field effect transistor shown in FIG. 16g, the sectional view shown in FIG. 16g being taken substantially along line 16g—16g of FIG. 16h.

FIGS. 16g and 16h are highly magnified schematic sectional and plan views of an n-channel vertical DMOS transistor fabricated according to the integrated process described herein. FIGS. 16a–16f have been omitted as largely straightforward in view of similar fabrication steps for other devices described above. FIG. 16g corresponds to FIG. 6g, and also is taken substantially along line 16g—16g of FIG. 16h.

The (n+) buried source/drain region 625 is formed at the same time as the formation of the (n+) buried layer 154 as shown in FIG. 6a. A second (p−) epitaxial layer 156 is formed on top of the (n+) buried layer 625. An (n−) high-voltage n-tank 626 is implanted into the surface of the epitaxial layer 156 for this device 624. Next, a deep (n+) diffusion 628 is made to connect the (n+) buried layer 625 to points exterior to the device 624.

A high-voltage (p−) tank region 630 is defined by patterned photoresist (not shown) and implanted into the epitaxial layer 156 such that it is enclosed by the (p−) tank 626. The (n−) tank 630 occupies a left portion of the surface of the (n−) tank 626. Then, a deep (p+) diffusion 632 is implanted within the (n−) tank 630, preferably in order to extend completely through the (p−) tank 630. The deep (p+) region 632 thereby created will act as a back gate to control the conductance of the channel region formed by the (p−) tank 630.

Localized oxide 210 is grown on the periphery of device 624 to define a moat for the various source/drain regions subsequently implanted and to isolate the transistor 624 from adjacent devices. A gate oxide 218 is grown to a depth of approximately 500 Angstroms to take the high-voltage stresses that will be incident on the transistor 624. After a high voltage $V_t$ adjust implant, a poly 2 layer, used for the control gate for most of the other devices on chip 22, is deposited, doped, patterned and etched to leave a control gate 634 which extends over the right lateral margin of the (n−) tank 630. Substantial portions of the control gate 634 reside over both the (n−) tank 626 and the (p−) tank 630.

After the acquisition of sidewall oxide regions 250 and a cap oxide 252, the control gate 634 is used to partially self-align a low density implant 636, preferably of phosphorus, to create a source region 636. At this same time, an (n−) contact region 638 is formed to contact the deep (n+) region 628.

This is immediately followed by an implantation arsenic using the same patterned mask used to define non-self-aligned edges of the (n−) regions 636 and 638. The second (n+) implant is done with arsenic and creates regions 640 and 642. The phosphorus used to form the low density diffused region 636 diffuses outward to achieve the boundaries as shown. The phosphorus used in defining region 638 does likewise, but in this case, is just an additional portion of dopant to render the deep (n+) contact region more conductive. The rightmost edges of the regions 638 and 642 are self-aligned to the lateral margin of the moat oxide 210.

Following the (n+) source/drain implantations, a (p+) implant is patterned using photoresist and implanted to be partially self-aligned to the left interior margin of the moat oxide 210. This provides a back gate contact region 644.

FIG. 16h is a schematic plan view of the transistor 624, FIG. 16g being taken substantially along line 16g—16g of FIG. 16h. The n-tank diffusion 626 is shown by the enclosing solid rectangular line. The left and right limits of the (n+) buried layers 625 are shown by a dotted and dashed line. The top and bottom limits of the buried layer 625 can be chosen to be the same or substantially the same as the corresponding limits of the high-voltage n-tank 626. The lateral limits of the (p−) tank 630 are entirely within the (n−) high-voltage tank 626, and are represented by a dotted line in FIG. 16h. The deep (n+) diffusion 628 is represented by a long rectangle on the right side of poly 2 gate 634. The left margin of the deep (n+) diffusion 628 may also be the left margin of the (n+) contact region 638, and so this latter region is not represented in FIG. 16h. The deep (p+) region 632 has implantation limits similar to those of the (p+) contact region 644. However, as above explained, the deep (p+) region 632 is implanted prior to the formation of the moat oxide 210, while the contact region 644 is implanted to be self-aligned on its top, bottom and leftmost edges to the lateral edge of the moat oxide 210. Source/drain region 636 is likewise self-aligned on its top and bottom edges to the edge of the moat oxide 210, and on its right side to the edge of the conductive gate 634, as augmented by sidewall oxide 250 (see FIG. 16g). The deep (n+) contact regions 638 and 642 are self-aligned on their top, bottom and right sides to appropriate lateral margins of the moat oxide 210.

The fabrication sequence used to build the transistor 624 allows a high doping concentration of arsenic in the (n+) source/drain region 640. Prior techniques used the conductive gate 634 to self-align the implant of the equivalent (p−) tank 630; however, because the phosphorus making up the region 636 diffuses faster than heavier atoms in the silicon epitaxial layer, devices were difficult to obtain at the (n+) dopant concentrations used herein. Therefore, the (n+) region 640 in prior devices necessarily had to have less dopant in it, and was therefore less conductive, increasing the resistance of the device and decreasing the efficiency of the transistor per amount of chip area occupied thereby.

The conductive gate 634 is extended to a pad 646, and an appropriate contact 648 is made from the pad 646 to a metal one conductor (not shown). Contacts 650 are also made from appropriate metal 1 conductors (not shown) to the (p+) back gate connection region 644, the source/drain region 636 and the deep (n+) contact region 638.

Non-Stack EEPROM Cell

Double-level poly EEPROM cells may also be fabricated within the integrated process described herein. These cells are fabricated after the manner of EEPROM cell 143 in FIG. 6g, as modified for the existence of a second-level of polysilicon, as in the FAMOS EPROM cell 149. Where a control gate poly layer is superimposed over a floating gate poly later, a "stack" etch has been performed in the past to etch the lateral edges of the poly 1 and poly 2 layers, and an intervening nitride/oxide insulating layer, all at once. However, certain fabrication problems have arisen with respect to the conventional "stack" EEPROM cell. This specification will therefore also include a description of the fabrication of a "non-stack" cell that has a much higher reliability as fabricated in the described integrated process for microcontrollers and the like.

Figure 17:
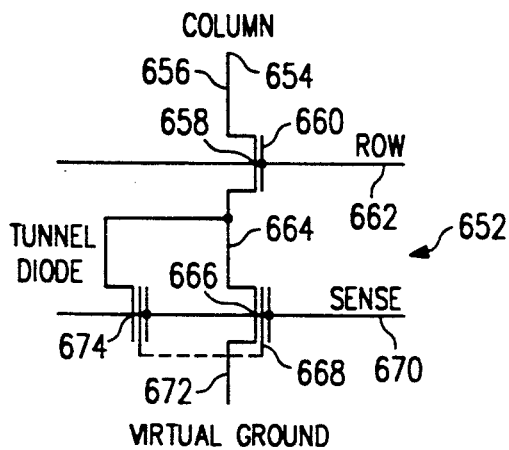
FIG. 17 is a schematic electrical circuit diagram of a double-level poly EEPROM cell fabricated according to a "stack etch" process.

FIG. 17 is a schematic electrical circuit diagram of a "stack" EEPROM cell indicated generally at 652. From a column voltage source 654, a highly doped implanted line 656 is connected to a first terminal of a row transistor 658. A gate 660 of the row transistor is formed by a conductive poly row line 662. A second highly doped conductive implanted line 664 runs from a second terminal region of the row transistor 658 to a current path terminal of a sense transistor 666. The channel of the sense transistor 666 is controlled in part by the state of a first-level poly floating gate 668 and a second-level poly sense line 670. A highly doped implanted region 672 connects a second current path terminal of the sense transistor 666 to virtual ground.

The highly doped implanted region 664 also forms a portion of a tunnel diode 674. A thin tunneling window (not shown in FIG. 17) separates the highly doped diffused region 664 from the floating gate 668. The sense conductor 670 acts as a control gate, and is operable to carry an appropriate programming voltage, such as 18 volts, to program the floating gate 668.

Figure 18:
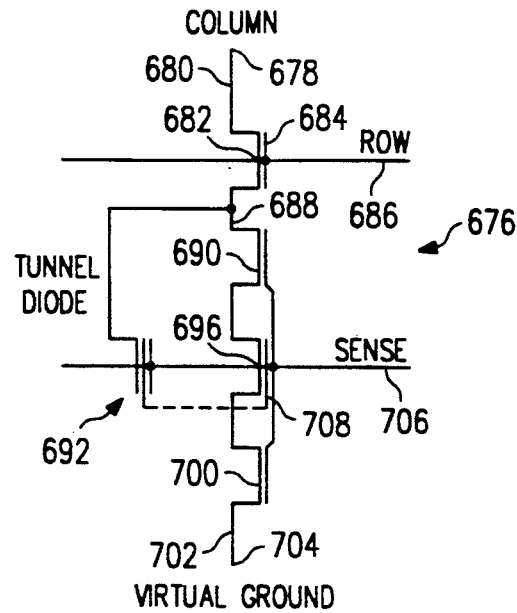
FIG. 18 is a schematic electrical circuit diagram of a double-level poly EEPROM cell fabricated according to a "non-stack etch" process.

FIG. 18 is a schematic electrical circuit diagram of a "non-stack" EEPROM cell indicated generally at 676. From a column voltage connection 678, a highly doped implanted region 680 runs to a first current path terminal of a row transistor 682. A gate 684 of the row transistor is formed by a polysilicon row line 686. A second highly doped implanted region 688 connects a second current path terminal of the row transistor 682 to a first current path terminal of a transistor 690. The highly doped diffused region 688 also forms a portion of a tunnel diode indicated generally at 692. Transistors 690, 696 and 700 are different portions of a single sense transistor channel region, the conductance of transistors 690 and 700 being controlled by second-level poly sense line 706 and the conductance of sense transistor proper 696 being controlled by a first-level poly floating gate 708. A final highly doped implanted region 702 connects a second source/drain region of the fourth transistor 700 to a virtual ground source 704.

The first-level poly floating gate 708 is further disposed over a thin tunneling window (not shown; see FIG. 20) in the tunnel diode 692. The second-level poly sense line or control gate 706 is disposed over the first poly conductor 708 within the tunnel diode 692. Upon the impression of an appropriate programming voltage on the control or sense line 706, the first-level poly conductor 708 will be programmed by the Fowler-Nordheim tunneling of electrons through the thin tunneling window from the highly doped implanted region 688.

Figure 19:
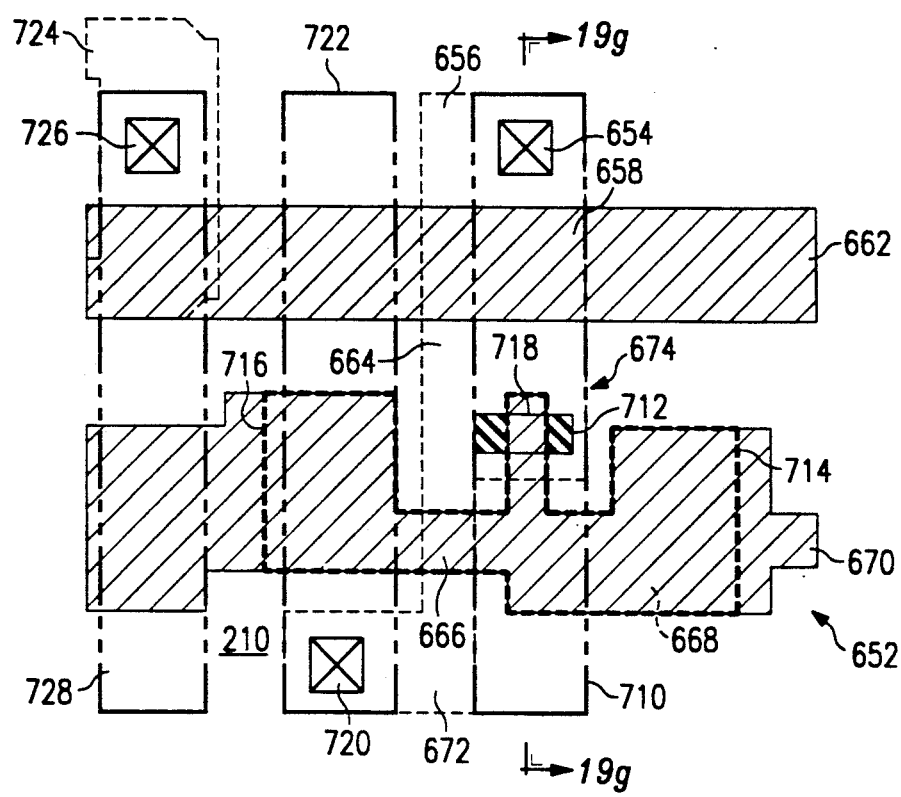
FIG. 19 is a highly magnified schematic plan view of a double-level EEPROM cell corresponding to the electrical circuit diagram shown in FIG. 17, and fabricated according to a "stack etch" process.
Figure 20:
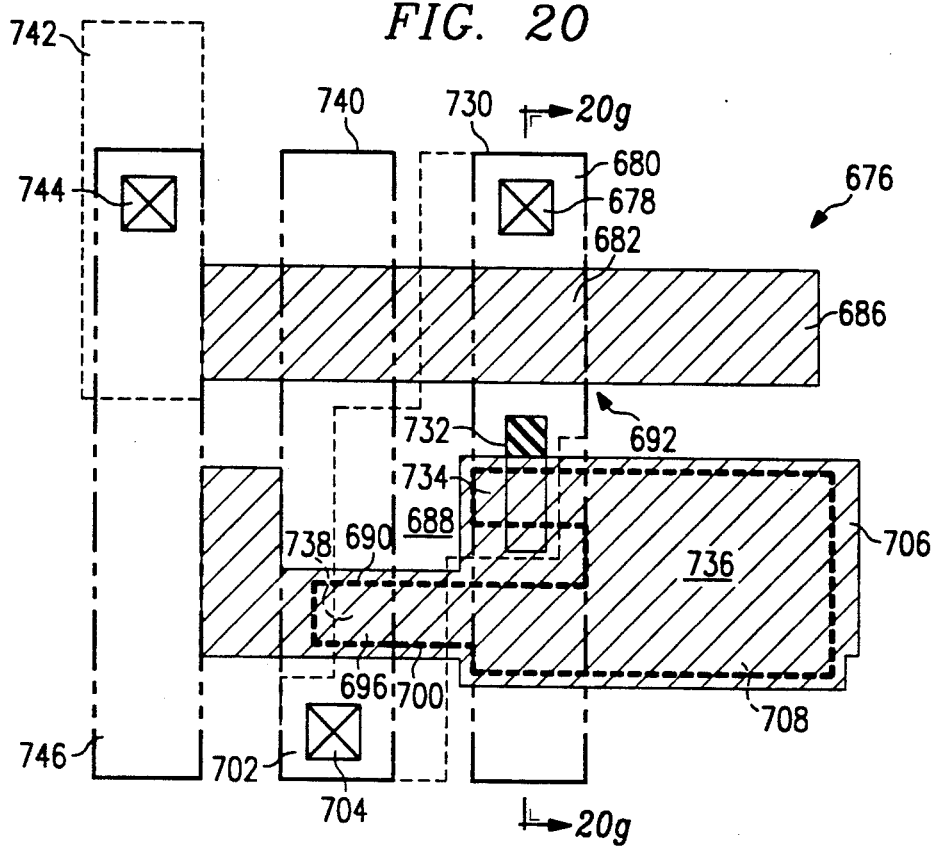
FIG. 20 is a highly magnified schematic plan view of a double-level poly EEPROM cell corresponding to the electrical circuit diagram shown in FIG. 18, and fabricated according to a "non-stack etch" process.

A schematic plan view of a "stack" cell is shown in FIG. 19. In FIGS. 19 and 20, metal 1 structures are shown in dark phantom outline, poly 2 conductors are shown with diagonal shading, the lateral margins of the poly 1 conductors are shown in dark hidden line (where not congruent with the lateral margins of the poly 2 conductors), the boundaries of the highly doped epitaxial regions are shown in fainter hidden line, and the margins of the Fowler-Nordheim tunnelling windows are shown as thick-striped shaded rectangles. Metal 1 conductor 710, shown in a dark phantom outline, runs vertically through the FIG. 19 and makes connection to the highly doped region 656 through an appropriate contact 654. Preferably, the EEPROM cell 652 is formed in (p) type material, and in this instance, the highly doped regions 656, 664 and 672 are (n+). The row transistor 658 is formed from region 656 as a first source/drain region and region 664 as a second source/drain region. The lateral edges of the source/drain regions 656 and 664 adjacent the margins of the row conductor 652 are self-aligned in their implantation into the semiconductor layer. A 500-Angstrom gate oxide (not shown) is used to separate the poly conductors of the transistors 658 and 672 from the channels formed underneath them.

The highly doped regions 656, 664 and 672, where not defined by superimposed poly conductors, have lateral margins which are defined by the moat oxide 210. The (n+) region 664 includes within its lateral margins, on the surface thereof, a thin tunnel oxide window 712. A tunnel oxide of approximately 90 Angstroms is grown within the tunnel window 712 to separate the floating gate 668 from the highly doped region 664.

The floating gate conductor and the sense conductor 670 largely have identical lateral margins that are produced during a stack etch. Exceptions to this are a right lateral margin 714 of the floating gate conductor 768 and a left lateral margin 716. These are defined in an etch prior to the stack etch. Otherwise, the lateral margins of the floating gate 668 and control gate 670 are exactly congruent. Both the floating gate 668 and the control gate 670 extend in a finger 718 over the Fowler-Nordheim tunneling window 674. Both the control gate 670 and the floating gate 668 extend over the sense transistor 666. The (n+) regions 664 and 672 form the source/drain regions for the sense transistor 656. The highly doped region 672 makes contact through an appropriate contact 720 to a metal 1 virtual ground conductor 722, which like the column voltage conductor, runs vertically in FIG. 19. A (p+) field plate region 724 is connected through a contact 726 to a field plate conductor 728 which, like conductors 710 and 722, runs vertically.

A highly magnified schematic plan view of a non-stack cell indicated generally at 676 is shown in FIG. 20. A metal 1 column conductor 730 runs vertically through FIG. 20, and is connected to a preferably (n+) highly doped region 680 through a contact 678. Highly doped regions 688 and 680 form opposed source/drain regions of the row transistor 682, whose conductance is controlled by a second-level poly row conductor 686 that runs horizontally through FIG. 20, and is separated from the semiconductor surface by a gate insulator layer, such as 350–500 Angstroms of oxide. Within the lateral margins of the highly doped region 688 is a Fowler-Nordheim tunneling window 732 in which a tunnel oxide is grown to a depth of approximately 90 Angstroms at the time that tunnel oxide 226 is grown in the integrated process described herein (see FIG. 6g). Highly doped regions 688 and 702 form opposed source/drain regions for the sense transistor 696. In plan view, the control gate or sense line 706 is superimposed over the floating gate 708 in its entirety, but unlike the stack cell 652, shares none of the lateral margins of the floating gate 708. A finger 734 of the floating gate 708 extends over the Fowler-Nordheim tunneling window 732. The finger 734 is connected to a main body 736 of the floating gate 708, which in turn in the illustrated embodiment extends once again towards the left in a finger 738 to control the conductance of the sense transistor 696. Finger 734 and finger 738 are substantially spaced from each other such that the tunnel diode region 92 will be distinct from the channel region of transistor 696.

Since the control gate/sense line 706 does not need to be digitated after the manner of the floating gate 708, its lateral margin forms no corresponding fingers. The control gate 706 overlaps the floating gate 708 at each point where the floating gate 708 is disposed over a highly doped region 688 or 702. A large portion of the Fowler-Nordheim tunneling window 732 is covered by the control gate 706. The overlap of the finger 738 by the control gate 706 causes the formation of the transistors 690 and 700 on either side of the sense transistor 696.

The highly doped region 702 is connected thorough a contact 704 to a virtual ground conductor 740. A (p+) field plate region 742 is connected through a contact 744 to a metal 1 field plate conductor 746 that is aligned vertically within FIG. 20, together with conductors 740 and 730. The row and sense conductors 686 and 706 are disposed generally horizontally in FIG. 20.

Figure 20G:
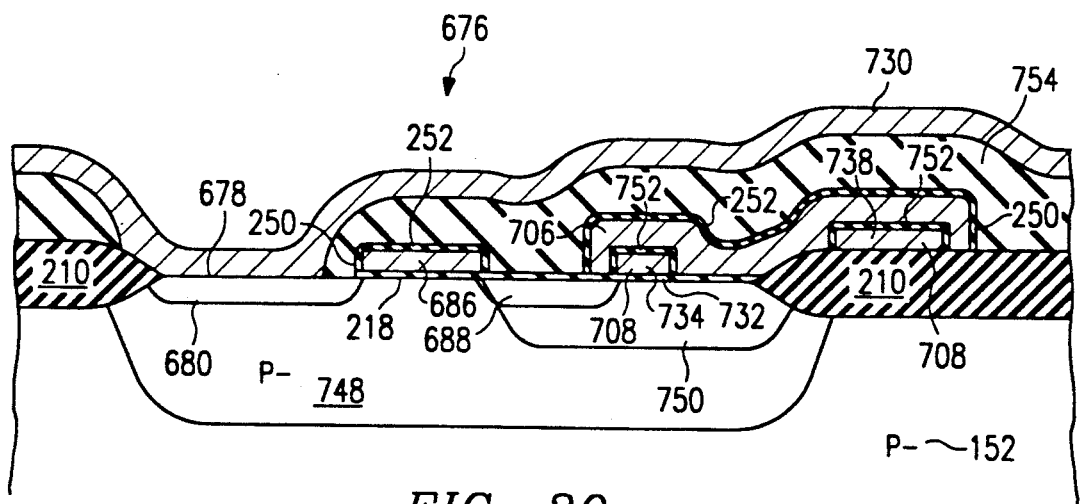
FIG. 20g is a highly magnified schematic sectional view of the "non-stack etch" cell shown in FIG. 20, FIG. 20g being taken substantially along line 20g—20g of FIG. 20.

Referring now to FIG. 20g, a schematic sectional view taken along line 20g—20g of FIG. 20 is shown. FIG. 20g corresponds to FIG. 6g in the main integrated process, with additional BPSG and metal 1 layers added as will be described. Corresponding FIGS. 20a–20f have been omitted as largely redundant to the description of steps of the integrated process already described for other devices.

The highlights of the integrated process as it applies to the non-stack EEPROM cell 676 are as follows. A high-voltage (p−) tank 748 is implanted to contain the source/drain and implanted diode regions of the cell 676. After the other tank and deep diffusions for the other devices formed in the integrated process, a moat pad oxide and a moat pad nitride (not shown; see layer 204 in, e.g., FIG. 6d), are deposited, patterned and etched. A layer of photoresist (not shown) is deposited and patterned to define the channel stop implantation (not shown) which takes place on the periphery of the cell 676. After the channel stop photoresist layer is stripped, LOCOS oxide 210 is grown on the surface of the epitaxial layer 152 on those places not masked by the nitride/oxide layer 204 (not shown).

After this, a dummy oxide (not shown) is grown within the p-tank 748 at least in an area surrounding the area to become the tunnel oxide window 732. A tunnel diode implant is performed through this dummy oxide (not shown), for example, with phosphorus at a dose of about $5.0 \times 10^{14}$ ions/cm$^2$ and an implantation energy of approximately 100 KeV. After this implant, a diode region 750 is created. Diode region 750 is continuous with the highly doped region 688. The dummy oxide (not shown) is then etched away. On the surface of the exposed semiconductor epitaxial layer, a sense transistor gate insulator layer is grown to a depth of, for example, 350 Angstroms. Then, this sense transistor gate oxide is stripped away within area 732 and a thin tunnel oxide is grown within area 732 to a depth of approximately 90 Angstroms.

Thereafter, during the deposition of the first-level poly layer, for example, the FAMOS EEPROM 149 as shown in FIG. 6e, the first-level poly is deposited within the cell area 676. This first-level poly layer is patterned and etched to form the floating gate 708, including a finger 734 thereof over the tunnel oxide window 732 and a finger 738 that extends over the sense transistor (not shown in the section taken in FIG. 20g). An interlevel nitride and oxide layer 752 is then formed on the exposed surfaces of the floating gate 708. A high voltage gate oxide is grown for the row transistor 658. The high voltage gate oxide 218 is grown to a depth of approximately 500 Angstroms. The cell 676 is then ready for a high-voltage p-tank threshold voltage adjust implant which is implanted into those portions of the p-tank 748 not masked by the finger 734.

The second-level poly layer is then deposited, doped, patterned and etched to define the row conductor 686 and the control gate 706. Cell 676 is, however, masked off from any stack etch which may occur to the FAMOS EPROM cell (if present on the same chip) that is shown, for example, at 149 in FIG. 6f.

Sidewall oxide 250 and a cap oxide 252 are added to expose surfaces of the second-level poly gates 686 and 706. Thereafter, phosphorus and arsenic implants are used to form (n+) source/drain regions 680 and 688 during the (n+) source/drain implantation stage. A smoothing borophosphosilicate glass (BPSG) layer 754 may next be deposited over the surface of chip 22. A contact 678 is opened through the BPSG layer 754 to the source/drain region 680, simultaneously with the formation of contacts 744 and 704 (see FIG. 20). Titanium tungsten alloy followed by an aluminum copper alloy are sputtered on to the surface of chip 22. This metal 1 layer is then patterned and etched to form, inter alia, the column conductor 730.

Figure 19G:
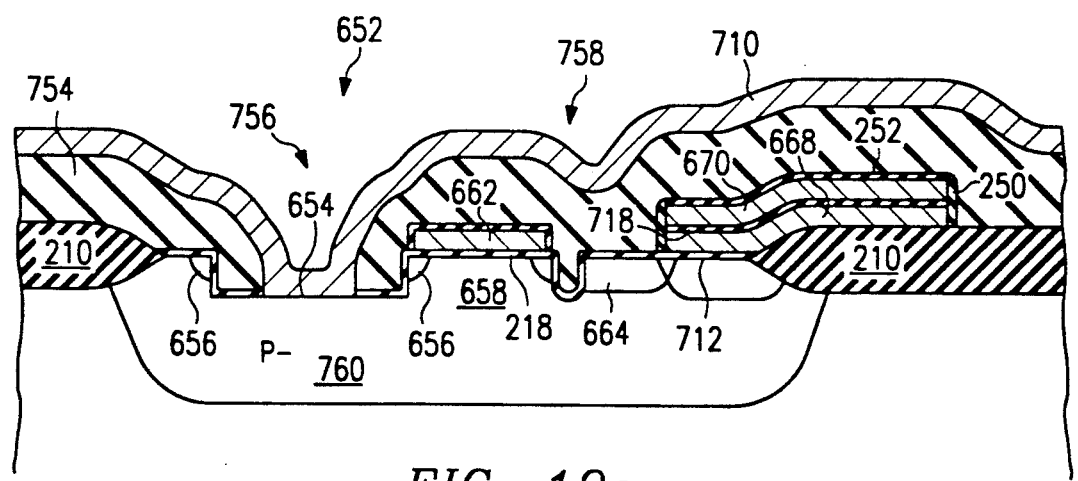
FIG. 19g is an elevational sectional view taken substantially along line 19g—19g of FIG. 19, illustrating possible defects in fabrication of a "stack etch" double-level poly EEPROM cells.

FIG. 19g is a sectional view taken substantially along line 19g—19g of FIG. 19, showing problems which may occur with a "stack" EEPROM cell process. The stack etch of two layers of polysilicon must etch through both layers. However, when the stack etch is applied to a single polysilicon layer, such as layer 662, undesirable trenches indicated generally at 756 and 758 will form on either side of the etched polysilicon conductor 662. The existence of these trenches causes a high failure rate of the "stack" EEPROM cells. In the illustrated example, the source/drain region 656 has largely been obliterated by the trench 756, and the column conductor 710 is making contact directly to the (p−) tank 760. The trench 758 cuts the source/drain region 664 to effectively isolate the row transistor 658. The cell 652, therefore, will never be selected for programming or readout.

Bias conditions for write, erase and read modes for the "non-stack" EEPROM cell 676 are shown in the following Table:

| Mode | Row | Sense | Column | Virtual Ground |
|---|---|---|---|---|
| Write | $V_{PP}$ | $V_{PP}$ | $V_{SS}$ | float |
| Erase | $V_{PP}$ | $V_{SS}$ | $V_{PP}$ | float |
| Read | $V_{DD}$ | $V_{REF}$ | to sense amp | $V_{SS}$ |

In a typical application $V_{PP}$ may be on the order of 18 volts, $V_{SS}$ 0 volts, $V_{DD}$ 5 volts and $V_{REF}$ 2 to 2.5 volts.

Field plates 724 (FIG. 19) and 742 (FIG. 20) are used for high-voltage isolation.

Referring to FIG. 20, since the poly 2 layer as shown for the control gate 706 overlaps the poly 1 floating gate 708, the design rule for the overlap should insure that the poly 1 edges are never exposed. The non-stack cell shown in FIG. 20 occupies approximately the same area on the chip 22 as the stack cell 652 (FIG. 19).

Referring back to FIG. 19g, the trenches 756 and 758 are a result of the second poly etch. The depths of the trenches 756 and 758 are not directly controlled, and vary depending on etch selectivity to doped and undoped silicon, percentage overetch of the poly 1 layer 662, etching uniformity on any particular wafer, and the density of etched material, which has a tendency to "load" the chemistry of the etching system. Since the depth of these trenches are not directly controlled, their impact on product reliability is not quantified. The potential for metal or for protective overcoat cracking in the column contact 654 was demonstrated by qualification failures on a memory product using a similar cell layout. That product failed uplift tests for metal opens at the column contacts. The non-stack cell shown in FIGS. 20 and 20g has an additional advantage over the stacked cell in that the poly 2 control gate covers the poly 1 floating gate 708 on all sides, rather than covering the floating gate 708 with only a thermal oxide cap 252. This increases program retention for the floating gate 708. The protection by the control gate 706 of the underlying floating gate 708 also increases fabrication reliability in that the floating gate 708 is protected from the HF dip given to the chip 22 before the cap oxidation that produces cap oxide 252.

FIGS. 21a, 21b, 21d and 21f-g are highly magnified schematic sectional views of a vertical npn transistor which may be fabricated according to the integrated process described herein. The process fabrication steps and final structure are similar to the lateral npn transistor illustrated in FIGS. 12a-b, 12d and 12f-h.

At the time of the formation of the (n+) buried layers, as for example for the vertical DMOS transistor 147, an (n+) buried layer 772 is grown on top of the (p−) epitaxial layer 152. After the formation of the (n+) buried layer 772, the monocrystalline semiconductor material is completed by a (p−) epitaxial layer 156.

A high-voltage n-tank 774 is next implanted into the epitaxial layer 152, as defined by the nitride/oxide mask 166. The high-voltage n-tank 774 will contain the rest of the structure with the exception of the (n+) buried layer 772. Subsequently, a deep (n+) diffusion 776 is formed to conductively connect the (n+) buried layer 772 to points external to the device 770.

Figure 21A:
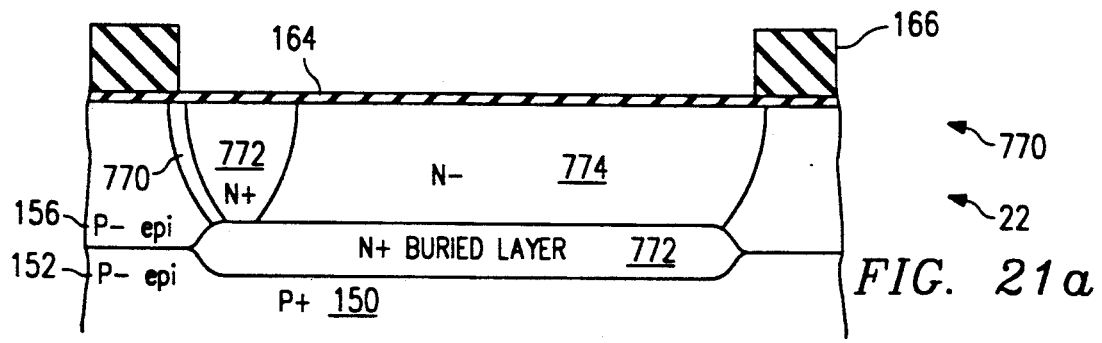
FIGS. 21a-b, 21d and 21f-g are highly magnified schematic sectional views of successive stages in the fabrication of a buried-collector, vertical npn bipolar transistor according to the integrated process described herein.
Figure 21B:
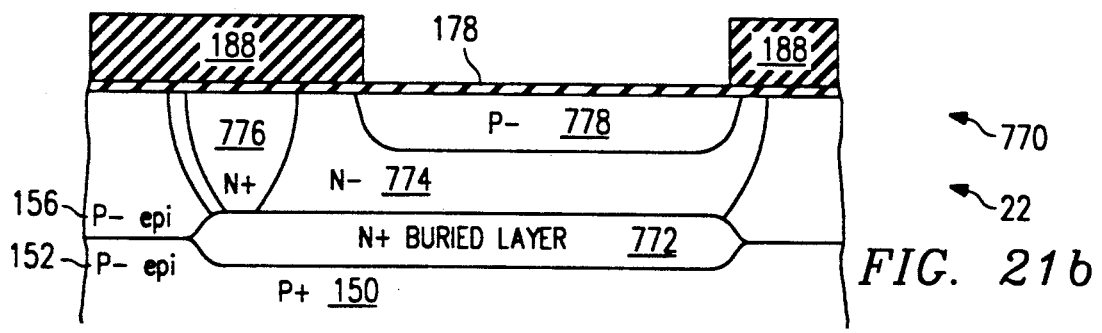

Turning now to FIG. 21b, a patterned layer 188 of photoresist is used to define a high-voltage p-tank 778.

The (p−) tank 778 is formed inside the n-tank 774 so as to be spaced from the deep (n+) diffusion 776.

Figure 21D:
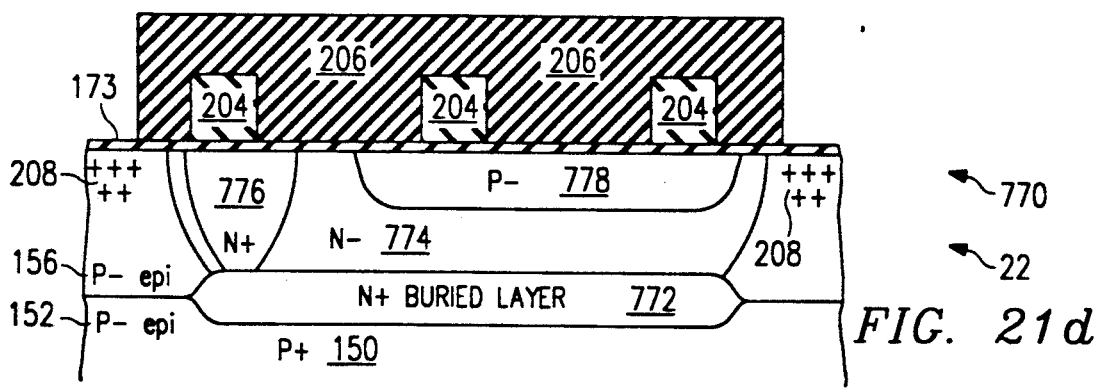
Figure 21F:
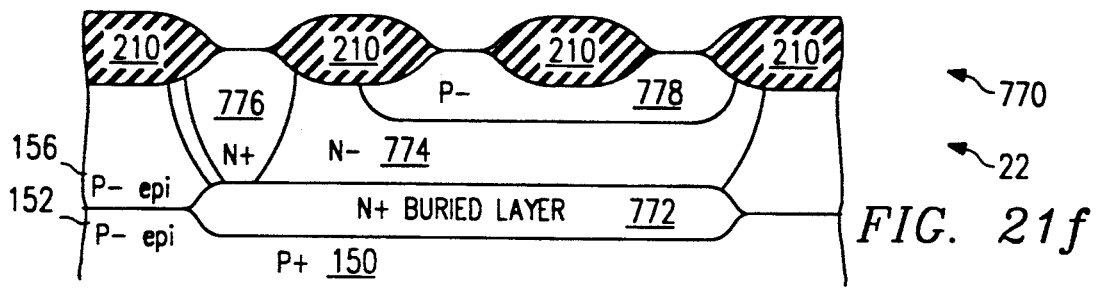

Nothing of import happens to device 770 in the stage corresponding to FIG. 6c. In FIG. 21d, corresponding to FIG. 6d in the main integrated process sequence, a nitride/oxide layer 204 is formed, patterned and etched to define those areas of the epitaxial layer 156 where localized oxide is not wanted. A layer 206 of photoresist is patterned in order to provide a mask for the implantation of (p+) channel stop regions 208. After the channel stop implant, the photoresist layer 206 is stripped and the chip 22 is subjected to a long thermal step in order to create localized or moat oxide regions 210 (FIG. 21f).

Figure 21G:
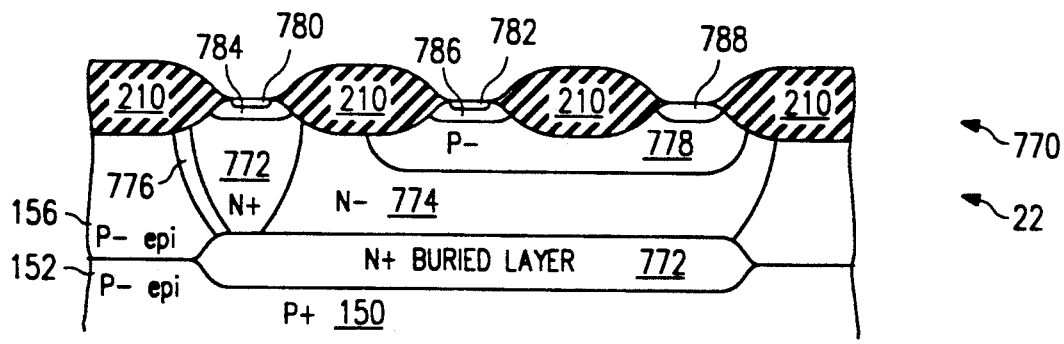

The remaining important fabrication steps are shown in FIG. 21g. The moat oxide 210 is used to completely self-align the implantation of n-type low density diffused regions 784 and 786. The same photoresist mask is used to implant (n+) regions 780 and 782. Regions 780 and 784 form a deep diffusion contact region for the (n+) buried collector 772. Regions 782 and 786 together constitute an emitter for this vertical npn device. Lastly, the moat oxide 210 is used to completely self-align the implantation of a (p+) base contact region 788 for the connection to base 778.

Figure 21H:
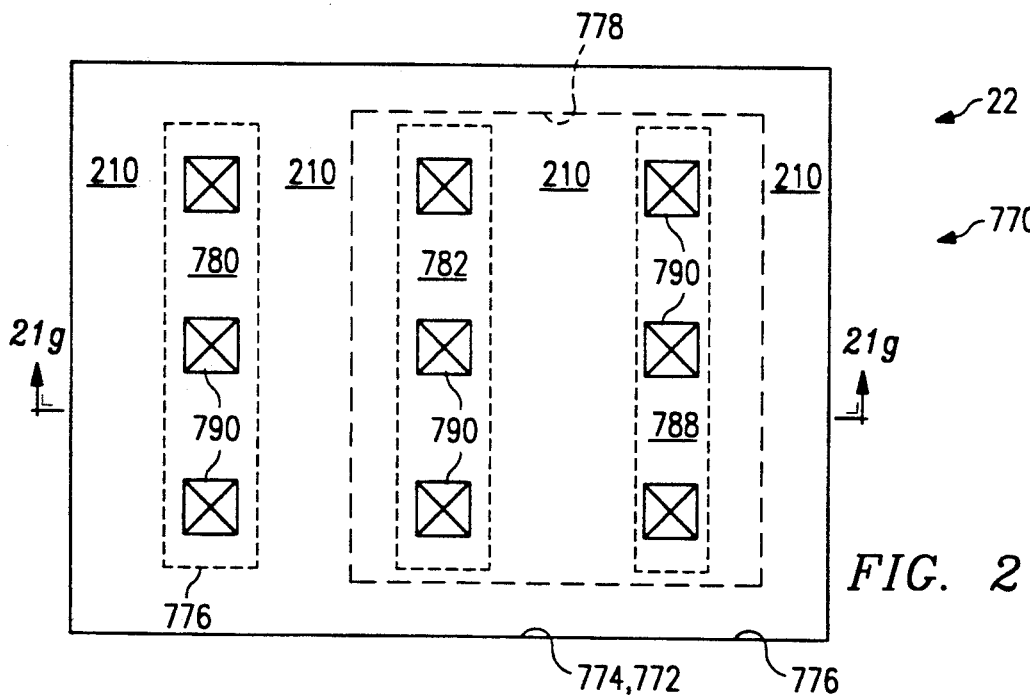
FIG. 21h is a schematic plan view of the buried-collector, vertical npn transistor shown in FIG. 21g, FIG. 21g being taken substantially along line 21g—21g of FIG. 21h.

A schematic plan view of the vertical npn transistor 770 is given in FIG. 21h. The high-voltage n-tank and the approximate lateral limits of the buried layer 772 are shown by the enclosing rectangular solid line. Within this boundary are the deep (n+) connecting diffusion 776, shown by a dashed line, and the high-voltage (p−) tank 778. The lateral margins of the moat oxide 210 are used to self-align the implantations for the buried collector contact region 780, the emitter 782 and the base contact region 788. Appropriate contacts 790 are made to each of the regions 780, 782 and 788.

In the vertical npn transistor 770 described in conjunction with FIGS. 21a-b, 21d and 21f-h as well as the lateral npn transistor shown in FIGS. 12a-b, 12d, and 12f-h, a high-voltage p-tank is used instead of a low-voltage p-tank in order to get a lower dopant concentration, a narrower base region, and a higher $h_{FE}$.

Figure 22:
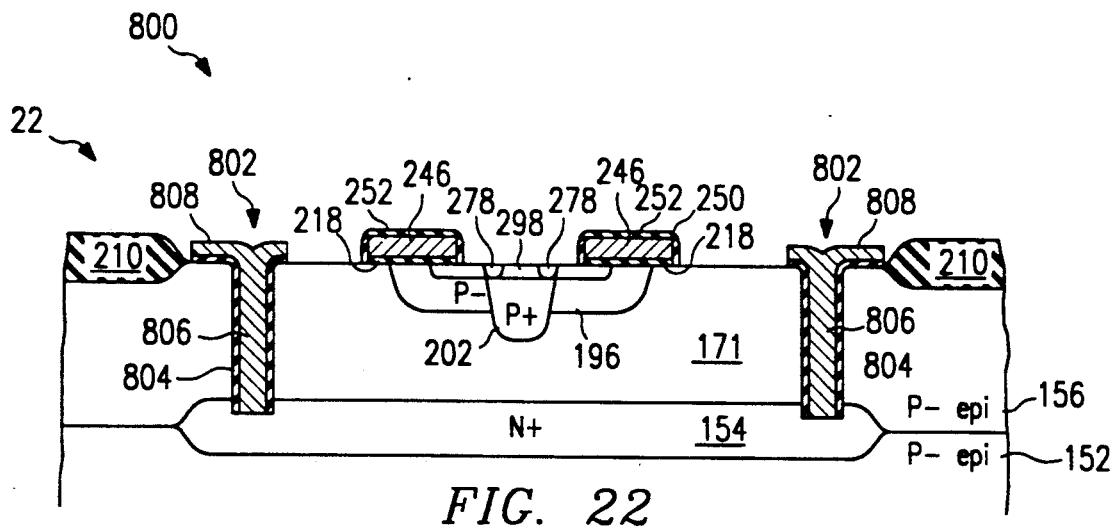
FIG. 22 is a highly magnified schematic sectional view of a vertical DMOS transistor fabricated according to the integrated process described herein, illustrating the use of trench connections to a buried layer.

FIG. 22 is a schematic sectional view of a vertical DMOS transistor 800 that is an alternative embodiment to the vertical DMOS transistor 147 shown, for example, in FIGS. 6g-1 and 6h-1. FIG. 22 corresponds to the process stage shown in FIG. 6g; prior processing steps have been omitted as being largely redundant to the description of process steps already described for other devices.

The fabrication of the VDMOS transistor 800 proceeds in substantially the same manner as transistor 144 for most of the process flow. An (n+) buried layer 154 is formed on the epitaxial layer 152, and a second (p−) epitaxial layer portion 156 is formed on top of this. A high-voltage n-tank 171 is implanted into the epitaxial layer 156 to contain the device. This is followed by the implantation of the (p−) low-voltage tank 196 and the deep (p+) diffusion 202. Channel stops (not shown) are implanted at the periphery of the device 800, followed by the selective oxidation of the epitaxial surface to produce the moat oxide 210.

Next, a 500 Angstrom high-voltage oxide 218 is grown on the surface, followed by a $V_t$ adjust implant and by the deposition, doping, patterning and etching of a preferably annular poly 2 gate 246.

At this point, the process departs from the usual process flow in that the chip surface is masked to leave only areas in which the trenches 802 are to be etched. An anisotropic plasma etch is used to etch trenches 802 through the high-voltage n-tank 171 into the (n+) buried layer 154. Once trenches 802 have been dug, a thermal oxide 804 is grown on the sides (and the bottoms) of trenches 802. The chip is once again patterned, and an anisotropic etch removes the oxide from the bottoms of trenches 802. Trenches 802 may be joined to form one long annular trench.

The old layer of photoresist is stripped and a new layer of photoresist is formed on the surface and patterned for the deposition of a third poly layer. The third poly layer is patterned and etched to produce (n+) polysilicon plugs 806 which fill the trenches 802. Contact extensions 808 of the poly plugs 806 are left after the etch to provide contact points for metal 1 contacts (not shown).

Alternatively, the trenches 802 can be etched subsequent to the formation of the high-voltage gate oxide 218, but prior to the deposition of the poly layer 246. The poly plugs 806 and the poly 2 conductive gates 246 would then be deposited, patterned and etched as shown. The polysilicon used to create plugs 806 should be pre-doped; therefore, if the same poly that is used to fill trenches 802 is used for the poly 2 layer, the poly material should be pre-doped instead of doped in situ.

The trenches 802 shown in FIG. 22 represent a technical advantage over the deep (n+) method of connection to the buried layer 154. This is because the deep (n+) regions (see, e.g., FIG. 6g-1) diffuse laterally as well as vertically. A thick epitaxial layer 156 necessary for high-voltage applications in turn forces large spacings for the deep (n+) diffusions. Using the trench method of connection, however, the design rules for the transistor 800 can be independent of the need for large spacings for the deep (n+) diffusions, thus saving space.

Figure 23:
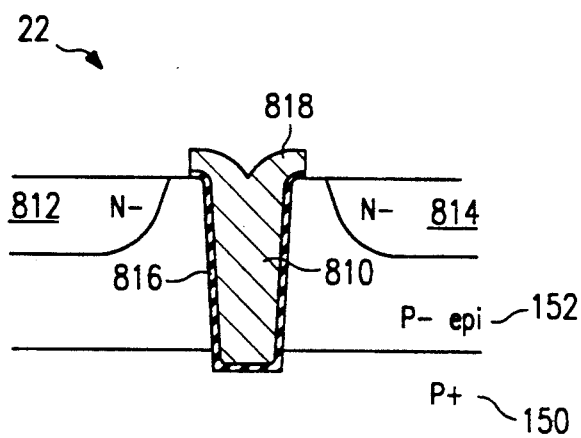
FIG. 23 is a highly magnified schematic sectional view of a polysilicon-field trench used for isolation purposes.
Figure 24:
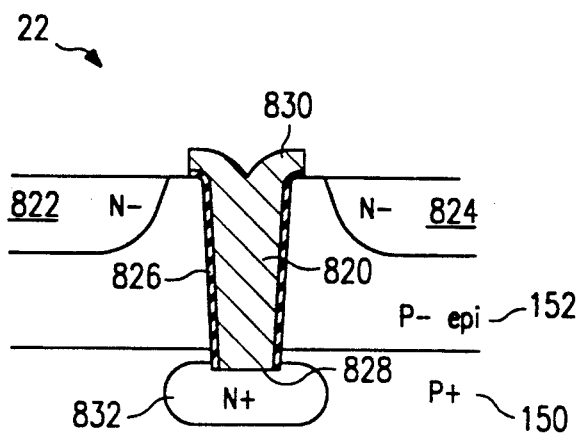
FIG. 24 is a highly magnified schematic sectional view of another polysilicon-field trench used for device isolation purposes.

FIGS. 23 and 24 illustrate alternative uses of trenches on the chip 22 for isolation purposes. In FIG. 23, which is a highly magnified schematic elevational view, a trench 810 has been etched through the epitaxial layer 152 until it meets the (p+) substrate 150. The trench 810 is positioned between, for example, a high-voltage (n−) tank 812, and a neighboring high-voltage n-tank 814. After the trench 810 is etched, a thermal oxide 816 is grown on its walls and bottom, and the trench 810 is filled with (n+) poly 818. The trench 810 provides an isolating structure between the (n−) tanks 812 and 814 that may be used instead of, or in addition to, moat oxide.

FIG. 24 illustrates yet another alternative embodiment, in which a trench 820 has been etched between a first high-voltage (n−) tank 822 and a second tank 824. A thermal oxide 826 is grown on the sides of the trench 820, but is anisotropically etched off of the bottom 828 of the trench. The trench is then filled with an (n+) poly layer 830 as before. However, since the bottom has been left exposed to the (p+) silicon substrate 150, and out-diffusing (n+) region 832 will be created from dopant supplied by the (n+) poly 830. This provides additional isolation.

Figure 25A:
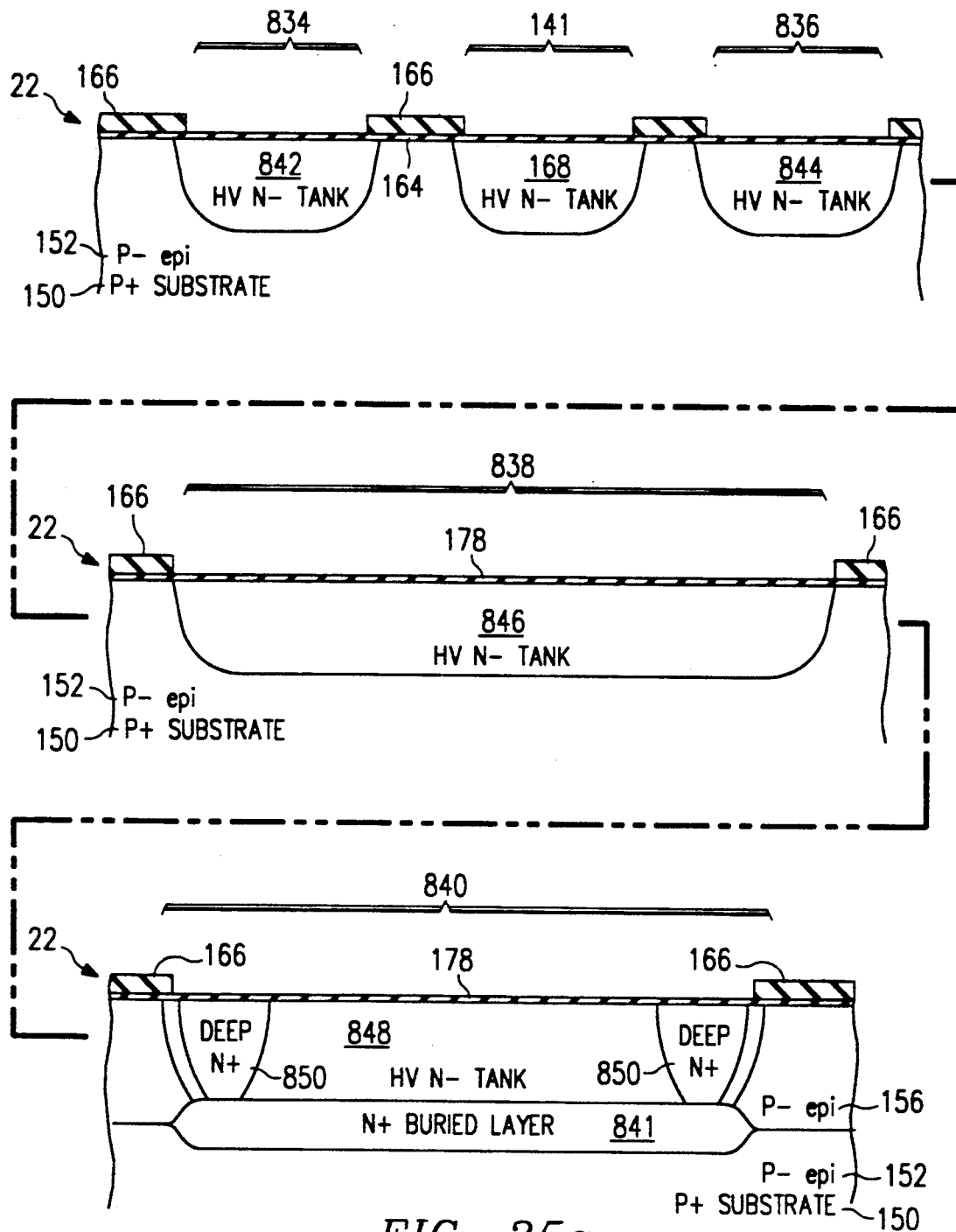
FIGS. 25a-25g are highly magnified schematic sectional views of successive stages in the fabrication of tank-isolated field effect transistors and lateral and vertical DMOS power transistors with early source/drain processing.

Turning now to FIGS. 25a-g, further devices are illustrated which may be fabricated according to the integrated process described herein. These devices include an isolated low-voltage n-channel field effect transistor 834, an isolated n-channel field effect transistor 836 for the gating of an EEPROM array, another lateral DMOS transistor 836 and another vertical DMOS transistor 840. Turning first to FIG. 25a, a high-voltage n-tank 842 for transistor 834 and a high-voltage n-tank 844 for the EEPROM transistor 836 are implanted into the semiconductor epitaxial layer 152. The provision of these high-voltage n-tanks is the principal modification of these transistors 834 and 836 in comparison to their cognates, transistors 140 and 142 (see FIGS. 6a-g). A high-voltage n-tank 846 is implanted for the lateral DMOS transistor 838, and a further high-voltage n-tank 848 is implanted for the vertical DMOS transistor 840. Previous to the implantation of the high-voltage n-tanks 842, 168, 844, 846 and 848, an (n+) buried layer 841 was formed at the top of the epitaxial layer 152, and a further (p−) epitaxial layer 156 was formed on top of the (n+) buried layer 841 to complete the silicon in which the high-voltage n-tank 848 would later be formed.

Following this step, deep (n+) regions 850 are implanted into the high-voltage n-tank 848 with a dopant concentration and an implantation energy sufficient to reach the (n+) buried layer 841, giving a conductive connection from the phase of the epitaxial layer 156 to the (n+) buried layer 841.

Figure 25B:
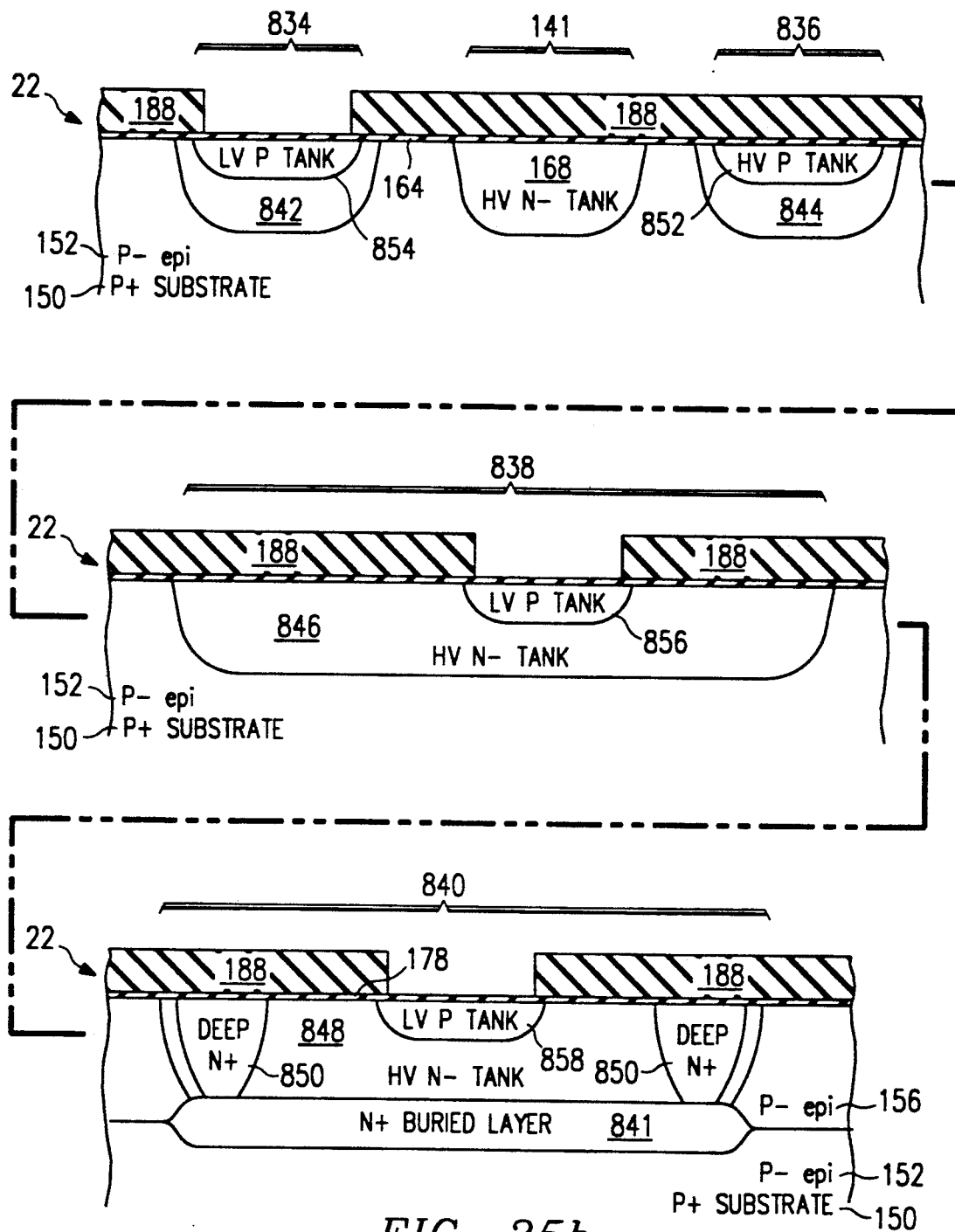
Figures 1, 25B:
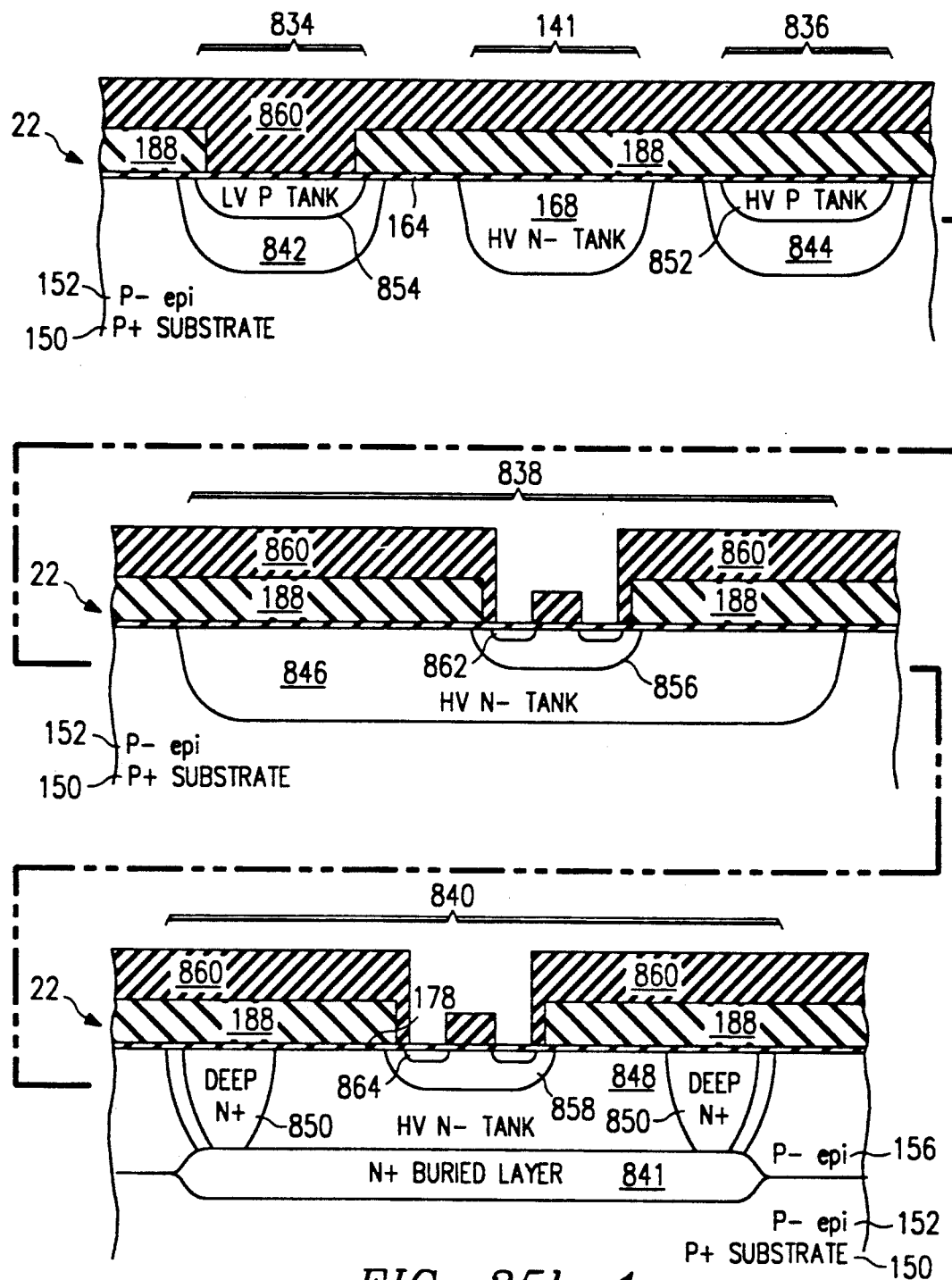
FIG. 1 is a schematic diagram showing an automobile with a plurality of microcontrollers fabricated according to the process described herein for use in controlling automobile ignition, running instrumentation gauges, and performing other functions.

Turning next to FIG. 25b, the implantation of low and high-voltage p-tanks for devices 834, 836, 838 and 840 are next shown. A photoresist layer (not shown) masks off the entirety of the chip 22 except for areas in which high-voltage p-tanks are to be implanted. An implantation follows to establish the high-voltage p-tank 852. The patterned photoresist layer is then stripped and a new photoresist layer 188 is deposited on the surface of the epitaxial layer 152 and patterned to define low-voltage p-tanks. The low-voltage p-tank implant is then performed, for example, with boron at about $1 \times 10^{14}$ ions/cm$^2$ and at an implantation energy of approximately 40 KeV, to establish a low-voltage p-tank 854 for the low-voltage n-channel transistor 834, a low-voltage p-tank 856 centered in the middle of the high-voltage n-tank 846 for the LDMOS transistor 838, and a low-voltage p-tank 858 as centered in the middle of the high-voltage n-tank 848 and spaced from the deep (n+) diffusions 850 for the vertical DMOS transistor 840.

FIG. 25b-1 shows a stage of the processing intermediate between FIGS. 6b and 6c for the devices 834, 836, 838 and 840. After the implantation of the low-voltage p-tanks 854-858, a second layer 860 of photoresist is deposited over the surface of the chip 22 and patterned as shown. An (n+) implantation is next performed, preferably with arsenic, at a dose of $5 \times 10^{15}$ ions/cm$^2$ and an implantation energy of approximately 120 KeV. This implant step produces an annular highly doped (n+) region 862 within the lateral margins of the low-voltage p-tank 856, and a similar annular highly doped region 864 contained by the low-voltage p-tank 858.

Figure 25C:
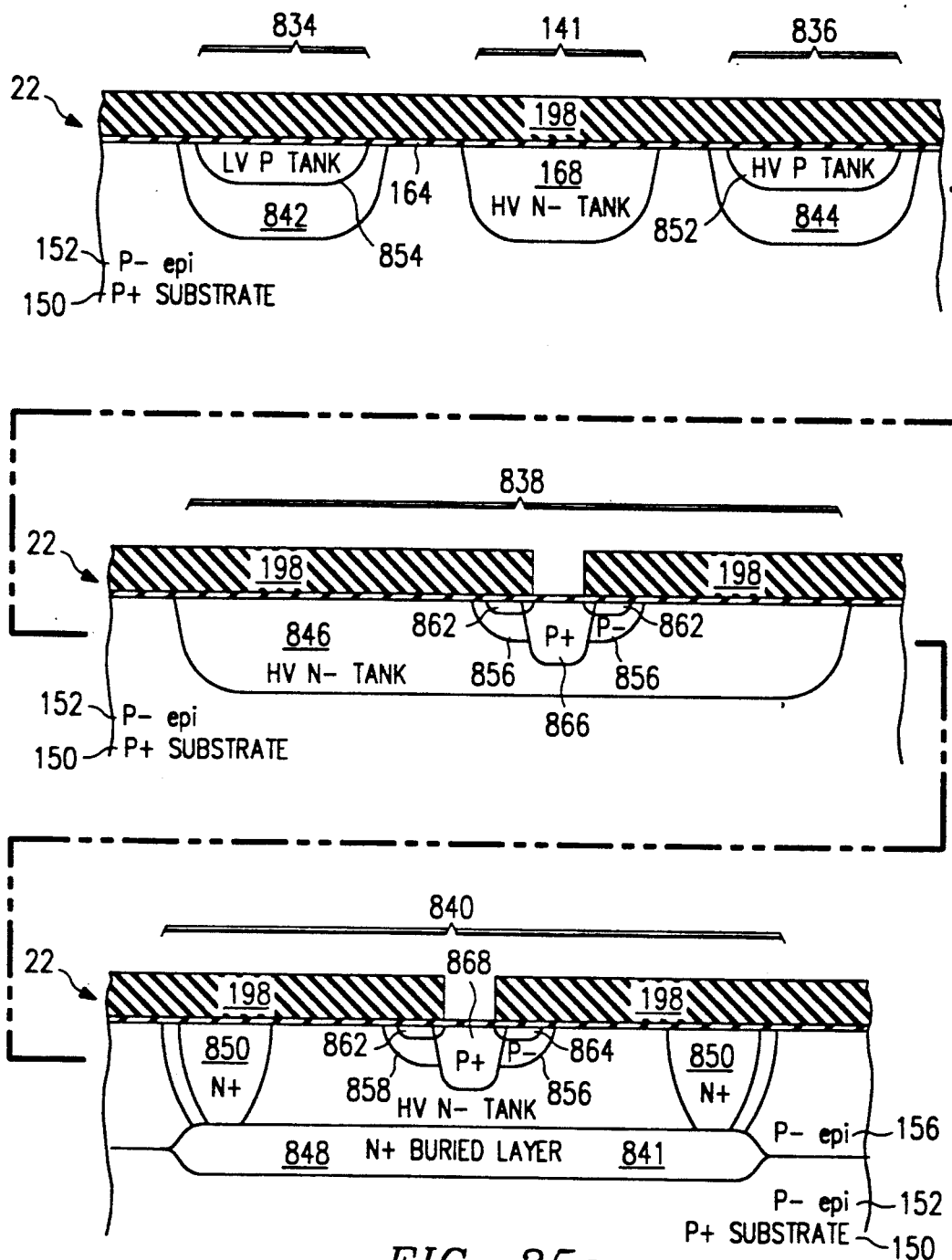

Turning next to FIG. 25c, stages in the fabrication process for these devices are shown that correspond to those shown in FIG. 6c. A layer of photoresist 198 is next deposited on the chip and patterned for a deep (p+) diffusion. This may be performed, for example, with boron at about $1 \times 0 \times 10^{12}$ ions/cm$^2$ and at an implantation energy of approximately 40 KeV. This implantation step will produce deep (p+) regions 866 and 868.

Figure 25D:
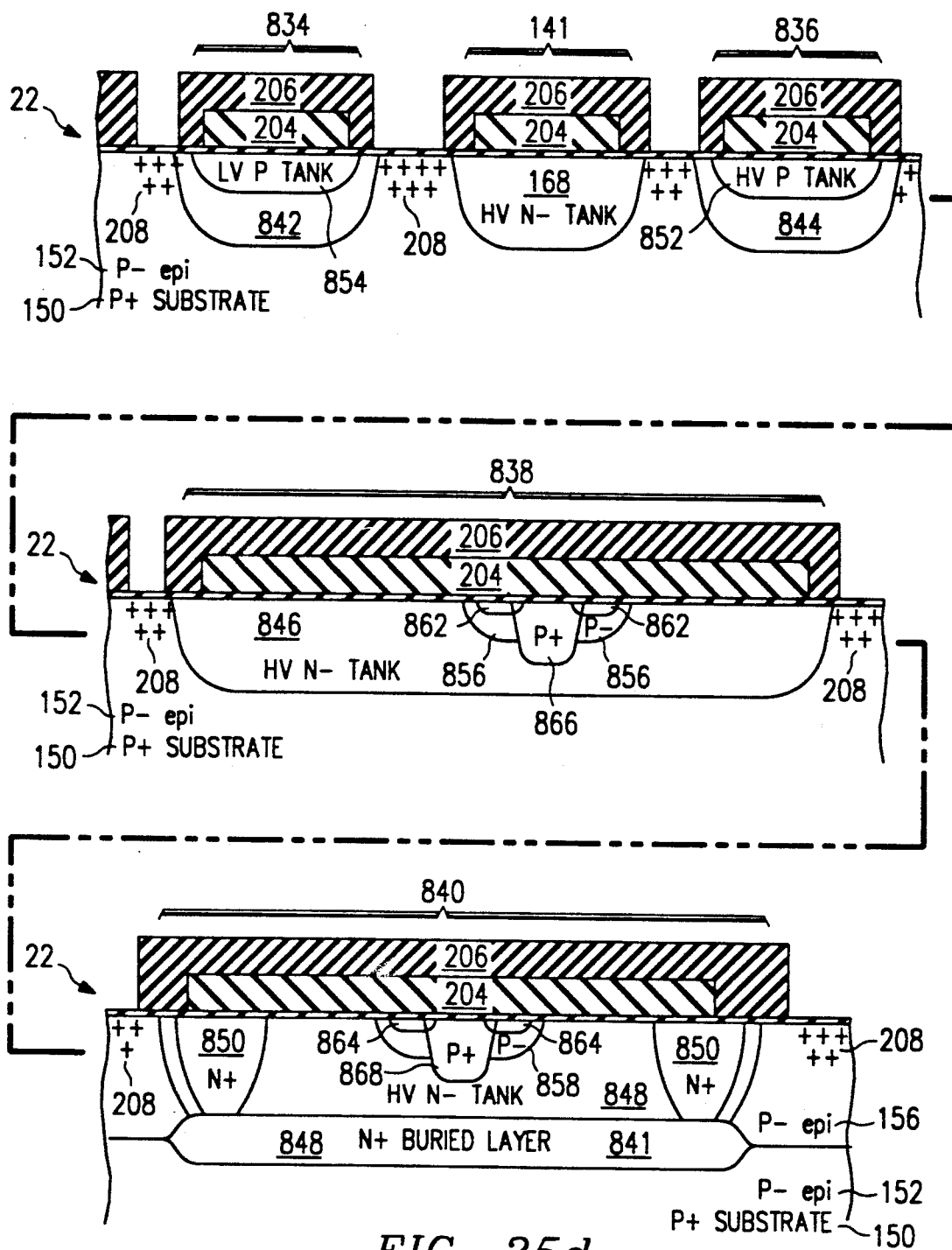
Figure 25E:
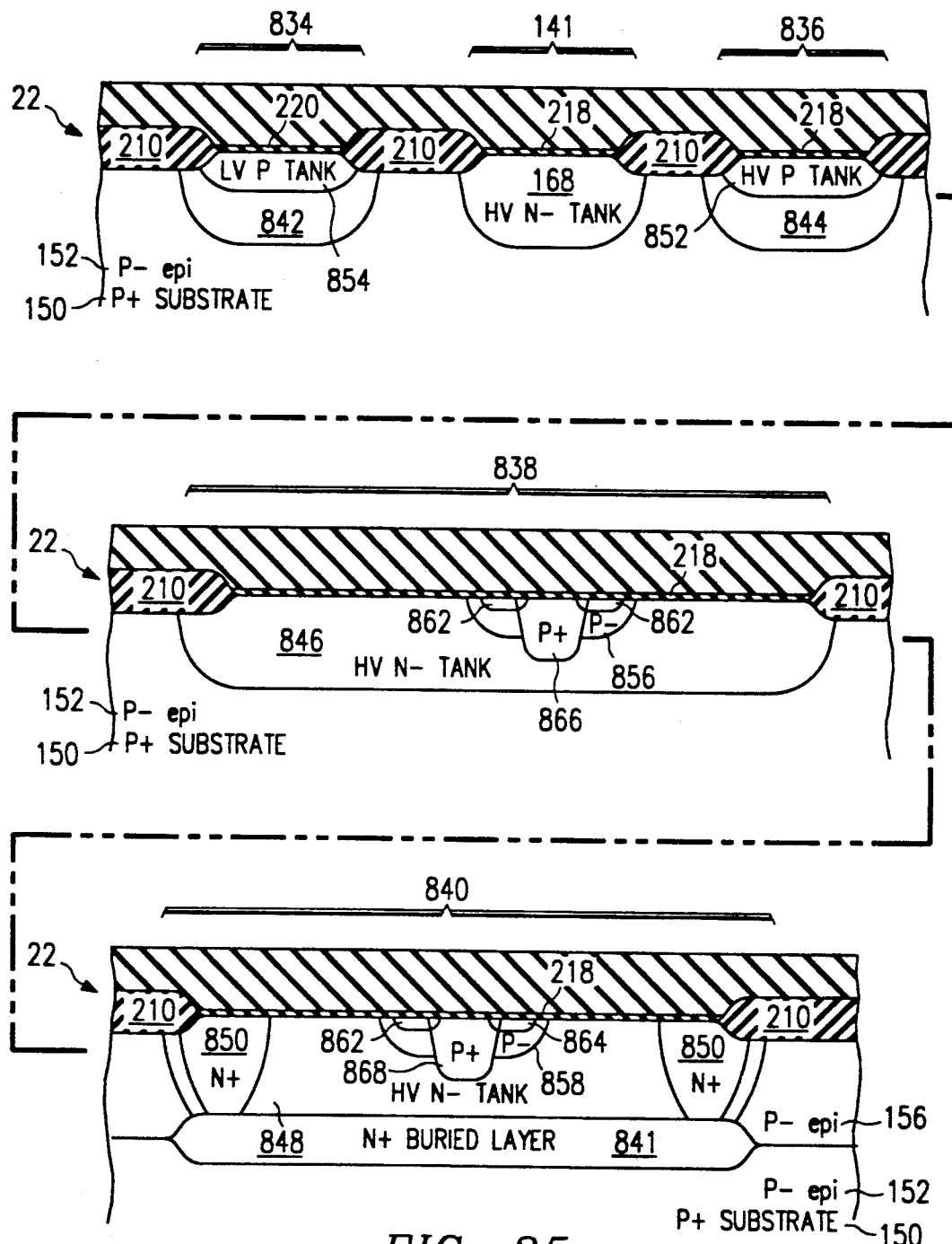

In FIG. 25d, a nitride/oxide mask 204 is formed on a previously existing oxide layer 178 and is patterned and etched to produce a moat oxide mask. This mask 204 is augmented with a layer of patterned photoresist 206 to form a mask for the implantation of (p+) channel stop regions 208, represented in this Figure only by pluses. The photoresist layer 206 is then stripped, and the chip is subjected to a long thermal step in order to grow isolating oxide regions 210 (FIG. 25e). After the growth of the isolating oxide regions 210, the mask 204 is removed. A high-voltage gate oxide 218 is next grown on the surfaces of the tanks 168, 852, 846 and 848. At this time, a high-voltage N $V_T$ implant is performed with boron into the high-voltage n-tank 168. A high-voltage $V_T$ adjust implant is performed next for future p-type channel regions into the high voltage p-tank 852. Next, a low-voltage $V_T$ adjust implant is performed into the low-voltage n and p-tanks, including the low-voltage p-tank 842 and p-tanks 856 and 858.

Figure 25F:
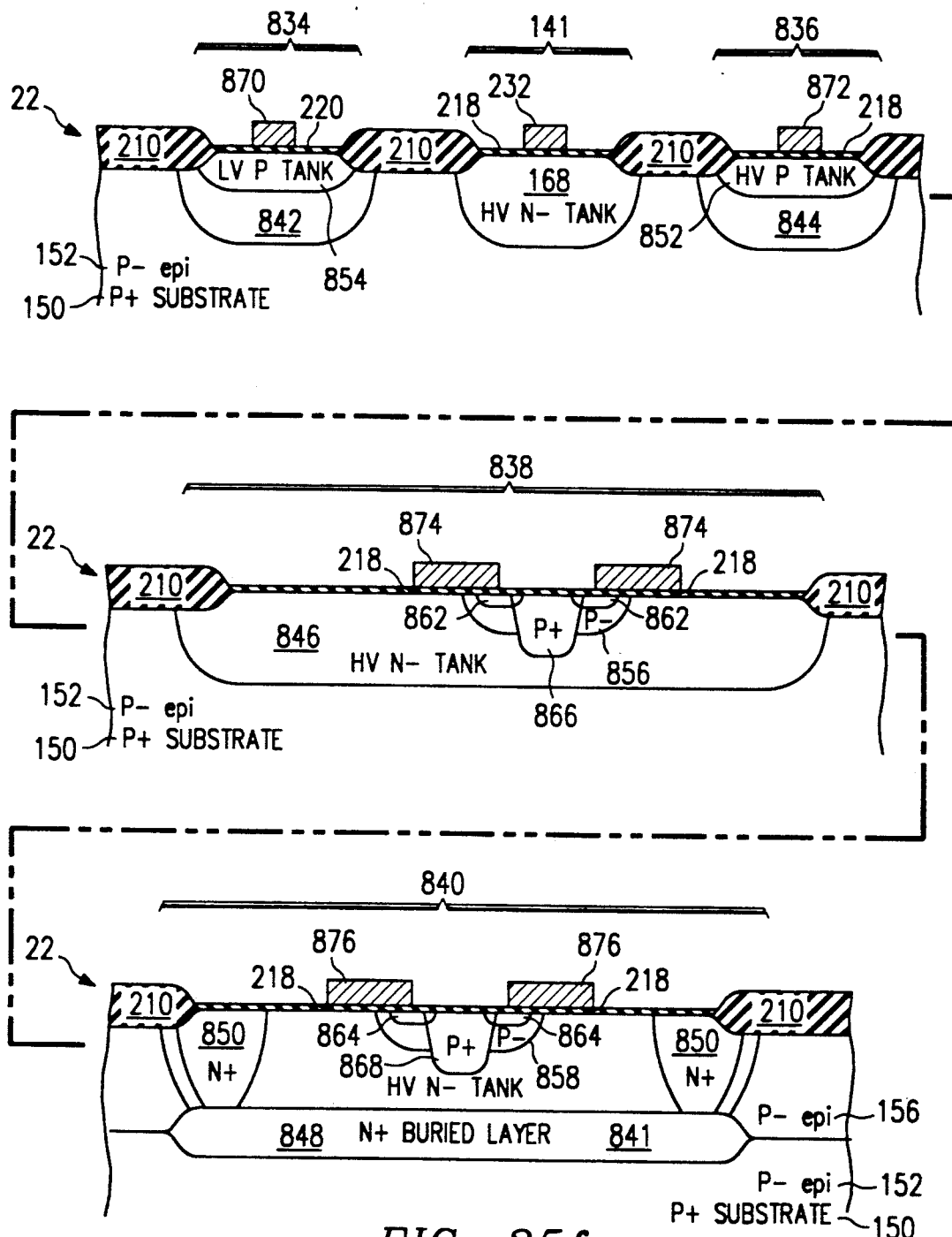

Further steps of the integrated process as applied to these devices are shown in FIG. 25f. The patterning and implanting of a tunnel diode is next performed for devices other than those shown, as well as the growth of a Fowler-Nordheim tunneling window (not shown). Then, a second layer of polycrystalline silicon (not shown; the first layer was deposited, patterned and etched in conjunction with a FAMOS EEPROM cell that is also not shown in this series) is deposited, doped, patterned and etched to form (n+) poly gates 870, 232, 872, an annular poly gate 874 for the LDMOS transistor 838, and an annular gate 876 for the VDMOS transistor 840.

Figure 25G:
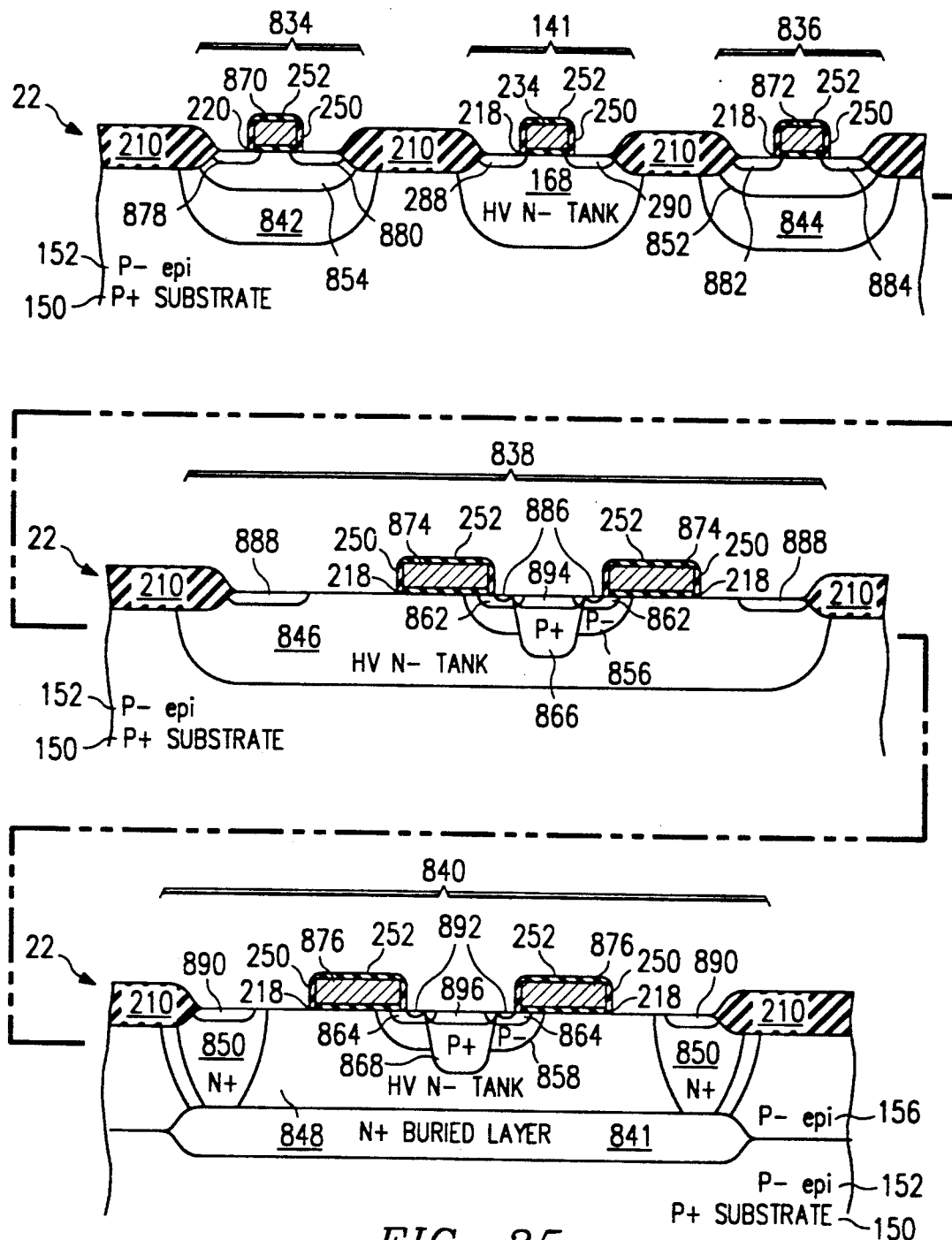

Further steps of the integrated process as applied to devices 834, 836, 838 and 840 are shown in FIG. 25g. Sidewall oxide structures 250 are added to the various poly gates 870, 232, 872, 874 and 876. This is followed by the formation of a cap oxide 252 on the exposed surfaces of the polysilicon gates 232 and 870–876.

A layer of photoresist (not shown) is used to define a plurality of n-type source/drain implants. While most of these are self-aligned to corresponding sidewall oxide or moat oxide structures, the (n+) source/drain implants for the LDMOS transistor 838 and the VDMOS transistor 840 are not. A first, low-density diffusion source/drain implant, the so-called LDD implant, is made with phosphorus into source/drain regions 878 and 880 for low-voltage n-channel field effect transistor 834, regions 288 and 290 for transistor 141, regions 882 and 884 for the high-voltage EEPROM-gating n-channel transistor 836, an annular source/drain region 886 for the LDMOS transistor 838, an annular source/drain region 888 near the periphery of the high-voltage n-tank 846 for the LDMOS transistor 838, a source/drain contact region 890 which is located at the face of the (n+) deep diffusion annular region 850, and an annular interior source/drain region 892 for the VDMOS transistor 840. This LDD implantation is immediately followed with an arsenic implantation using the same patterned photoresist layer (not shown).

Another layer of photoresist (not shown) is patterned for the (p+) source/drain implants. The implanting of a deep (p+) contact region 894 is performed for the LDMOS transistor 838 to be substantially coincident with the lateral facial margins of the deep (p+) region 866. The (p+) source/drain implant step also creates a central deep (p+) contact region 896 for the VDMOS transistor 840. End process steps, including deposition of mid level insulator, first level metal, a second mid level insulator, and second level metal, are performed according to processes well known in the art.

Where the epitaxial layer 152 is (p−), as it is for the preferred embodiment, the back gates of the n-channel transistors are common. The (n−) tanks 842 and 844 give extra pn junctions for isolation, allowing the use of negative voltages with respect to the epitaxial layer 152. Further, the enclosing tanks 842 and 844 give additional protection from transient voltages. This makes the isolated transistors 834 and 836 especially useful for automobile microcontrollers and other chips subject to 60-volt transient voltages.

The early implantation of the (n+) regions 862 and 864 provide an alignment-insensitive DMOS channel length in a process compatible with CMOS logic and EEPROM and EPROM cells. That is, the channel length created by the (p−) tanks 856 and 858 is made independent of the position of the annular gates 874 and 876.

Figure 26:
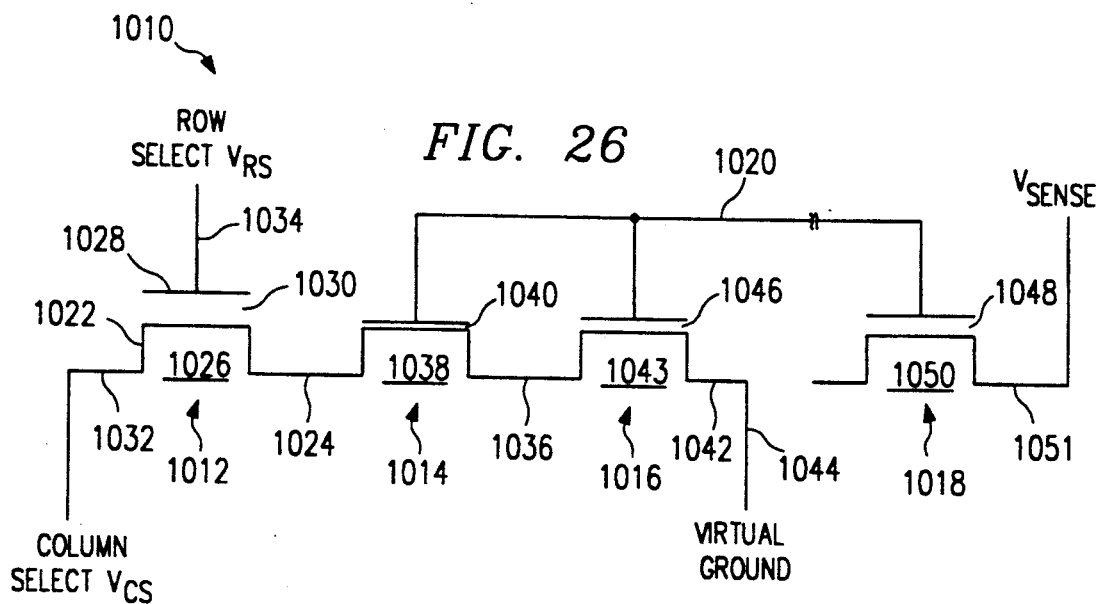
FIG. 26 is an electrical schematic diagram of a single-level poly electrically-erasable, electrically-programmable, read-only memory cell.

Referring next FIG. 26, an electrically-erasable electrically-programmable read only memory cell EEPROM 1010, is schematically depicted. Memory cell 1010 includes a select field effect transistor 1012, a programming field effect transistor 1014 and a sense field effect transistor 1016. A control capacitor 1018 is provided to capacitively couple a voltage to a floating gate 1020 such that floating gate 1020 may be charged or discharged by programming transistor 1014 through Fowler-Nordheim tunneling. Floating gate 1020 also provides the gate for sense transistor 1016 such that the charge on floating gate 1020 can be read, allowing memory cell 1010 to store information as logic "ones" and logic "zeroes".

Select transistor 1012 controls the operation of memory cell 1010 when memory cell 1010 is part of an array of similar cells. Transistor 1012 is a field effect transistor and includes a first heavily doped region 1022 and a second heavily doped region 1024 which are spaced by a channel area 1026. A conductive gate 1028 is provided for controlling the conductance of channel 1026 and, as a consequence, the current flow between first heavily doped region 1022 and second heavily doped region 1024. Gate 1028 is separated from channel area 1026 by a gate oxide layer 1030. First heavily doped region 1022 is coupled to a column line 1032 while gate 1028 is coupled to a row select line 1034.

Heavily doped region 1024 also provides a first heavily doped region for programming transistor 1014. Heavily doped region 1024 is spaced from a second heavily doped region 1036 of transistor 1014 by a channel 1038 to define the field effect transistor. Channel 1038 has a central region which receives a depletion implant to improve erasing and to provide a conduction path during reading. A layer 1040 of thin tunneling insulator overlies channel 1038 and respective portions of heavily doped region 1024 and heavily doped region 1036. In the preferred embodiment, thin tunneling insulator layer 1040 comprises a layer of thin oxide; however, thin tunneling insulator layer 1040 may also be formed of thin layers of nitride and oxide, or thin layers of oxide, nitride and oxide. Floating gate 1020 is disposed adjacent thin tunneling insulator layer 1040 such that Fowler-Nordheim tunneling can be achieved either from heavily doped region 1024 or heavily doped region 1036, or channel 1038.

Heavily doped region 1036 in turn provides a first heavily doped region for sense transistor 1016. Sense transistor 1016 is a field effect transistor which includes a second heavily doped region 1042 spaced from heavily doped region 1036 by a channel area 1043. A conventional gate oxide layer 1046 overlies channel 1043 spacing channel 1043 from floating gate 1020. Second heavily doped region 1042 is coupled to a virtual ground line 1044.

The floating gate 1020 voltage is controlled by control capacitor 1018, comprised of a heavily doped region 1050. Floating gate 1020 is separated from channel region 1050 by thin insulator 1048. In the preferred embodiment, thin insulator 1048 comprises a layer of thin oxide; however, other materials may be used such as a thin layer of oxide, nitride and oxide, or a trilayer sandwich of oxide, nitride and oxide. Heavily doped region 1050 receives a depletion implant to ensure a conducting operation in all bias conditions. Heavily doped region 1050 is connected to a sense line 1051 in a memory array.

Figure 27A:
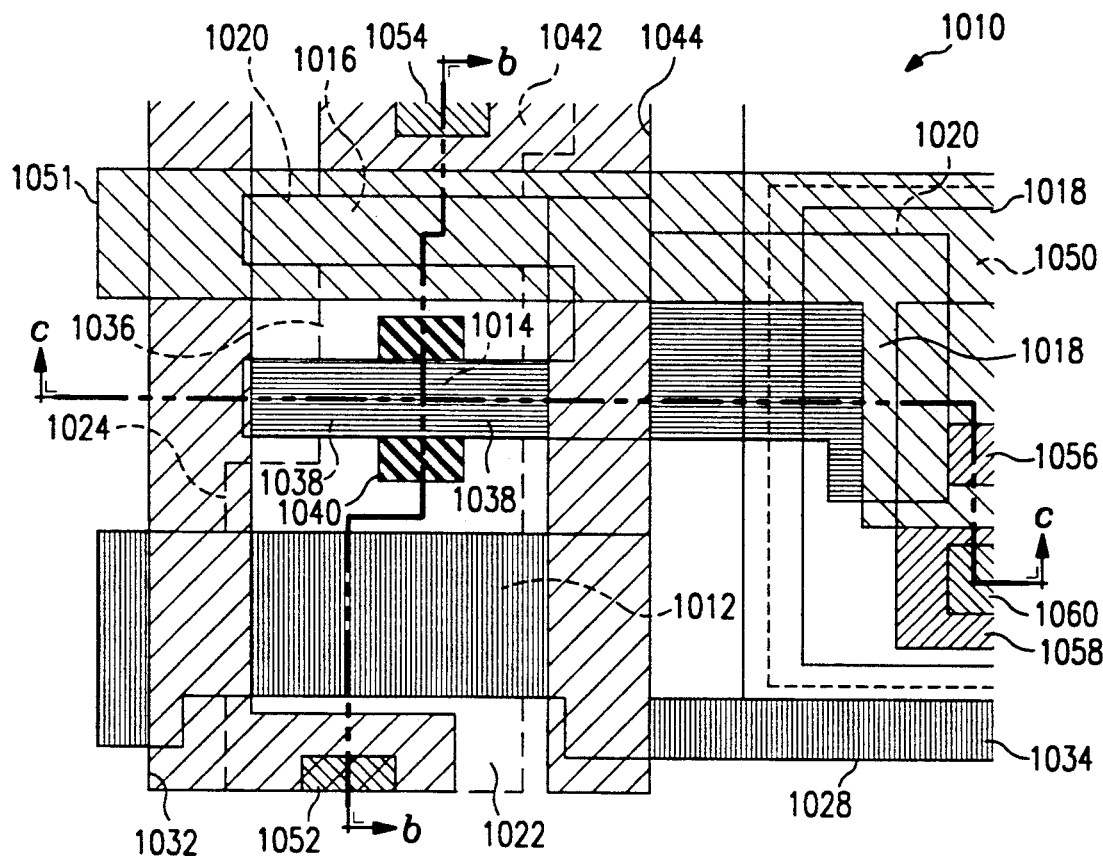
FIG. 27a is a highly magnified schematic plan view of a preferred embodiment of the memory cell of FIG. 26.

Referring next to FIGS. 27a-27c a plan view and corresponding elevational sectional views of the preferred embodiment are depicted. FIG. 27b corresponds substantially to the cross-section taken along line b—b of FIG. 27a while FIG. 27c corresponds substantially to the section taken along line c—c of FIG. 27a.

In the plan view shown in FIG. 27a, metal 2 conductor lines are shown with a diagonal shading that proceeds from the upper left to the lower right, metal 1 conductor lines are shown with widely spaced diagonal shading that proceeds from the lower left to the upper right, the second level poly layer is shown with either closely spaced vertical or horizontal shading, the boundaries of implanted regions are shown in hidden line, and the Fowler-Nordheim tunneling window 1040 is shown with a thick upper right to lower left diagonal shading.

In the preferred embodiment in FIG. 27a, transistors 1012, 1014 and 1016 are disposed substantially in parallel along line b—b while tank 18 and an overlying extension of poly gate 1020 are laterally offset from line b—b. Column select line 1032 is a first level metal line connected to heavily doped region 1022 by a contact 1052. Similarly, virtual ground line 1044 is a first level metal line coupled to heavily doped region 1042 by a contact 1054. Sense line 1051 is formed of a second-level metal, and is connected by a via 1056 to a first level metal area 1058 which is in turn connected by a contact 1060 to heavily doped region 1050. In the embodiment illustrated in FIG. 27a, the poly floating gate 1020 has three fingers or areas: a finger that extends over and forms a portion of the sense transistor 1016, a second finger which is extended over the Fowler-Nordheim tunneling region 1040, and a third finger or pad to capacitively couple the floating gate 1020 to the heavily doped region 1050. A poly row select conductor 1028 is routed to avoid the contacts 1052 and 1058 and forms the gate of the row select transistor 1012. The sense and program/array fingers of the floating gate 1020 in the embodiment shown in FIG. 27a are disposed in parallel to each other in a horizontal orientation, and generally in parallel with the row select line 1028.

FIG. 27b depicts the preferred embodiment in which memory cell indicated generally at 1010 is fabricated on a P-type semiconductor layer or substrate 1062. Heavily doped regions 1022, 1024, 1036 and 1042 comprise heavily doped N-type diffusions (n+) into semiconductor layer 1062. Heavily doped region 1022 is formed in a lightly doped N-type diffused region 1064 (n−). The lightly doped diffused region 1064 provides a graded junction between heavily doped region 1022 and adjacent channel 1026. Similarly, heavily doped region 1024 is formed in a lightly doped diffused region 1068 while heavily doped region 1036 is formed in a light doped diffused region 1070.

A phosphorus implant is preferably formed through a dummy oxide (not shown) that later is replaced by tunneling oxide window 1040 such that a lightly doped diffused region 1072 is formed in channel region 1038 of programming transistor indicated generally at 1014. Lightly doped diffused region 1072 improves the field plate breakdown voltage of the tunneling diode formed between channel 1038 and floating gate 1020 through thin oxide tunneling window 1040. Finally, heavily doped region 1042 is also formed in a lightly doped diffused region 1074 form a graded junction with channel area 1043. The heavily doped region 1036 and the lightly doped region 1070 can be implanted into the preferably epitaxial layer 1062 as self-aligned to the fingers of poly gate 1020. Heavily doped region 1024 and lightly doped region 1068 can be self-aligned to the respective lateral edges of the program/erase finger of the poly gate 1020, on the left margins thereof, and a lateral edge of the row select gate 1028/1034 on the right margins thereof. Implantations 1042 and 1074 may be self-aligned at least to the lateral margin of the adjacent sense finger of poly gate 1020; the column select dope regions 1022 and 1064 may be self-aligned to the right lateral margin of the row select gate 1028/1034.

A thermally grown oxide layer 1076 is formed across heavily doped regions 1022, 1024, 1036 and 1042 as well as floating gate 1020. Immediately adjacent thermally grown oxide 1076, is an additional layer of oxide 1078 formed by, for example, chemical vapor deposition. Contact windows 1080 and 1082 are etched through oxide layers 1070 and 1076 such that contacts 1054 and 1052 can be made to heavily doped regions 1042 and 1022, respectively. The first metal layer, which includes interconnecting lines 1032 and 1044 (see FIG. 27a) is overlaid with a layer of oxide 1084 to separate it from the second metal layer, which includes interconnection line 1051.

FIG. 27c, taken substantially along line c—c of FIG. 27a, illustrates the relationship between control capacitor 1018 and transistors 1014. A channel stop 1086 of P-type material is formed in the face of P-type semiconductor layer 1062 to provide electrical isolation in semiconductor layer 1062 between control capacitor 1018 and transistors 1012, 1014 and 1016. Heavily doped (n+) region 1050 resides in a lightly doped diffused region (n−) 1088. Since sense line 1051 is a second-level metal while control capacitor implanted channel 1049 is formed in the face of semiconductor layer 1062, a double layer interconnection is required. First, contact 1060 connects heavily doped region 1050 with first level metal pad 1058. Second, sense line 1051 is coupled to metal pad 1058 by via 1056 thus connecting sense line 1051 with control capacitor diffused channel 1049.

It is important to note that the width of tunneling region 1040 can be less than the width of channel 1038 of transistor 1014; however, tunneling region 1040 can also be formed across the entire channel 1038 of transistor 1014. Further, the use of second metal interconnection lines, such as sense line 1051, can be used to vertically cover the floating gate 1020 to shield floating gate 1020 when the face of cell 1010 is exposed to electromagnetic radiation which may cause floating gate 1020 to discharge. This may occur for example when memory cell 1010 is used on chip 22 (see FIGS. 3 and 6g) which also includes an electrically-programmable read-only memory (EPROM) (such as cell 149 shown in FIG. 6g) which may be erased by exposure to ultraviolet light. In this case, it may be desirable to erase the EPROM cell 149 while retaining information in the EEPROM cell 1010 of the present preferred embodiment.

Figure 28:
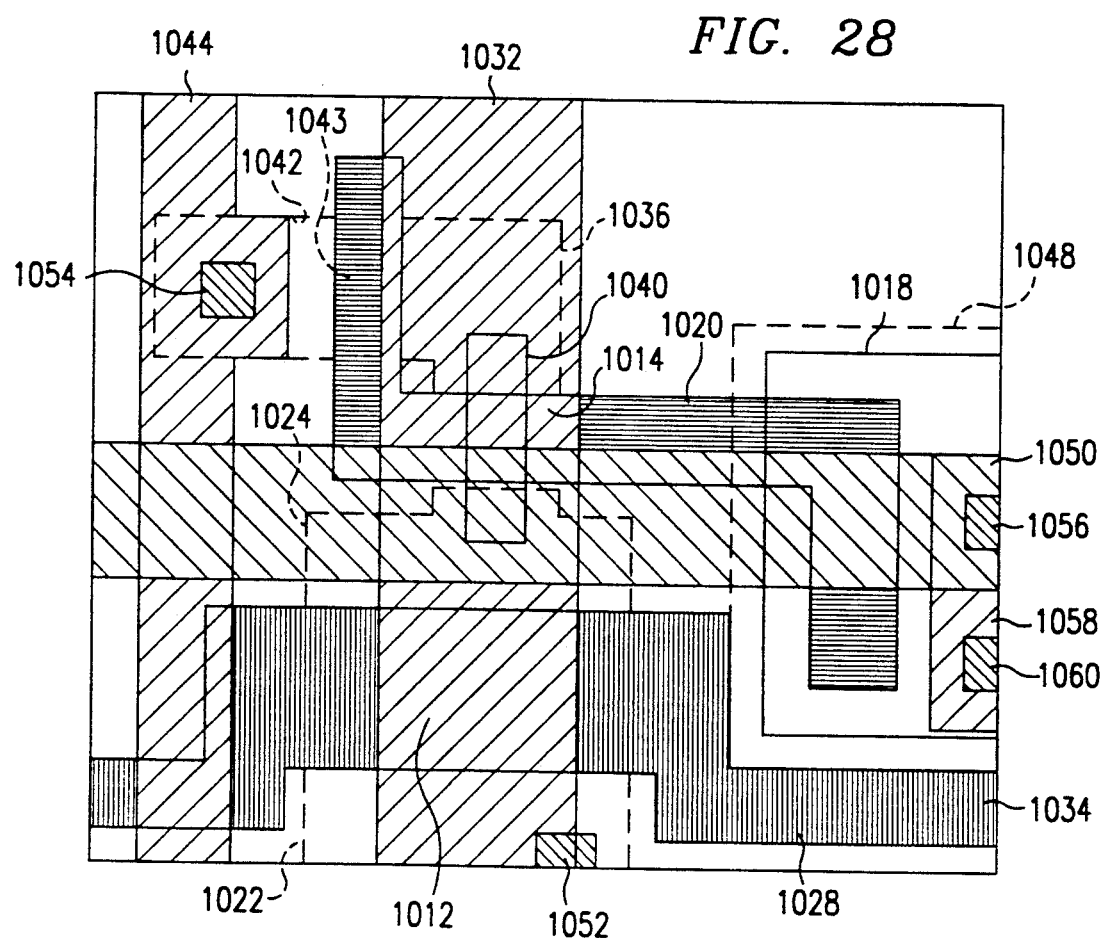
FIG. 28 is a plan view of an alternative embodiment of the memory cell of FIG. 26.

FIG. 28 is a plan view of an alternative embodiment of memory cell 1010. The various layers are represented similarly to the way corresponding layers are shown in FIG. 27a. In this embodiment, heavily doped region 1042, channel 1043 and contact 1054 have been laterally offset from the centerline of transistors 1014 and 1012, in contrast to the configuration of FIG. 27a. Channel 1043 has also been rotated to be substantially perpendicular to its positioning in FIG. 27a. The lateral offset of heavily doped region 1042 and contact 1054 results in additional spacing between first level metal interconnection lines 1032 and 1044.

Figure 29:
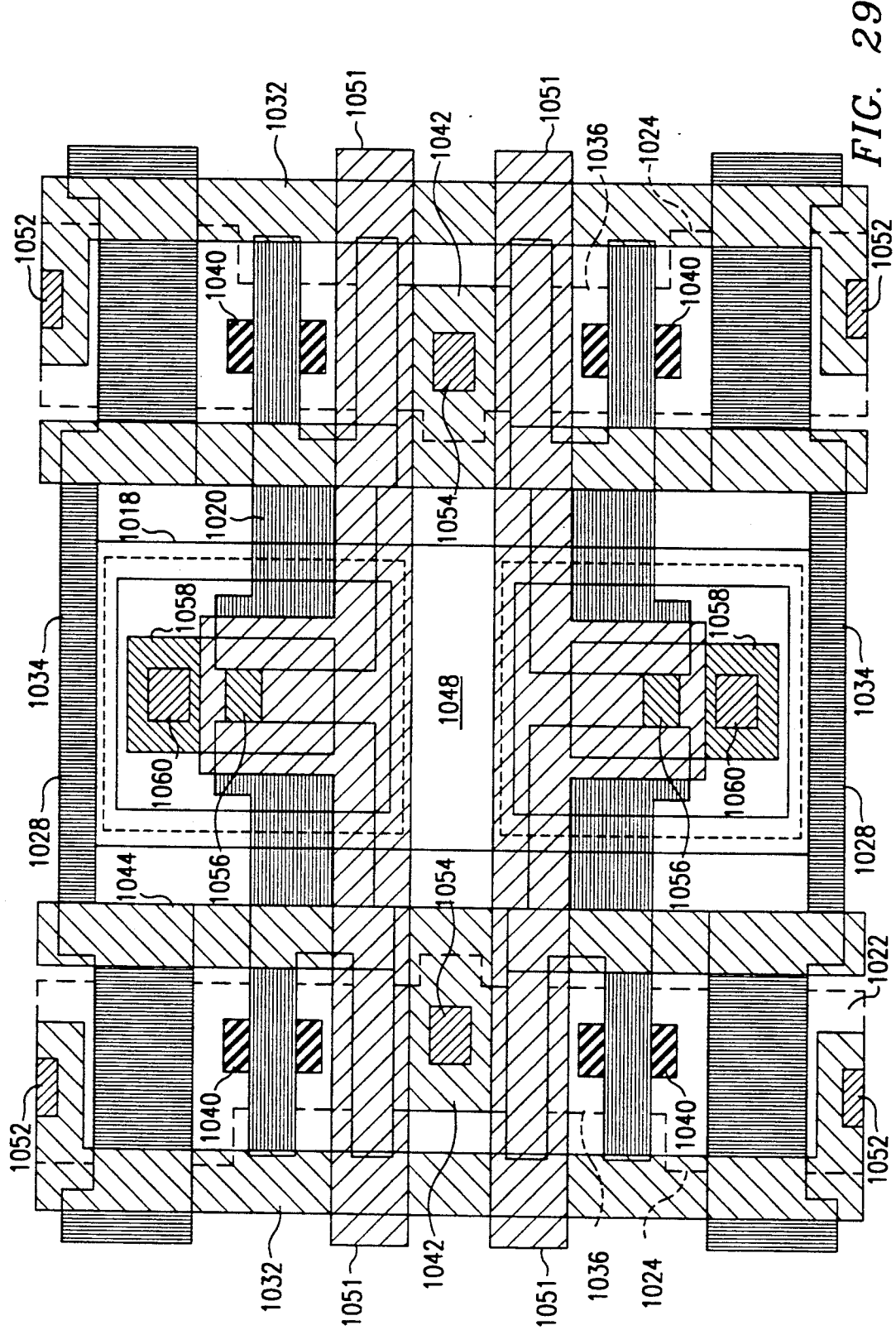
FIG. 29 is a plan view of a small section of an array of memory cells similar to the cell shown in FIGS. 27a–c.

Referring next to FIG. 29, a small portion of an array of memory cells 1010 according to the invention is depicted. While only four such cells are shown in FIG. 29, the overall number of cells in a memory array may be on the order of 256,000 cells. In the array configuration memory cells 1010 are disposed symmetrically in pairs of columns. In the array configuration, one control capacitor 1018 and its associated contacts 1056 and 1060 are provided for each pair of horizontally adjacent cells of forming respective portions of a pair of columns. Along each column, one heavily doped region 1022 and one heavily doped region 1042 and their associated contacts 1054 and 1052 are provided for each pair of vertically adjacent cells. Vertically adjacent cells are disposed symmetrically along the length of each column.

The operation of the memory cell depicted in FIG. 26 can now be described. To program memory cell 1010 with a logic "0", floating gate 1020 is negatively charged by tunneling electrons to floating gate 1020 through thin tunneling oxide window 1040 from heavily doped region 1024. The electrons residing on floating gate 1020 lower the potential of floating gate 1020 such that when a reference voltage $V_{ref}$ is applied to control capacitor diffused channel 1040, floating gate 1020 will no longer exceed the threshold voltage of transistor 1016 and therefore no current will flow in channel 1043 during the read cycle, discussed further below. To program a logic "1" into memory cell 1010, floating gate 1020 is left in an uncharged state, such that when voltage $V_{ref}$ is capacitively coupled to floating gate 1020 by control tank 1018, floating gate 1020 will exceed the threshold of transistor 1016 and current will flow in channel 1043 during the read operation.

It is important to note that logic "0" and logic "1" are arbitrarily defined and could be reversed depending on the logic circuitry outside the memory cell. Additionally, in alternate embodiments, the "read" operation may use a dummy cell and a differential current amplifier which permits correct cell reading even if some current in the "0" condition (so long as the current is less than that in the dummy cell).

To charge floating gate 1020 with electrons, and thus program a logic "0" into memory cell 1010, a voltage $V_{pp}$, which is in the range of 5 to 18 volts, is applied to row select line 1034. A voltage $V_{ss}$, which is approximately 0 volts or ground, is applied to column select line 1032. Voltage $V_{pp}$ is also applied to control capacitor diffused channel 1049/1050, while virtual ground line 1044 is allowed to float. A portion of the voltage applied to control capacitor diffused channel 1049/1050 is capacitively coupled to floating gate 1020 creating a voltage difference between (n−) diffusion 1072 (region 1038) and floating gate 1020 across thin oxide tunneling window 1040. This voltage difference causes electrons to tunnel onto floating gate 1020 through tunneling window 1040 via Fowler-Nordheim tunneling, thereby negatively charging it.

To read memory cell 1010, a voltage $V_{dd}$, which is approximately 5 volts, is applied to row select line 1034. Column select line 1032 is coupled to a sense amplifier (not shown) for measuring any current flow through transistors 1012, 1014, and 1016. A voltage $V_{ref}$, which is approximately 2-2.5 volts, is applied to control capacitor diffused channel 1049/1050 through sense line 1051. Virtual ground line 1044 is then coupled to a voltage $V_{ss}$, which is approximately 0 volts or ground. If floating gate 1020 is charged with electrons, the capacitive coupling of a portion of voltage $V_{ref}$ to floating gate 1020 from control capacitor diffused region 1049/1050 will not raise the potential of floating gate 1020 above the threshold of sensing transistor 1016. With transistor 1016 turned off, no current will flow from heavily doped region 1042 through channels 1043, 1038 and 1012 to the sense amplifier coupled to column select line 1032. Zero current flow by convention indicates a logic "0". If, however, floating gate 1020 has not been charged with electrons during the write operation, the application of voltage of $V_{ref}$ to control capacitor diffused channel 1049/1050 will raise the potential of floating gate 1020 above the threshold of transistor 1016, thereby allowing current to flow through transistors 1016, 1014 and 1012, which by convention indicates a logic "1".

To erase memory cell 1010 by removing electrons residing on floating gate 1020, a voltage $V_{pp}$, which is approximately 5 to 18 volts, is applied to row select line 1034. A voltage $V_{pp}$ is also applied to column select line 1032. Virtual ground line 1044 is allowed to float while a voltage $V_{ss}$, which is approximately 0 volts or ground, is applied to control capacitor diffused region 1049/1050. The voltage difference between floating gate 1020 and (n−) diffusion 1072 (region 1038) across thin oxide tunneling window 1040 causes electrons to tunnel from floating gate 1020 to (n−) diffusion 1072 (region 1038) via Fowler-Nordheim tunneling, thereby erasing memory cell 1010.

Although the present invention and its advantages have been described in detail, it should be understood that various changes, substitutions and alterations can be made herein without departing from the spirit and scope of the invention as defined by the appended claims.

In summary, insulated-gate field-effect transistors have been disclosed which avoid gate oxide stress. A first solution to this problem is to leave a portion of the polysilicon gate undoped, so that the undoped portion is only capacitively coupled to the dope portion, and so that the electrical field incident on the undoped portion changes as the gate-drain potentials change. A second solution to this problem disposes the drain end of the conductive gate on a LOCOS field oxide region, which also mitigates the high electric field that otherwise would appear across the gate oxide at the drain end of the conductive gate.

What is claimed is:

1. A process for fabricating an insulated-gate field-effect transistor having reduced gate insulator stress, comprising the steps of:
   forming a first tank region in which the semiconductor portions of the insulated-gate field-effect transistor are to be contained;
   forming a second tank region of a second conductivity type opposite the conductivity type of the first tank region, and to be contained within the first tank region; and
   forming a control gate to be insulatively adjacent a semiconductor channel region of the transistor so as to control the conductance thereof after the process is completed, said control gate formed such that a lateral margin of the second tank region is beneath the first portion of the control gate;
   selectively modifying a first portion of the control gate to be substantially conductive;
   during said step of selectively modifying, masking a second portion of the control gate such that it will remain substantially nonconductive;
   forming a semiconductor source region adjacent the first portion of the control gate; and
   forming a semiconductor drain region substantially adjacent the second portion of the control gate.

2. The process of claim 1, wherein said step of selectively modifying comprises doping the first portion with a dopant.

* * * * *